US008711974B2

(12) United States Patent
Kumar

(10) Patent No.: US 8,711,974 B2
(45) Date of Patent: Apr. 29, 2014

(54) SYSTEMS AND METHODS FOR MITIGATING SPECTRAL REGROWTH FROM NON-LINEAR SYSTEMS

(75) Inventor: Rajendra Kumar, Cerritos, CA (US)

(73) Assignee: The Aerospace Corporation, El Segundo, CA (US)

( * ) Notice: Subject to any disclaimer, the term of this patent is extended or adjusted under 35 U.S.C. 154(b) by 549 days.

(21) Appl. No.: 13/102,903

(22) Filed: May 6, 2011

(65) Prior Publication Data

US 2012/0280749 A1 Nov. 8, 2012

(51) Int. Cl.
*H04K 1/02* (2006.01)

(52) U.S. Cl.
USPC ............................ 375/296; 375/297; 375/232

(58) Field of Classification Search
CPC ... H03F 1/3241; H03F 1/3247; H04L 27/236; H04L 25/03343; H04L 25/03006
USPC .............. 375/296, 232, 349; 330/10; 342/373
See application file for complete search history.

(56) References Cited

U.S. PATENT DOCUMENTS

| | | | |
|---|---|---|---|
| 5,689,272 A * | 11/1997 | Harrison et al. | 342/373 |
| 5,886,573 A * | 3/1999 | Kolanek | 330/10 |
| 6,304,140 B1 | 10/2001 | Thron et al. | |
| 6,489,846 B2 | 12/2002 | Hatsugai | |
| 6,642,786 B1 | 11/2003 | Jin et al. | |
| 7,113,036 B2 | 9/2006 | Moffatt et al. | |
| 7,529,524 B1 | 5/2009 | Giallorenzi et al. | |
| 7,627,055 B2 * | 12/2009 | Coersmeier | 375/296 |
| 8,059,748 B2 | 11/2011 | See et al. | |
| 8,331,511 B2 * | 12/2012 | Beidas et al. | 375/349 |

FOREIGN PATENT DOCUMENTS

GB     2394374 A    4/2004

OTHER PUBLICATIONS

International Search Report and Written Opinion of the International Searching Authority mailed in Application No. PCT/US2011/022600 on Jun. 8, 2011.
A. Katz, "Linearization: Reducing Distortion in Power Amplifiers," IEEE Microwave Magazine, pp. 37-49, Dec. 2001.
R. Kumar, "Analysis of the Impact of Clock Jitter Noise on the Performance of Analog-to-Digital Converters," Proc. AIAA International Communication Satellite Systems Conference, pp. 1-10, May 2008, San Diego, California.
A. M. Saleh, "Frequency-Independent and Frequency Dependent Nonlinear Models of TWT Amplifiers," IEEE Transactions on Communications, vol. COM-29, No. 11, Nov. 1981, pp. 1715-1720.
R. Kumar, U.S. Appl. No. 12/798,026, filed Mar. 26, 2010 and entitled, "Adaptive Compensation Systems for Mitigating Distortion Due to Nonlinear Power Amplifiers."

* cited by examiner

*Primary Examiner* — Daniel Washburn
*Assistant Examiner* — Fitwi Hailegiorgis
(74) *Attorney, Agent, or Firm* — K & L Gates LLP

(57) ABSTRACT

Various embodiments are directed to a non-linear amplifier system comprising a reference output generator, an adaptive filter, a amplitude distortion (AM-AM) compensator, a phase distortion (AM-PM) compensator, an adaptive spectrum controller and a non-linear system. The reference output generator may receive an input signal and generating a reference output. The adaptive filter may generate a modified input signal based on the input signal and the reference output. The AM-AM compensator may act on the modified input signal to compensate for AM-AM distortion. The phase distortion (AM-PM) compensator may act on the modified input signal to compensate for AM-PM distortion. The adaptive spectrum controller may provide parameters to the adaptive filter to minimize the power spectral density (PSD) of an output of the non-linear amplifier system in a stop-band and maximize the PSD of the output of the non-linear amplifier system in a pass-band.

23 Claims, 28 Drawing Sheets

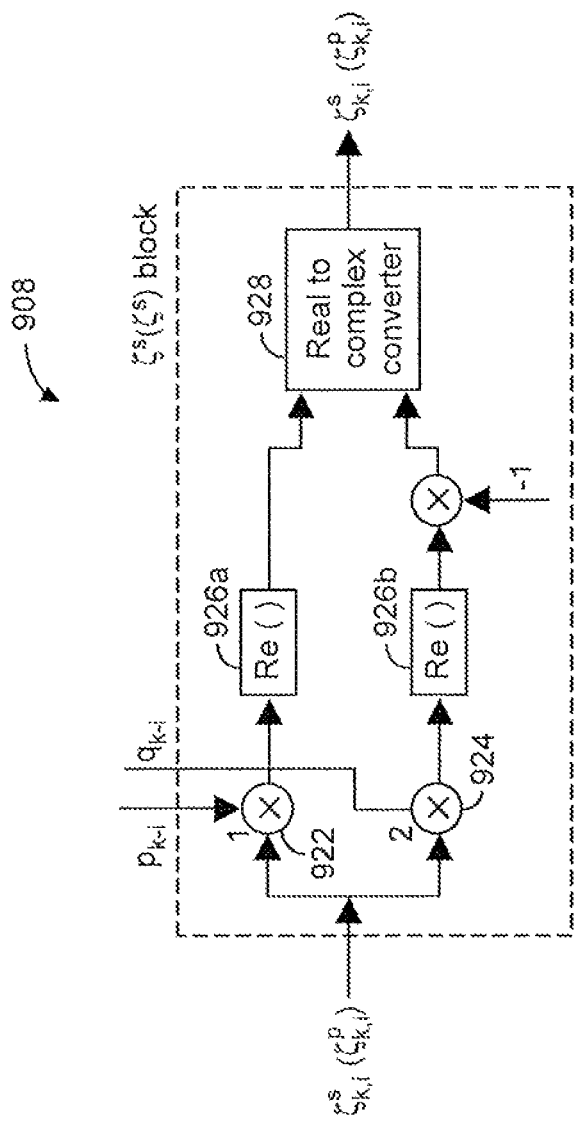

SYSTEMS AND METHODS FOR MITIGATING SPECTRAL REGROWTH FROM NON-LINEAR SYSTEMS

STATEMENT OF GOVERNMENT INTEREST

This invention was made with government support under contract number FA8802-09-C-0001 awarded by the Department of the Air Force. The government has certain rights in the invention.

BACKGROUND

In many applications, including communications systems, satellite-based navigation systems, and other applications, there is a need for high-power amplifiers (HPA's) that operate in a highly efficient manner. The more efficient the operation of an HPA, the less energy is required to generate a desired output power. Further, higher efficiency HPA's may have size and weight advantages over lower efficiency HPA's capable of providing equivalent output power. In applications such as satellite communications, the size and weight advantages of higher efficiency HPA's may translate directly to cost reductions, for example, due to decreased payload expenses.

HPA's are at their most efficient when operated at or near the saturation region. Operating an HPA at or near its saturation region, however, accentuates non-linearities of the HPA, leading to distortion of the signal, which is then amplified by the HPA. In addition to the distortion introduced into the signal, and related to it, non-linearities of HPA's operated at or near the saturation region cause the power spectral density (PSD) of the output signal to spread outside of its designated frequency band. This phenomenon is known as spectral regrowth. For the case of multiple input signals, the spectral regrowth is caused both due to the nonlinear effects on individual signals and also due to the in band inter modulation (IM) products caused by the interaction among the various signals due to the amplifier nonlinearity. Spectral regrowth occurs even when the input signal is strictly band-limited, for example when the signal is filtered with a square root raised cosine (srrc) filter. Because spectral regrowth can lead to interference, there is a regulatory restriction on the maximum permissible out-of-band PSD relative to the in-band signal PSD.

When the HPA input is comprised of a number of band limited digitally modulated signals, as is the case for example with frequency-division multiplexed (FDM) signals, the spectral regrowth caused by the amplifier nonlinearity results in inter channel interference (ICI) among the various signals. The ICI is especially important when the amplifier input is comprised of a relatively strong signal with relatively high PSD's along with relatively weak signals with relatively low PSD's. In this case even a relatively small spectral regrowth of the strong signal can cause serious ICI to the adjacent weak signals. Limiting the ICI to acceptable limits may require an increased band gap among the adjacent signals thereby reducing the bandwidth efficiency of the system.

Another known technique for dealing with both signal distortion and spectral regrowth due to amplitude non-linearities is to back-off the HPA (i.e., reduce the input signal amplitude such that the HPA is operating farther from saturation). For example, if regulatory requirements regarding spectral regrowth are not met, the back-off of the HPA is typically increased to the level where the spectral regrowth falls within the regulatory requirements. Such an increase in the back-off results in a significant reduction in the output RF power, as well as a reduction in the DC-to-RF power conversion efficiency. Such an increase in the output back off may be required even when the in band distortion is within the acceptable limits, as may be case when error correction coding is used on the digital signal.

Various techniques are known for mitigating non-linear distortion without increasing amplifier back-off. No known techniques, however, effectively addresses spectral regrowth. The known techniques for mitigating amplifier non-linearity generally fall under one of several categories including feed-forward linearizers, feedback linearizers, and pre-distortion linearizers.

A feed-forward linearizer has two loops. The first loop subtracts samples of the input signal from the samples of the amplifier output signal to produce samples of the main amplifier's distortion. The second loop subtracts the amplified sampled distortion from the delayed version of the main amplifier output to obtain the final linearized output. Example feed-forward linearizers are shown, for example, at S. C. Cripps, "Advanced Techniques in RF Power Amplifier Design.," Artech House, 2002; and J. Vuolevi, "Distortion in RF Power Amplifiers," Artech House, 2003. The multi-loop feed-forward arrangement, however, is complex to implement, requires a second amplifier that needs to be linear to avoid generating its own distortion terms and results in power loss due to signal combining at the amplifier output.

In feedback linearizers, the amplifier's input and output are detected and low pass filtered. The resulting baseband signals are compared. The error signal is used to control the gain of the amplifier so as to minimize the distortion. This technique suffers from the bandwidth limitation on the amplifier input signal, as the feedback system can respond to frequencies that are much smaller than the inverse of the delay introduced by the amplifier and associated feedback circuitry and thus the technique is limited to relatively narrowband signals.

In pre-distortion linearization techniques, the amplifier input is pre-distorted such that the overall distortion due to the linearizer and amplifier is minimized. The linearizer gain and phase is obtained iteratively for different input power levels. In one known technique, a DSP version of the Cartesian pre-distortion scheme is presented wherein a look-up table that stores the in-phase and quadrature components of the linearizer as a function of the input signal envelope is used for pre-distortion for a set of input signal envelope values. The signal to be amplified is digitized and the sampled values of the signal are modified by interpolated value of the stored in-phase and quadrature components of the linearizer. The correction is limited by the interpolation errors. In another known technique, the stored values are updated according to the amplifier output signal which is also limited due to the interpolation errors. Based on the feedback architecture, a power amplifier linearizer for time division duplex system may be used, wherein a receiving subsystem is shared between the receiver and the power amplifier feedback subsystem resulting in some reduction of complexity for the time division duplex system.

Polar pre-distortion-based architectures are also known, wherein the gain and phase are individually compensated. In most situations, the phase distortion is more important and may be completely eliminated by some architectures. The linearizer gain function is represented by a polynomial of odd degree whose coefficients are obtained by an explicit minimization of the mean squared error between the actual amplifier output gain response and the ideal response which is selected to be linear. The minimization is performed using a gradient algorithm with a power 4 optimization index. The amplitude-to-phase transfer characteristics of the amplifier are directly modeled by a polynomial of the input signal envelope which is then used to compensate for the phase distortion.

In the pre-distortion linearization techniques, the linearized amplifier output is saturated whenever the input signal envelope exceeds the linear range. For band limited input signals this occurs frequently, if the output power back off is kept at a relatively small value, resulting in the out of band spectral growth. The extent of the out of band spectral growth is also a function of the statistical properties of the input signal, for example, it depends upon whether the input signal is a quadrature phase shift-keying (QPSK), an offset quadrature phase shift-keying (OQPSK) signal or a sum of multiple band limited signals. Thus it is desirable to explicitly control the out-of-band spectral growth in addition to the minimization of the in-band distortion.

FIGURES

Various embodiments of the present invention are described here by way of example in conjunction with the following figures, wherein:

FIG. 10 shows a block diagram of one embodiment of a $\zeta$ block i, which may be either one of the $\zeta^s$ blocks or one of the $\zeta^p$ blocks shown in FIG. 9.

Figure 18:
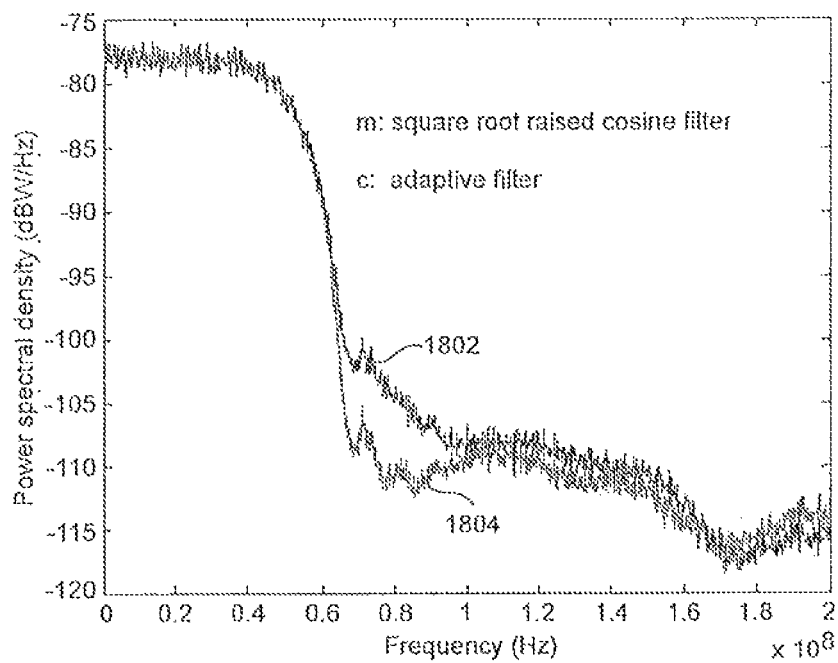
FIG. 18 shows plots of the power spectral density (PSD) for the cases of both the srrc filter and the adaptive filter, with an example output back-off of 3.2 dB.
Figure 19:
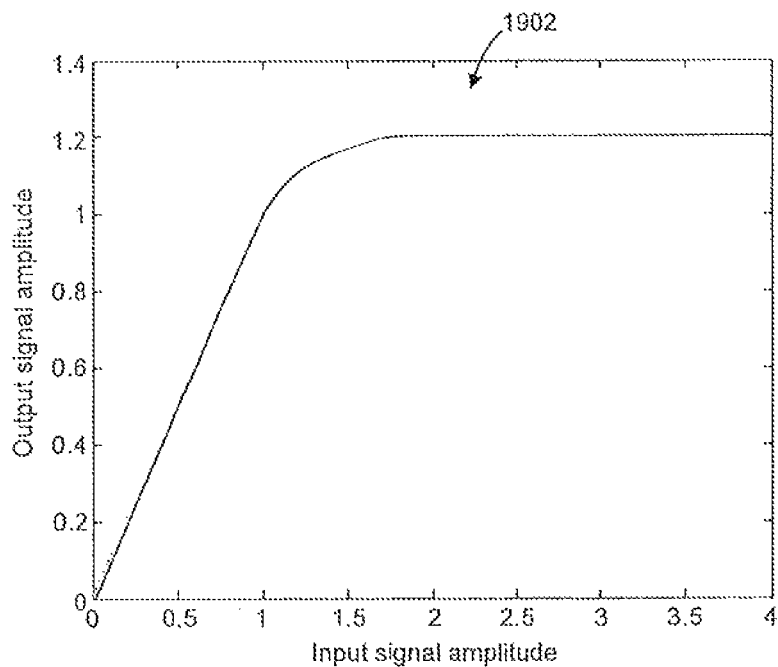
FIG. 19 shows one embodiment of the amplifier characteristics utilizing the spectrum control system with a commercial linearized amplifier.
Figure 21:
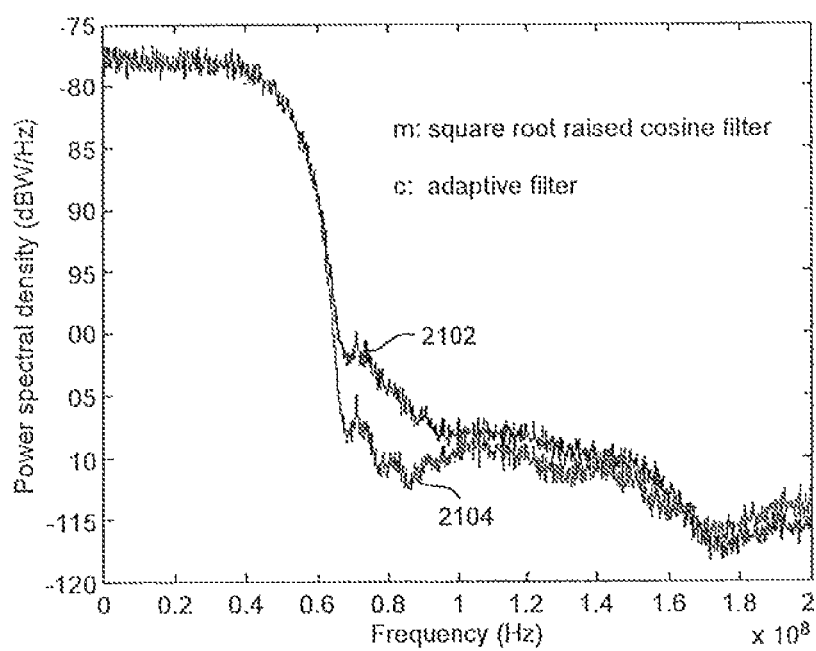

FIG. 21 plots one embodiment of amplifier output signal PSDs both for the srrc case and the adaptive filter case, with all the amplifier input/output transfer characteristics shown in FIG. 19 and with an output power back off equal to 2.7 dB and with all the parameters of the algorithm same as those used in the results of FIG. 18.

Figure 22:
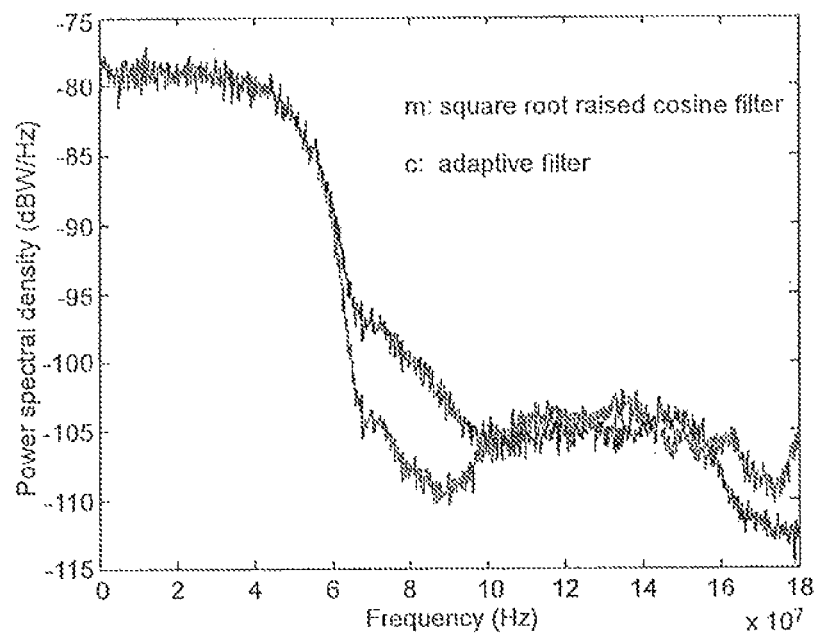

FIG. 22 shows a result for one embodiment when the amplifier is modeled by a piecewise linear characteristics with a slope equal to 1 for the input amplitude A in the range of 0 to $A_1=0.9$, a slope of $0.1/(A_{is}-0.9)$ for $A_1<A \le A_{is}$, and slope equal to 0 for $A > A_{is}$, where $A_{is}$ is the input saturation amplitude.

Figure 16:
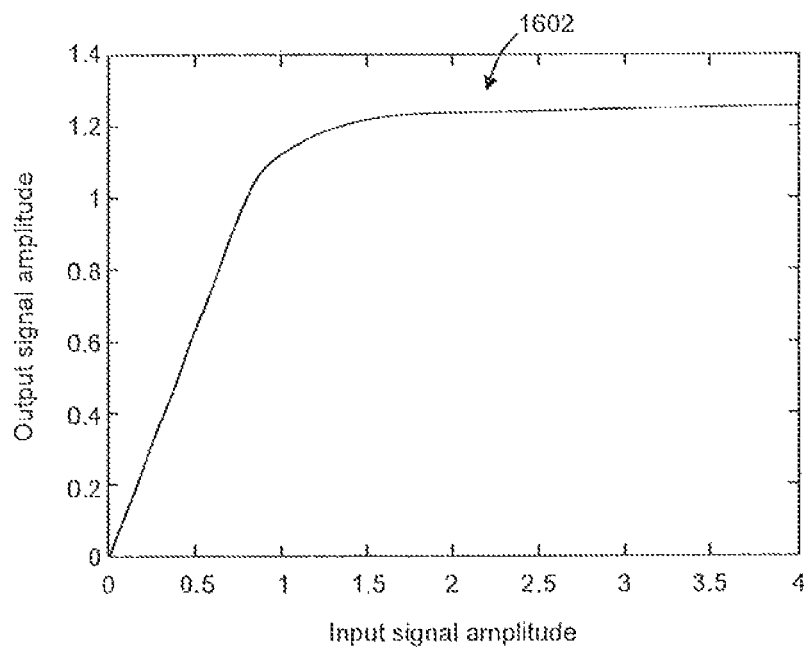
FIG. 16 shows the baseband amplitude transfer characteristics g(A) of the amplifier modeled by one embodiment of the soft limiter characteristics.
Figure 23:
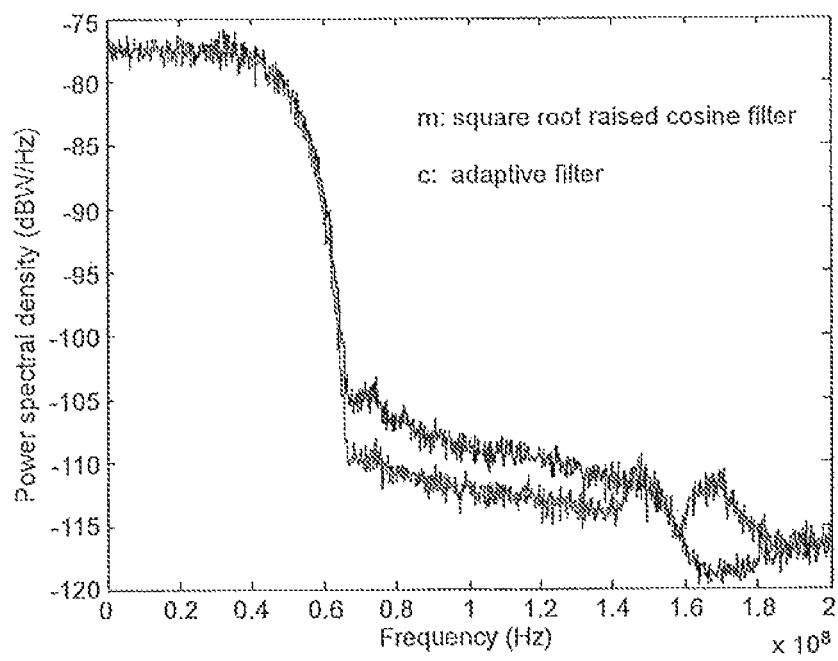

FIG. 23 plots results of one embodiment with a QPSK signal with the soft limiter characteristics of FIG. 16 and an output back off of 2.7 dB.

Figure 24:
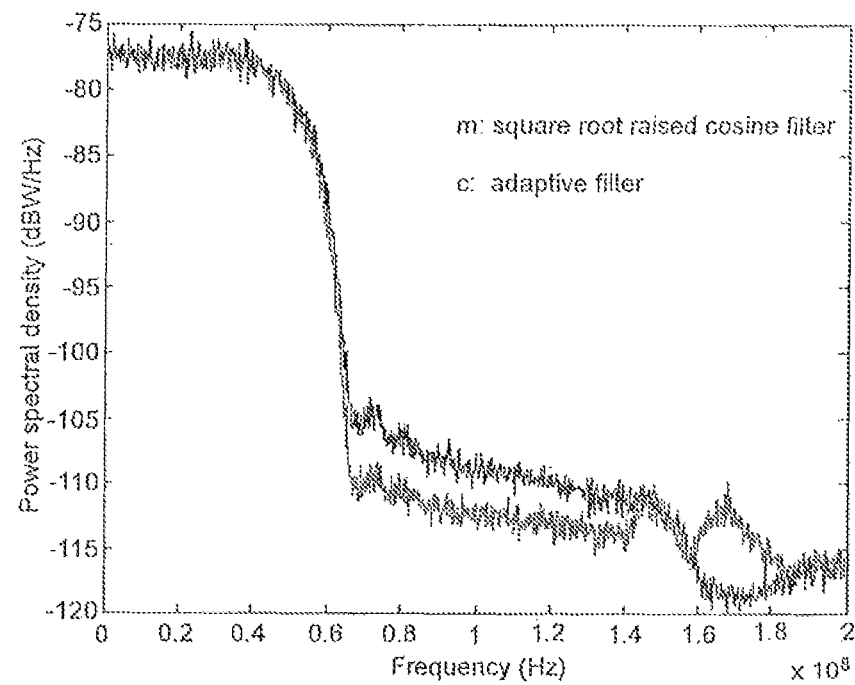

FIG. 24 shows results of one embodiment similar to that of FIG. 23 but with the amplifier characteristics given in FIG. 19 with $A_s=1.2$ and DL=14 dB.

Figure 25:
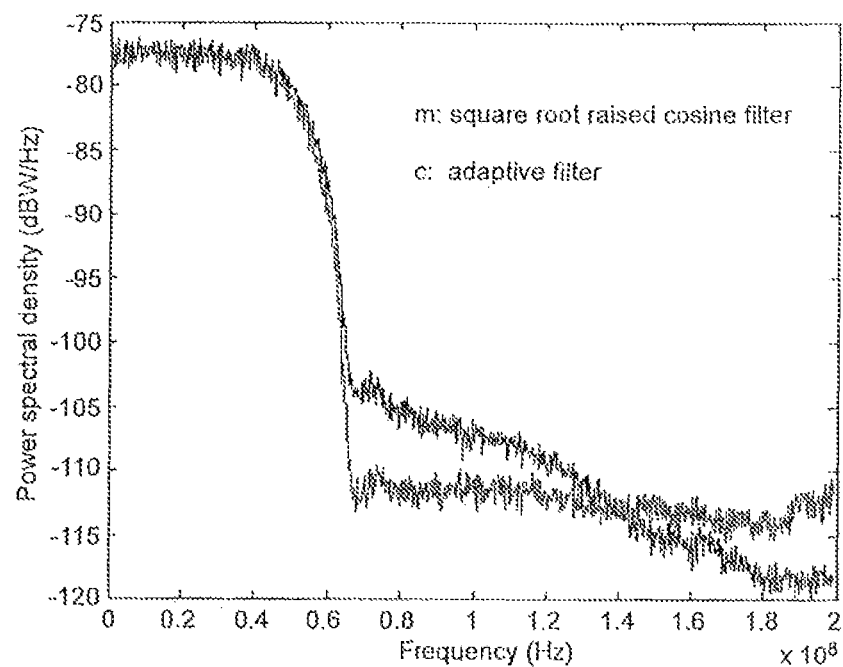

FIG. 25 shows results of one embodiment for the case of OQPSK signal at the input to the amplifier with soft limiter characteristics.

Figure 26:
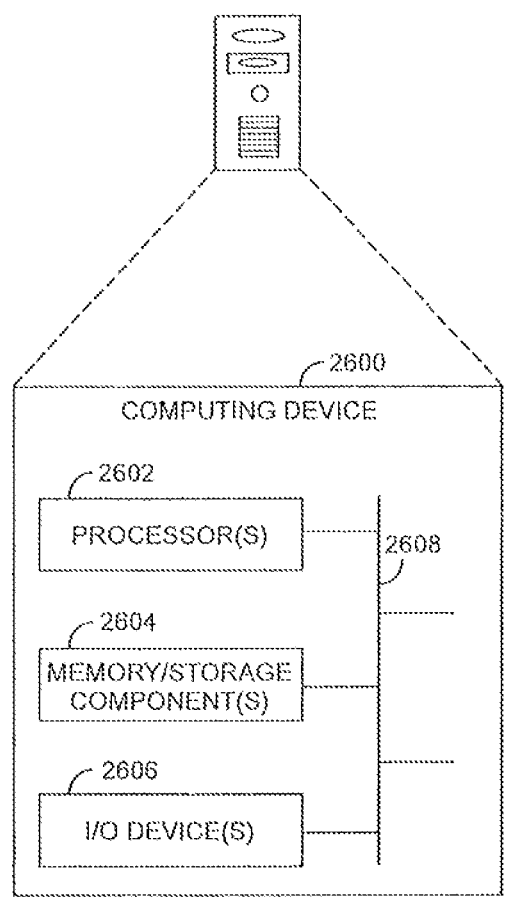

FIG. 26 shows one embodiment of an example computing device.

DESCRIPTION

Various embodiments described herein are directed to methods and systems for the adaptive spectral control of the nonlinear system output (e.g., from an amplifier, such as an HPA). For example, various embodiments may utilize an architecture comprising an input adaptive filter/compensator; a reference output generator; an adaptive spectrum controller; the nonlinear system (e.g., an amplifier operated at or near saturation); and an output sensor/transducer. The adaptive input filter/compensator and the adaptive spectrum controller may be designed so that the amplifier output is equal to some, potentially transformed, version of the reference generator output while minimizing the power spectral density (PSD) of the nonlinear system output at a set of selected frequencies and simultaneously maximizing the power spectral density at a different set of selected frequencies to achieve a desired PSD function at the nonlinear system output.

According to various embodiments, the nonlinear system may be a radio frequency (RF) power amplifier and may also comprise a baseband-to-RF up-conversion chain. The reference output generator may be a square root raised cosine (srrc) filter. The input signal may be a digitally modulated signal at complex baseband. The input signal may be modulated according to any suitable method including, for example, binary phase shift-keying/pulse amplitude modulation (BPSK/PAM), quadrature phase shift-keying/quadrature amplitude modulation (QPSK/QAM), etc. The input adaptive filter/compensator may comprise a linear adaptive filter, an amplitude distortion (AM-AM) compensator, and a phase distortion (AM-PM) compensator. The output sensor/transducer may comprise an RF coupler, a down converter to baseband and an analog-to-digital converter (ADC). The AM-AM compensator may be of any suitable form and may be a cubic nonlinearity. In some embodiments, however, (e.g., those requiring a more precise output) AM-AM compensator may be a cascade of a cubic nonlinearity and a compensator which may provide a piecewise linear characteristics of the compensated amplifier.

The adaptive spectral control algorithm may adjust weights of the adaptive filter so as to minimize the power spectral density of the amplifier output in the transition/stop band while maximizing the PSD in the pass band, and simultaneously minimizing the error between the srrc filter output and the down converted and scaled version of the RF power amplifier output. According to various embodiments, for the amplifiers with varying degrees of linearization, the architecture described herein may provides 5-8 dB of reduction in PSD in the transition band and at the same time may reduce the mean squared error by 2-4 dB, while keeping the amplifier output power same in both cases.

The adaptive spectral control algorithm of the invention may be based, at least in part, on the spectral error that tends to minimize the amplifier output PSD at a set of selected frequencies in the transition/stop band and simultaneously maximize the PSD at a different set of selected frequencies in the pass band. In some embodiments, the spectral error generator may be based on a matrix vector product evaluation. In other embodiments, the spectral error generator may be based on Fast Fourier Transform (FFT) computations and may not require matrix vector product evaluations.

Due to the differences in the manner in which the amplifier nonlinearity acts on the real versus complex baseband input signals, the systems and methods described herein may have at least two forms. A first form may be for the case of real baseband signals such as occur, for example, with the BPSK, or the more general PAM modulation. A second form may be for the case with complex or mixed baseband signals, such as occur, for example, with the QPSK or the more general QAM modulation schemes. The second form may also be used for the case of the real baseband signals, however, it may also be marginally more complex in terms of the implementation compared to the first form.

According to various embodiments, the reference signal may be the sum of a number, $\Psi$, of band limited digitally modulated signals at possibly different carrier frequencies. Each of the complex baseband digital signals may be filtered by its own srrc filter and the output of the sue filter may be modulated by the corresponding subcarrier frequency. Equivalently, the input digital signal may be first modulated by the corresponding subcarrier frequency and the resulting signal may then be filtered by a srrc filter with a modified set of coefficients. The adaptive spectrum controller in this case may be comprised of a set of $\Psi$ adaptive filters. The sum of the outputs of the adaptive filters may be input to the augmented nonlinear system. The coefficients of various adaptive filters may be adjusted so that the error between the reference signal and the demodulated and scaled version of the nonlinear amplifier output is minimized, while at the same time the amplifier output PSD may be minimized at a set of selected frequencies in the transition/stop band and the PSD may be maximized at a different set of selected frequencies in the pass band. For the case of multiple input signals, the stop band may be comprised of the band gaps among the spectrums of different subcarrier modulated band limited signals, including the band edge frequencies. The power in the pass band may be maximized by maximizing the PSD of the amplifier output at a set of frequencies in the pass bands of various subcarrier modulated band limited signals.

Various embodiments for the case of multiple input signals, in addition to minimizing the out of band spectral growth, may also reduce the spectral growth in the band gap among the spectrums of various signals, thus reducing the inter channel interference (ICI) and/or reducing the required band gaps thus resulting in the increased bandwidth efficiency.

While the various embodiments of the invention are presented in terms of real time adaptive optimization, in some cases, the design of the adaptive filters can be performed on the basis of an offline optimization using the model for the nonlinear system such as the AM-AM and the AM-PM model of the RF power amplifier available from the manufacturer's data sheets or via measurements. In this case various up-converters and down-converters may not be needed and the complete optimization may be performed at baseband. Once the adaptive filters' coefficients are determined by such an optimization, the srrc filter coefficients used in the traditional system may be replaced by the adaptive filter coefficients thus obtained via optimization via simulation. In such an implementation, the complexity of the system may be the same as that of the traditional system, but with all the advantages discussed above. The real time adaptive system on the other hand can be implemented in a digital signal processor (DSP) chip or some other similar implementation.

Also, various embodiments are described herein for the case when the nonlinear system is RF power amplifier. However, the techniques and architectures described herein may also be applicable to other engineering systems where the output of the system needs to follow some reference signal (trajectory), while at the same time one needs to suppress the power at certain undesirable frequencies present at the system output (e.g., resulting from some inherent resonances in the system). Non-limiting examples of such engineering systems may include, for example, missile and other guidance systems, various process-control systems, etc.

Figure 1:
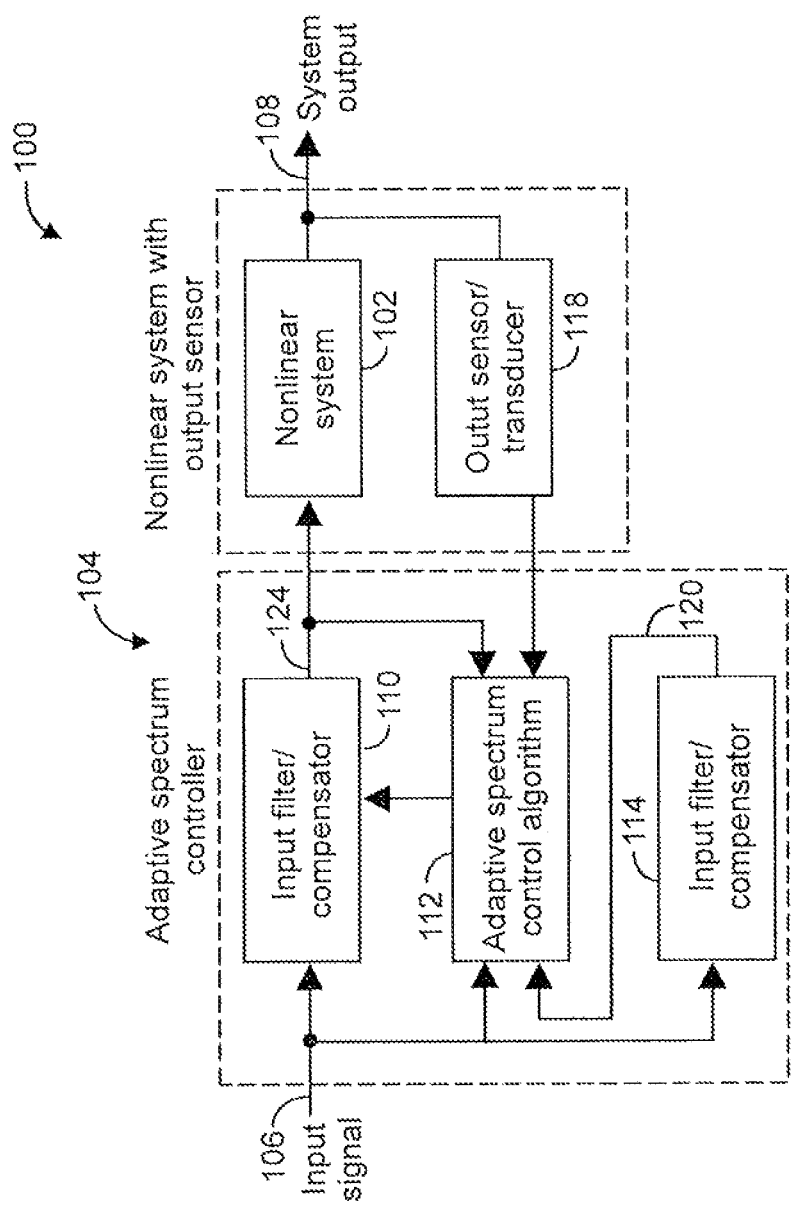
FIG. 1 shows a block diagram of one embodiment of a spectrum control system.

FIG. 1 shows a block diagram of one embodiment of a spectrum control system 100. The spectrum control system 100 may generally comprise a non-linear system 102 in communication with an adaptive spectrum control system 104. (In various embodiments, as described herein, the nonlinear system 102 may be linear.) An input signal 106 may be provided to the adaptive spectrum control system 102, which may pre-process the input signal and provide results to the nonlinear system 102. As illustrated in FIG. 1, the adaptive spectrum control system 104 may comprise an input filter/compensator 110, an adaptive spectrum controller 112 and a reference output generator 114. The input filter/compensator 110 may receive and process the input signal 106, providing its output 124 to the nonlinear system 102. Input parameters of the input filter/compensator 110 may be determined by the adaptive spectrum controller 112 and the reference output generator. For example, the input 106 may also be provided to the reference output generator 114. The reference output generator 114 may provide, at its output, a reference signal 120. For example, the reference signal 120 may be followed by the nonlinear system 102 to achieve desirable PSD control. The output 120 of the reference output generator 114 and the input signal 106 may also be provided to the adaptive spectrum controller 112. The adaptive spectrum controller 112 may also receive as input an output 108 of the nonlinear system 102 (e.g., via an output sensor/transducer 118). In various embodiments, the output sensor/transducer 118 may sense the nonlinear system output 108 and transform it to any suitable (e.g., convenient) form. For example, in the case wherein the nonlinear system 102 is a nonlinear RF power amplifier, the output sensor/transducer 118 may transform the RF output 108 into an equivalent digital baseband form.

Based upon at least these inputs (e.g., the output of the sensor transducer 118, the input signal 106 and the reference signal 120), the adaptive spectrum controller 112 may adjust the parameters of the input filter/compensator 110 in such a manner that the transformed output 108 of the nonlinear system 102 closely follows a version of the output 120 of the reference output generator 114 (e.g., a possible transformed version, for example, after up conversion of the output 120 to RF) and simultaneously minimizes the nonlinear system output power spectral density (PSD) at a selected set of frequencies while it also maximizes the system output PSD at a different set of frequencies.

Figure 2:
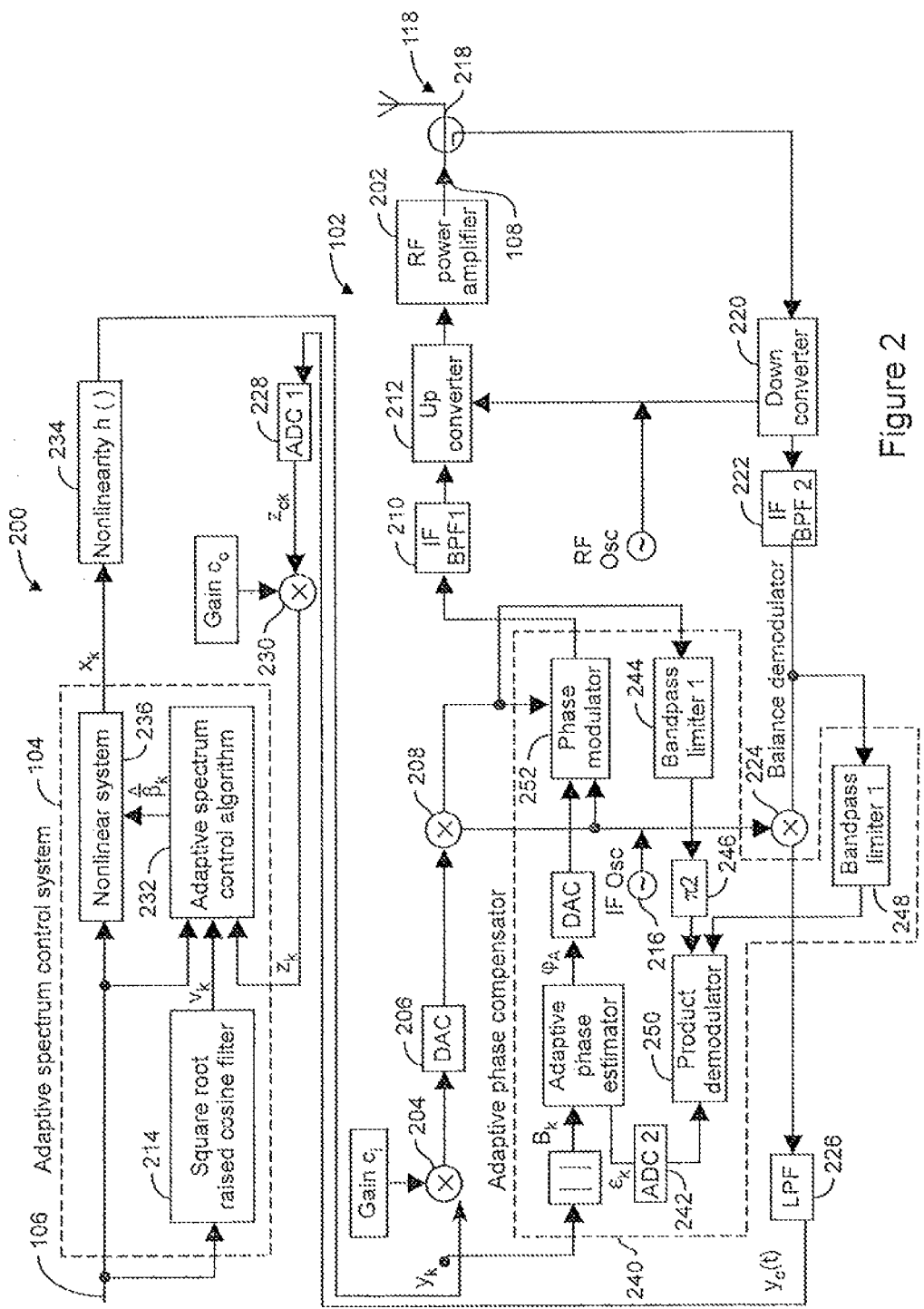
FIG. 2 shows a block diagram of one embodiment of a spectrum control system configured for spectrum control at the output of a nonlinear radio frequency (RF) power amplifier utilizing a pulse amplitude modulated (PAM) or binary phase shift keying (BPSK) modulated signal.

FIG. 2 shows a block diagram of another embodiment of a spectrum control system 200 configured for spectrum control at the output of a nonlinear system 102 comprising a radio frequency (RF) power amplifier 202 utilizing a pulse amplitude modulated (PAM) or binary phase shift keying (BPSK) modulated signal. The nonlinear system 102, as shown in FIG. 2, comprises an RF up-conversion chain comprised of the cascade of a gain multiplier 204 (with multiplier $c_i$), a digital-to-analog converter (DAC) 206, a balance modulator 208, an intermediate frequency (IF) band pass filter 210, an up-converter 212, and the RF power amplifier 202. In the system 200, the output 108 of the nonlinear system 102 (e.g., at the RF power amplifier 202) may be a pulse amplitude modulated (PAM) signal and, in some embodiments, may be a binary phase shift keying (BPSK) modulated signal, a special case of PAM.

The output signal 108 may be obtained by processing the baseband signal $v(t)$, which may be an analog version of a discrete-time signal $v_k$. The discrete time signal $v_k$ may be obtained by square root raised cosine (srrc) filtering of the real input signal $u_k$ (e.g., at an srrc filter 214). For the case of BPSK modulation $u_{k+L}$ may take binary values whereas in the case of more general PAM modulation, $u_{k+L}$ may take values over a finite set of possible values. In the absence of any amplifier distortion (ideal linear amplifier), the srrc filter output $v_k$ may be connected to the input of the up conversion chain where it is multiplied by the gain $c_i$ (e.g., by multiplier 204) and converted to the analog form by the DAC 206. The output of the DAC 206 may be modulated by the output of an IF oscillator 216 in the balanced modulator 208. The balanced modulator 208 output may be filtered by the IF band pass filter (BPF1) 210. The output of the BPF1 210 may be up-converted to a desired carrier frequency $f_c$ by the up-converter 212 and may be provided as input to the RF power amplifier 202.

For the case of PAM/BPSK modulation, the input to the RF power amplifier 202 may be expressed as:

$$s_i(t) = A_i v(t)\cos(2\pi f_c t + \theta_c) \quad (1)$$

where $\theta_c$ is some constant phase and $A_i$ is comprised of the product of the gain $c_i$ and the gain of the DAC 206, balanced modulator 208, IF BPF1 210 and the up-converter 212. For the case of the ideal linear amplifier the amplifier output 108 may be given by:

$$s_{or}(t) = A_0 v(t)\cos(2\pi f_c t + \theta_c) \quad (2)$$

where $A_0$ is the product of the linear RF amplifier gain and $A_i$. However, in the presence of AM-AM and AM-PM distortion caused by the amplifier and in the absence of any compensation and with $v_k$ instead of $y_k$ connected to the input of the nonlinear system 102, the RF amplifier output signal 108 may be given by:

$$s_o(t) = R_o(t)\cos(2\pi f_c t + \phi(t) + \theta_i(t) + \theta_c) \quad (3)$$
$$= R_o(t)\mathrm{sgn}(v(t))\cos(2\pi f_c t + \phi(t) + \theta_c)$$

where:

$$R_o(t) = A_{oN} g(|v(t)|) \quad (4a)$$
$$\phi(t) = \varphi_A(|v(t)|)$$
$$\theta_i(t) = \frac{\pi}{2}(1 - \mathrm{sgn}(v(t)))$$

$$\mathrm{sgn}(v) = \begin{cases} 1; & v > 0 \\ -1; & v < 0 \\ 0; & v = 0 \end{cases} \quad (4b)$$

In equation (4 a, b) sgn( ) denotes the signum function, g( ) and φ( ) denote the nonlinear system amplitude transfer characteristics and the amplitude to phase transfer characteristics respectively, and $A_{oN}$ is some appropriate normalization amplitude. For the distortion free case $g(|v(t)|)=|v(t)|$; $\phi_A(|v(t)|)=0$; and $A_{oN}=A_0$ where $v(t)$ is the analog version of $v_k$. Alternatively a normalized version of $|v(t)|$ may be used in the functions g( ) and $\phi_A$. The spectrum control system 200 may be configured to keep the amplifier output $s_o(t)$ close to the reference output $s_{or}(t)$ given by equation (2) while simultaneously minimizing the amplifier output PSD at a selected set of frequencies and maximizing the PSD at another set of selected frequencies, thus minimizing the spectral re growth caused by the RF power amplifier distortion. Equivalently the phase distortion φ(t) may be made equal to zero and the real baseband envelope of $s_o(t)$ given by $R_o(t)\mathrm{sgn}(v(t))$ may be made equal to $\kappa A_0 v(t)$ for some constant κ.

Referring again to FIG. 2, the output sensor/transducer 118 may comprise a coupler 218, a down converter 220, an IF band pass filter BPF2 222, a balanced demodulator 224, low pass filter (LPF) 226, an analog to digital converter (ADC1) 228 and a multiplier 230 with a gain $c_o$. According to various embodiments, $c_o$ may be equal to the inverse of the product of $A_{oN}$ (Equation (4) above) and a total feedback gain including the gains of the coupler 218 and the RF-to-the baseband converter chain in the feedback path, the latter comprised of the down converter 220, BPF2 222, balanced demodulator 224, the LPF 226, and the ADC1 228. Thus the total feedback gain is equal to the ratio of the real baseband envelope of the RF power amplifier output $s_o(t)$ and the ADC1 228 output $z_{ck}$. In the absence of any amplifier distortion, (e.g., $g(x)=x$; and $\phi_A(x)=0$ for any real $x\geq 0$), and without any compensation, the signal $z_k$ at the gain multiplier 230 output may be equal to $v_k$, that is the output of the srrc filter 214 when the input to the up conversion chain is $v_k$ instead of $y_k$. The srrc filter 214 may thus provide a reference output for the adaptive spectrum control system 104 when distortion is present. A nonlinearity h( ) 234 is shown in FIG. 2 and may be included in the system 200 for the compensation of the AM-AM distortion. An input of the nonlinearity 234 may receive an output of an adaptive filter 236 of the adaptive spectrum control system 104. The RF power amplifier output signal 108, after down conversion to digital baseband, referred to as the transformed output signal, and equal to $z_k$ at time k may be given in terms of the nonlinear system input signal amplitude $y_k$ by:

$$z_k = g(y_k) \tag{5}$$

where, as in (4) the function g( ) may represent the nonlinear system normalized amplitude transfer characteristics. The amplitude $y_k$ may be related to the adaptive filter output $x_k$ by a function h( ) which is assumed to be a cubic polynomial as in (6) below.

$$y_k = \begin{cases} x_k; & |x_k| \leq 1 \\ x_k + \alpha x_k^3; & |x_k| > 1 \end{cases} \tag{6}$$

In (6) $\alpha$ is some constant. As $z=g(y)$ is an odd function of its real argument y, the same function g( ) also relates the magnitude of y to the magnitude of g(y) for any real y, i.e., $|z|=g(|y|)$. A more comprehensive linearization method to compensate for the AM-AM transfer characteristics may also be used instead of the simple cubic nonlinear function in (6).

The output $x_k$ of the adaptive filter 236 may be related to its input $u_k$ by $$x_k = \sum_{i=-L}^{L} \beta_i u_{k-i} \tag{7}$$

where (2L+1) is the length of the adaptive filter and $\beta_i$, $i=-L, \ldots, -1, 0, 1, \ldots, L$ are the filter coefficients to be optimized. Denote by $v_k$ the output of the square-root raised cosine (srrc) filter providing the reference output signal with the filter input $u_k$, e.g., $$v_k = \sum_{i=-L}^{L} a_i u_{k-i} \tag{8}$$

where $a_i$, $i=-L, \ldots, -1, 0, 1, \ldots, L$ are the coefficients of the square-root raised cosine filter 214. The coefficients $\beta_i$ of the adaptive filter 236 in (7) may be selected so as to minimize some measure of the error between the transformed output $z_k$ and some scalar $\kappa$ times $v_k$, by minimizing an appropriate function $\theta_1$, for example a quadratic function, of the error. Thus the optimization problem my reduce to:

$$\min_{\beta_i} J_1 = \sum_k (\kappa v_k - z_k)^2 \tag{9}$$

For notational convenience let:

$$z_k = g_0(x_k) \equiv g(x_k + \alpha x_k^3) \tag{10}$$

In the following, the tandem of the nonlinearity specified by (6) and the nonlinear system 102 specified by (5), may be denoted by the function $g_o( )$. In the optimization of the index $\theta_1$ in (9), one may need the derivative of $z_k$ with respect to $x_k$ given by:

$$\frac{dz_k}{dx_k} = g'(x_k + \alpha x_k^3) \cdot (1 + 3\alpha x_k^2) \equiv g'_0(x_k) \tag{11}$$

where $$g'(x) \equiv \frac{dg(x)}{dx}.$$

Substitution of (6), (7) and (10) in (9) may yield:

$$J_1 = \sum_k \left[ \kappa v_k - g_0\left(\sum_{i=-L}^{L} \beta_i u_{k-i}\right) \right]^2 \tag{12}$$

Differentiation of $\theta_1$ in (12) with respect to $\beta_i$ may result in:

$$\frac{\partial J_1}{\partial \beta_i} = -2 \sum_k e_k g'_0\left(\sum_{i=-L}^{L} \beta_i u_{k-i}\right) \cdot u_{k-i}; \tag{13}$$

$$e_k = \kappa v_k - g_0\left(\sum_{i=-L}^{L} \beta_i u_{k-i}\right)$$

where the functions $g_0( )$ and $g'_0( )$ appearing in (13) are defined by (10) and (11) respectively.

An adaptive algorithm to estimate the parameters $\beta_i$, $i=-L, \ldots, -1, 0, 1, \ldots, L$ may be given by:

$$\hat{\beta}_{i,k} = \hat{\beta}_{i,k-1} + \mu \psi_k^d e_k u_{k-i}; k=1, 2, \ldots \tag{14}$$

$$\psi_k^d = g'_0(x_k) = g'_0\left(\sum_{i=-L}^{L} \hat{\beta}_{i,k-1} u_{k-i}\right); \tag{15a}$$

$$x_k = \sum_{i=-L}^{L} \hat{\beta}_{i,k-1} u_{k-i}$$

$$e_k = \kappa v_k - g_0(x_k) \tag{15b}$$

The signal $x_k$ in (15a) may be the output of the adaptive filter 236 at a time k. In (14) $\mu$ may be some sufficiently small positive scalar that may be selected so that the algorithm in (14) is convergent. The coefficients of the adaptive filter at k=0 may be selected equal to those of the srrc filter 214 for the initialization of the adaptive algorithm in (14)-(15).

Figure 3:
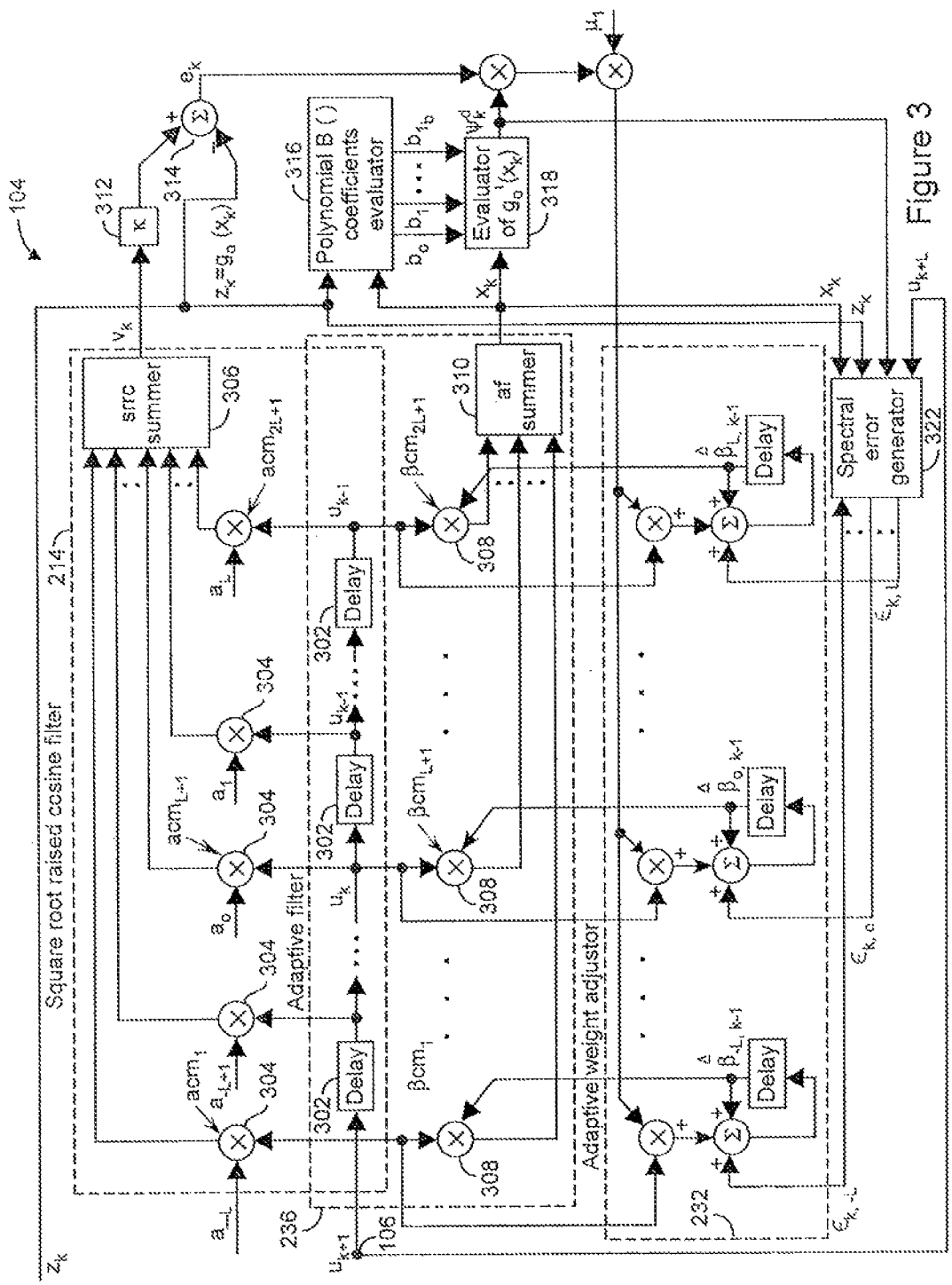
FIG. 3 shows a block diagram of one embodiment of the adaptive spectrum controller of the spectrum control system shown in FIG. 2.

FIG. 3 shows a block diagram of one embodiment of the adaptive spectrum controller 104 of the spectrum control system 200. As shown in FIG. 3, the input signal 106 (represented by $u_{k+L}$) may be input to a cascade of 2L delay elements 302 providing the 2L delayed versions of $u_{k+L}$ denoted by $u_{k+L-1}, \ldots, u_k, \ldots, u_{k-L}$. The input $u_{k+L}$ and its various delayed versions may be provided as input to the (2L+1) a-coefficient multipliers 304, individually indicated as $acm_1, \ldots, acm_{(2L+1)}$. The multipliers 304 may multiply the inputs $u_{k+L}, \ldots, u_k, u_{k-L}$, respectively, by the coefficients $a_{-L}, \ldots, a_0, \ldots, a_L$ of the srrc filter 214. The outputs of the various a-coefficient multipliers 304 may be provided as input to the srrc summer 306 generating the output $v_k$ of the srrc filter 214 at the output of the summer 306, for example, according to equation (8) above. The input $u_{k+L}$ and its various delayed versions may also be provided as input to (2L+1) β-coefficient multipliers 308, individually indicated as $\beta cm_1, \ldots, \beta cm_{(2L+1)}$. The β-coefficient multipliers 308 may multiply the inputs $u_{k+L}, \ldots, u_k, \ldots, u_{k-L}$ by estimates of the adaptive filter coefficients $\hat{\beta}_{-L,k-1}, \ldots, \hat{\beta}_{0,k-1}, \ldots, \hat{\beta}_{L,k-1}$ respectively. Outputs of the various β-coefficient multipliers 308 may be input to an adaptive filter (af) summer 310 to generate the adaptive filter 236 filter output $x_k$ at its output, for example, according to equations (7, 15a). In various embodiments, the srrc filter 214 and the adaptive filter 236 may share the cascade of the 2L delay elements 302, although, in some embodiments the srrc filter 214 and the adaptive filter 236 may each have individual sets of delay elements (not shown in FIG. 3), thereby making the two filters distinct entities. In various embodiments, the srrc filter 214 and the adaptive filter 236 may have different lengths.

Referring to FIG. 3, the nonlinear system transformed output $z_k$ of FIG. 2 may be subtracted from the product of κ (box 312) and $v_k$ at 314, to provide the error term $e_k$ appearing in (15b). In FIG. 3 and equation (15b), the parameter κ with 0<κ≤1 may be used to adjust the power level at the RF power amplifier output 108. The adaptive algorithm in equations (14)-(15) may require the evaluation of the derivative function $g'_0(\ )$ at the adaptive filter output $x_k$ in addition to $g_0(x_k) = z_k$. While $z_k$ may be obtained by directly sensing and transforming the RF amplifier output signal 108, the derivative function may not be directly observable. This problem may be solved by approximating the function $z_k = g_0(x_k)$ by a polynomial b( ) of an appropriate degree $n_b$, wherein the polynomial has non-zero coefficients corresponding to only the odd degree terms as the function $g_0(x_k)$ is an odd function of $x_k$. Thus:

$$z_k = g_0(x_k) \cong b_1 x_k + b_3 x_k^3 + \ldots + b_{n_b} x_k^{n_b} \tag{16}$$

The polynomial fit may be performed between $x_k$ and $z_k$ or equivalently between $|x_k|$ and $|z_k|$ as both the selected polynomial $b(x_k)$ and the function $g_0(x_k)$ may be odd functions of $x_k$. An adaptive algorithm to estimate the polynomial coefficients $b_1, b_2, \ldots, b_{nb}$ from the input $x_k$ and output $z_k$ (block 316) may be obtained by minimizing the optimization function I with respect to the coefficients $b_1, b_2, \ldots, b_{nb}$ with:

$$I = \sum_{m=1}^{k} \left( z_m - \sum_{\substack{i=1 \\ i:odd}}^{n_b} b_i x_m^i \right)^2 \tag{17}$$

Differentiation of I with respect to $b_i$ may yields:

$$\frac{\partial I}{\partial b_i} = -\sum_{m=1}^{k} e_{p,m} x_m^i; \tag{18}$$

$$e_{p,m} = z_m - \sum_{\substack{i=1 \\ i:odd}}^{n_b} b_i x_m^i;$$

$$i = 1, 3, \ldots, n_b$$

Accordingly, the adaptive algorithm to estimate the coefficients of the polynomial b( ) may be given by:

$$\hat{b}_{i,k} = \hat{b}_{i,k-1} + \mu_p x_k^i e_{p,k}; \tag{19}$$

$$e_{p,k} = z_k - \sum_{\substack{i=1 \\ i:odd}}^{n_b} \hat{b}_{i,k-1} x_k^i;$$

$$i = 1, 3, \ldots, n_b; k = 1, 2, \ldots$$

where $\mu_p$ is some sufficiently small positive number so that the algorithm in (19) is convergent. The initial estimates for the polynomial coefficients may be taken as $\hat{b}_{1,0}=1$; $\hat{b}_{i,0}=0, i>1$. Alternatively the initial estimates may be selected on the basis of an a-priori knowledge of the function $g(x_k)$.

The polynomial b( ) coefficient evaluator block 316 may adaptively evaluate the coefficients $b_1, b_2, \ldots, b_{nb}$ according to (19) and input these coefficients to an evaluator 318 of $g'_0(x_k)$ block. The evaluator 318 may compute $g'_0(x_k)$ according to the following equation:

$$\psi_k^d = g'_0(x_k) \cong x_k + 3b_2 x_k^2 + \ldots + n_b b_{n_b} x_k^{n_b-1} \tag{20}$$

The derivative signal $\psi_k^d$ after being multiplied by $e_k$ and the scalar $\mu_1 = \mu$ may be input to an adaptive weight adjustor 232. The positive scalar $\mu_1$ may be selected to be sufficiently small so that the adaptive algorithm in (14), e.g., evaluator block 316, is convergent. The derivative signal $\psi_k^d$ along with $x_k, z_k$, and $u_{k+L}$ may be provided as input to a spectral error generator block 322. The spectral error generator 322 may generate error signals $\epsilon_{k,-L}, \ldots, \epsilon_{k,0}, \ldots, \epsilon_{k,L}$, which may be derived on the basis of the optimization of the output spectrum of the nonlinear system at selected sets of frequencies. The adaptive weights adjustor 232 may adjust the adaptive filter coefficients $\hat{\beta}_{-L,k}, \ldots, \hat{\beta}_{0,k}, \ldots, \hat{\beta}_{L,k}$ according to the following adaptive algorithm:

$$\hat{\beta}_{i,k} = \hat{\beta}_{i,k-1} + \mu_1 \psi_k^d e_k u_{k-i} + \epsilon_{k,i}; i=-L, \ldots, 0, \ldots, L;$$
$$k=1,2,\ldots \tag{21}$$

In the adaptive algorithm in (21), the filter coefficients $\hat{\beta}_{-L,0}, \ldots, \hat{\beta}_{0,0}, \ldots, \hat{\beta}_{L,0}$ at k=0 may be selected equal to the srrc filter coefficients $a_{-L}, \ldots, a_0, \ldots, a_L$ so as to initialize the adaptive algorithm.

Referring back to FIG. 2, an adaptive phase compensator 240 may approximate the amplitude-to-phase transfer characteristics function $\phi_A(\ )$ in equation (4) by a polynomial r( ) of $B_k = |y_k|$ of an appropriate degree $n_r$, which may be given by:

$$\hat{\phi}_A(B_k) = r(B_k) = r_0 + r_1 B_k + \ldots + r_{n_r} B_k^{n_r} \tag{22}$$

An adaptive algorithm to estimate the coefficients of the polynomial r( ) may be given by:

$$\hat{r}_{m,k} = \hat{r}_{m,k-1} + \mu_\phi B_{k-1}^m \epsilon_{k-1}; m=0,1,\ldots,n_r; k=1,2\ldots \tag{23}$$

with some appropriate estimate for $\hat{r}_{m,0}$; $m=0,1,\ldots,n_r$ and some sufficiently small positive scalar $\mu_\phi$. The error term $\epsilon_k$ is that appearing at the output of an ADC2 242. As shown in FIG. 2, the output of the balanced modulator 208 may be input to the cascade of a band pass limiter 244, and a $\pi/2$ phase shifter 246. The output of the phase shifter 246 may be given by:

$$s_1(t) = -\kappa_1 \sin(2\pi f_{IF} t + \theta_i(t)) \tag{24}$$

where $f_{IF}$ is the IF frequency, $\theta_i(t)$ is the data phase modulation given in (4) and $\kappa_1$ is some constant. The output of a band pass limiter 248 may be given by:

$$s_2(t) = \kappa_2 \cos(2\pi f_{IF} t + \theta_i(t) - \hat{\phi}_A(t) + \phi_A(t)) \tag{25}$$

where $-\hat{\phi}_A(t)$ is the phase introduced by a phase modulator 252 in the adaptive phase compensator 240 and $\phi_A(t)$ is the phase distortion due to the power amplifier. Thus the output of a product demodulator 250 of the adaptive phase compensator 240 may be given by:

$$s_0(t) = \kappa_0 \sin(\phi_A(t) - \hat{\phi}_A(t)) \tag{26}$$

for some constant $\kappa_0$. Accordingly, the output of the ADC2 242 following the product demodulator 250 in the adaptive phase compensator 240 may be given by:

$$\epsilon_k = \kappa_\phi \sin(\tilde{\phi}_{A,k}) \approx \kappa_\phi \tilde{\phi}_{A,k} \text{ for } |\tilde{\phi}_{A,k}| \ll 1; \tilde{\phi}_{A,k} = \phi_{A,k} - \hat{\phi}_{A,k} \tag{27}$$

where $\kappa_\phi$ is some positive constant, and where $\phi_{A,k}$ and $\hat{\phi}_{A,k}$ denote the digitized version of $\phi_A(t)$ and $\hat{\phi}_A(t)$ respectively.

In addition to minimizing the error between the ideal filter response and the amplifier output, some embodiments may also minimize the spectral growth due to amplifier distortion. In order to achieve this, a weighted sum of the power spectral densities evaluated at a number of selected frequencies in the filter stop band may be minimized. For this purpose an N-point DFT (discrete Fourier transform) may be evaluated at frequencies $\omega_m = 2\pi f_m = 2\pi m f_r$ with the DFT resolution frequency $f_r = f_s/N$, $f_s$ being the sampling frequency. The set of selected indices, $m$, is denoted by $M_s$ with the size of the set equal to $M_s$. In a specific case one may have $M_s = \{0, 1, \ldots, N-1\}$ in which case the DFT may be evaluated by the Fast Fourier Transform (FFT) algorithm. In the following the set of indices $M_s$ is denoted by $\{i_1^s, i_2^s, \ldots, i_{M_s}^s\}$. The N-point DFT of the amplifier output at the $m^{th}$ selected frequency $i_m^s f_r$ may be given by:

$$Z_{m,k} = w_{m,0}^s g_0(x_k) + w_{m,1}^s g_0(x_{k-1}) + \ldots + w_{m,N-1}^s g_0(x_{k-N+1}); m=1,2,\ldots,M_s \tag{28}$$

with $$w_{m,i}^s = \exp[-j 2\pi i_m^s i/N]; j = \sqrt{-1}; i=0,1,\ldots N-1; m=1,2,\ldots,M_s \tag{29}$$

Thus $Z_{m,k}$ may denote the DFT of the $m^{th}$ frequency in the set $M_s$. The objective function to minimize the spectral growth may then be defined by:

$$J_2 = \left(\frac{2T_s}{N}\right) \sum_k \sum_{m \in M_s} \gamma_m^s |Z_{m,k}|^2 = \left(\frac{2T_s}{N}\right) \sum_k \sum_{m \in M_s} \gamma_m^s Z_{m,k} Z_{m,k}^* \tag{30}$$

In (30) * denotes the complex conjugate operation, $\gamma_m^s$, $m=1, 2, \ldots, M_s$, are the weighting coefficients which may all be equal to 1, and the factor $(2T_s/N)$ with $T_s = 1/f_s$ may be required to obtain the true power spectral density from the DFT $Z_{m,k}$. It is observed that for any real variable $\zeta$, the derivative of $|Z_{m,k}|^2$ may be evaluated as:

$$\frac{\partial |Z_{m,k}|^2}{\partial \zeta} = \frac{\partial Z_{m,k}}{\partial \zeta} Z_{m,k}^* + \frac{\partial Z_{m,k}^*}{\partial \zeta} Z_{m,k} \tag{31}$$

$$= \frac{\partial Z_{m,k}}{\partial \zeta} Z_{m,k}^* + \left[\frac{\partial Z_{m,k}}{\partial \zeta}\right]^* Z_{m,k}$$

$$= 2\text{Re}\left\{\frac{\partial Z_{m,k}}{\partial \zeta} Z_{m,k}^*\right\}$$

In (31) Re denotes the real part operator and the second equality follows as $\zeta$ is a real variable. In order to evaluate the expression in (31) it follows from (7) that:

$$\frac{\partial x_{k-n}}{\partial \beta_i} = u_{k-n-i}; n = 0, 1, \ldots, N-1; -L \le i \le L \tag{32}$$

Differentiation of the expression for $Z_{m,k}$ in (28) with respect to $\beta_i$ may yield:

$$\frac{\partial Z_{m,k}}{\partial \beta_i} = w_{m,0}^s g_0'(x_k) u_{k-i} + \tag{33a}$$

$$w_{m,1}^s g_0'(x_{k-1}) u_{k-1-i} + \ldots + w_{m,N-1}^s g_0'(x_{k-N+1}) u_{k-N+1-i};$$

$$m = 1, 2, \ldots, M_s$$

or:

$$\frac{\partial Z_{m,k}}{\partial \beta_i} = \sum_{t=0}^{N-1} w_{m,t}^s g_0'(x_{k-t}) u_{k-t-i}; \tag{33b}$$

$$-L \le i \le L; m = 1, 2, \ldots, M_s;$$

The equation (33) may also be written in the following equivalent matrix vector form:

$$\frac{\partial Z_{m,k}}{\partial \overline{\beta}} = \begin{bmatrix} u_{k+L} & u_{k+L-1} & \ldots & u_{k+L-N+1} \\ \vdots & \vdots & \vdots & \vdots \\ u_k & u_{k-1} & \ldots & u_{k-N+1} \\ \vdots & \vdots & \vdots & \vdots \\ u_{k-L} & u_{k-L-1} & \ldots & u_{k-L-N+1} \end{bmatrix} \begin{bmatrix} w_{m,0}^s g_0'(x_k) \\ w_{m,1}^s g_0'(x_{k-1}) \\ \vdots \\ w_{m,N-1}^s g_0'(x_{k-N+1}) \end{bmatrix} \tag{34}$$

where:

$$\frac{\partial Z_{m,k}}{\partial \overline{\beta}} \equiv \left[\frac{\partial Z_{m,k}}{\partial \beta_{-L}}, \ldots, \frac{\partial Z_{m,k}}{\partial \beta_0}, \ldots, \frac{\partial Z_{m,k}}{\partial \beta_L}\right]^T \tag{35}$$

In (35) T may denote the matrix transpose. With $Z_k$ denoting the $M_s$ vector:

$$Z_k = [Z_{1,k}, Z_{2,k}, \ldots, Z_{M_s,k}]^T \tag{36}$$

Then the gradient of $Z_k$ with respect to the parameter vector $\overline{\beta} = [\beta_{-L}, \ldots, \beta_0, \ldots, \beta_L]^T$ may be written in the following compact form:

$$\frac{\partial Z_k^T}{\partial \overline{\beta}} = U_k G_0'(x_k) W_s \tag{37}$$

where:

-continued $$\overline{U}_k = \begin{bmatrix} u_{k+L} & u_{k+L-1} & \cdots & u_{k+L-N+1} \\ \vdots & \vdots & \vdots & \vdots \\ u_k & u_{k-1} & \cdots & u_{k-N+1} \\ \vdots & \vdots & \vdots & \vdots \\ u_{k-L} & u_{k-L-1} & \cdots & u_{k-L-N+1} \end{bmatrix}_{(2L+1,N)} \quad (38a)$$

$$G'_0(x_k) = \begin{bmatrix} g'_0(x_k) & 0 & \cdots & 0 \\ 0 & g'_0(x_{k-1}) & \cdots & 0 \\ \vdots & \vdots & \vdots & \vdots \\ 0 & 0 & \cdots & g'_0(x_{k-N+1}) \end{bmatrix}_{(N,N)} \quad (38b)$$

$$W_s = \begin{bmatrix} w^s_{0,0} & w^s_{1,0} & \cdots & w^s_{M_s-1,0} \\ w^s_{0,1} & w^s_{1,1} & \cdots & w^s_{M_s-1,1} \\ \vdots & \vdots & \cdots & \vdots \\ w^s_{0,N-1} & w^s_{1,N-1} & \cdots & w^s_{M_s-1,N-1} \end{bmatrix}_{(N,M_s)} \quad (38c)$$

From (31), for the case of $\gamma_m^s=1$ for all m, the gradient of $\theta_2$ defined in (30) with respect to the parameter vector $\overline{\beta}$ may be given by:

$$\frac{\partial J_2}{\partial \overline{\beta}} = 2\left(\frac{2T_s}{N}\right) \sum_k \text{Re}\left\{\frac{\partial Z_k^T}{\partial \overline{\beta}} Z_k^*\right\} \quad (39)$$

Substitution of (37) into (39) may yield:

$$\frac{\partial J_2}{\partial \overline{\beta}} = 2\left(\frac{2T_s}{N}\right) \sum_k \text{Re}\{\overline{U}_k G'_0(x_k) W_s Z_k^*\} \quad (40)$$

For unequal weights $\gamma_m$, the gradient in (40) may be modified as:

$$\frac{\partial J_2}{\partial \overline{\beta}} = 2\left(\frac{2T_s}{N}\right) \sum_k \text{Re}\{\overline{U}_k G'_0(x_k) W_s \Xi_s Z_k^*\} \quad (41)$$

In (41) $\Xi_s$ is the diagonal matrix with its diagonal elements equal to $\gamma_m^s$, with $$\Xi_s = \text{diag}[\gamma_0^s \gamma_1^s \ldots \gamma_{M_s}^s] \quad (42)$$

From (28) the elements of the vector $Z_k$ are the N-point DFT of the amplifier output at the M selected frequencies. Thus:

$$Z_k = W_s^T \overline{z}_k; \, \overline{z}_k = [z_k z_{k-1} \ldots z_{k-N+1}]^T \quad (43)$$

Substitution of (43) in (41) may yield the following alternative form for the gradient vector:

$$\frac{\partial J_2}{\partial \overline{\beta}} = 2\left(\frac{2T_s}{N}\right) \sum_k \text{Re}\{\overline{U}_k G'_0(x_k) S_s \overline{z}_k^*\} \equiv \sum_k \frac{\partial J_{2,k}}{\partial \overline{\beta}}; \quad (44)$$
$$S_s = W_s \Xi_s (W_s^T)^*$$

The adaptive algorithm to update the estimate of the parameter vector $\overline{\beta}$ in order to minimize $\theta_2$ may be given by:

$$\overline{\beta}_k = \overline{\beta}_{k-1} - \mu\left(\frac{2T_s}{N}\right) \text{Re}\{\overline{U}_k G'_0(x_k) W_s Z_k^*\} \quad (45)$$

In (45) $\mu$ is some sufficiently small positive scalar selected so that the algorithm in (45) is convergent. An alternative form for the adaptive algorithm is given by:

$$\overline{\beta}_k = \overline{\beta}_{k-1} - \mu\left(\frac{2T_s}{N}\right) \text{Re}\{\overline{U}_k G'_0(x_k) S_s \overline{z}_k^*\}; \quad (46)$$
$$S_s = W_s \Xi_s (W_s^T)^*$$

Figure 4A:
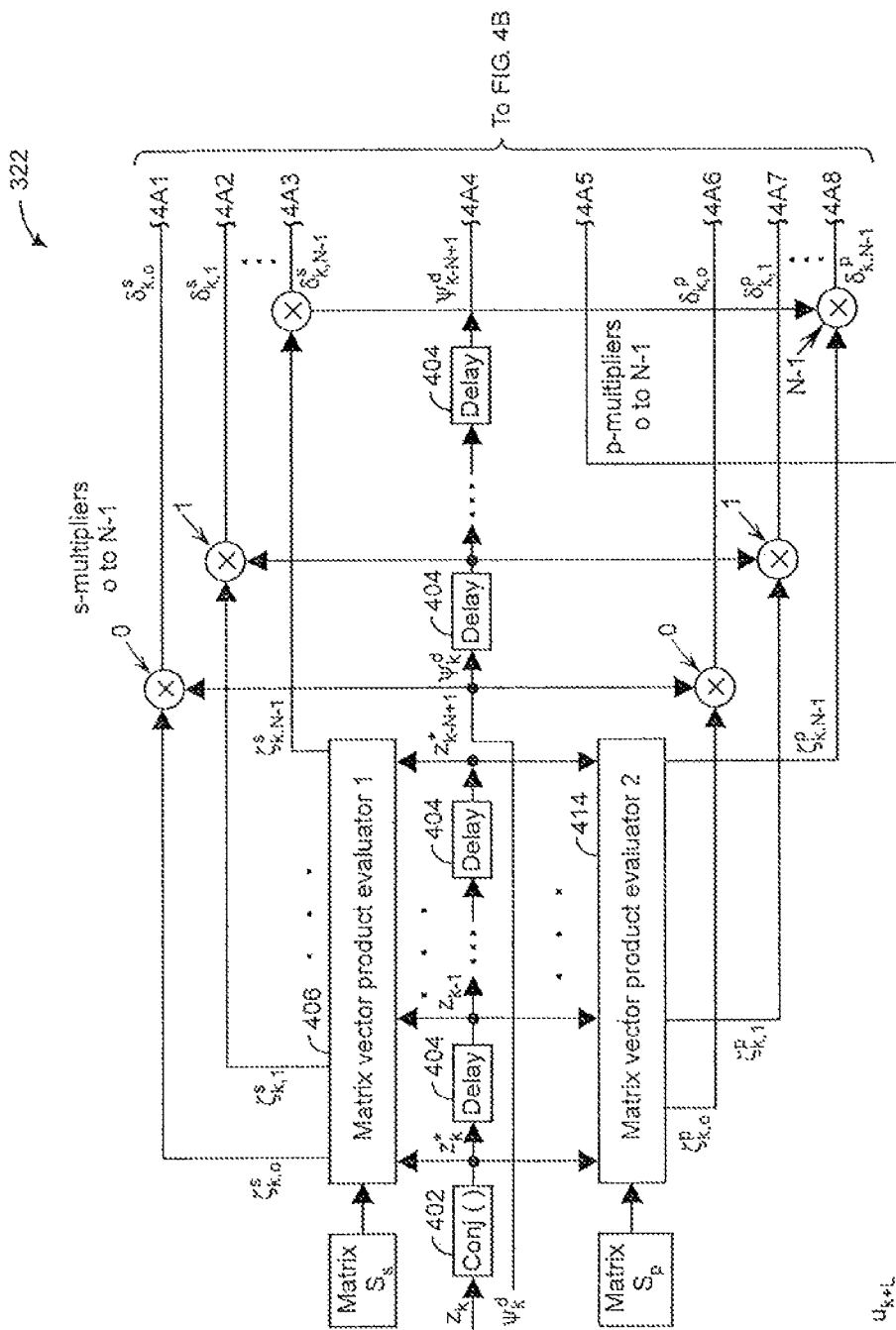
FIG. 4A shows a first portion of one embodiment of the spectral error generator of the adaptive spectrum control system shown in FIGS. 2 and 3.
Figure 4B:
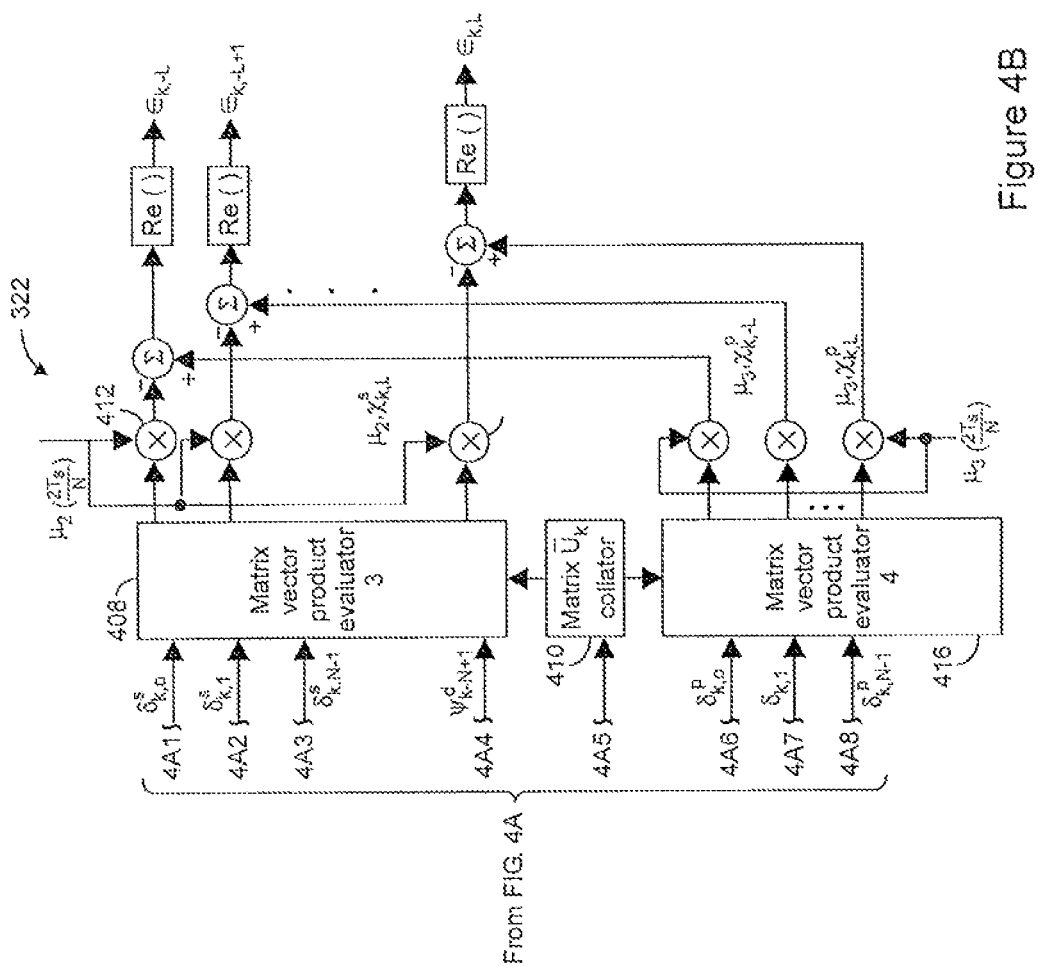
FIG. 4B shows a second portion of one embodiment of the spectral error generator of the adaptive spectrum control system shown in FIGS. 2 and 3.

FIG. 4 shows one embodiment of the spectral generator 322 of the adaptive spectrum control system 104 shown in FIGS. 2 and 3. The spectral generator 322 may generate the derivative $$\frac{\partial J_{2,k}}{\partial \overline{\beta}}$$

in equation (44) so as to minimize the weighted sum of the power spectral densities at a set of selected frequencies in the filter stop band. As shown in FIG. 4, the transformed nonlinear system output $z_k$ may be conjugated at 402 to obtain its complex conjugate $z^*_k$. The conjugate output $z^*_k$ may be input to a cascade of (N−1) delay elements 404 that may provide the (N−1) delayed versions $z^*_{k-1}, \ldots, z^*_{k-N+1}$. The conjugate output $z^*_k$ and its delayed versions along with the matrix $S_s$ may be input to a matrix vector evaluator 406, which may output the N elements of the vector $\overline{\zeta}_k^s = S_s \overline{z}^*_k$. As may be observed from equation (38b), $G'_0(x_k)$ in (44) may be a diagonal matrix with its diagonal elements equal to $\psi_{k-i}^d = g'_0(x_{k-i})$; i=0,1, ..., N−1. Thus the pre-multiplication of $\overline{\zeta}_k^s = S_s \overline{z}^*_k$ by $G'_0(x_k)$ may be obtained by multiplying the elements of $S_s \overline{z}^*_k$ by the respective delayed versions of $\psi_k^d$ obtained by inputting the derivative signal $\psi_k^d$ to a cascade of N−1 delay elements. The $i^{th}$ element of $S_s \overline{z}^*_k$ may be multiplied by the $i^{th}$ delayed version $\psi_{k-i+1}^d$ in the s-multiplier i for i=0,1, ..., N−1, which may provide the N elements of the vector $\overline{\delta}_k^s \equiv G'_0(x_k) S_s \overline{z}^*_k$.

The N elements $\delta_{k,0}^s, \ldots, \delta_{k,N-1}^s$ of the vector $\overline{\delta}_k^s$ may be input to the matrix vector evaluator 408, which may also receive as input the matrix $\overline{U}_k$ of equation (38a). The matrix $\overline{U}_k$ may be inputted by a matrix $\overline{U}_k$ collator 410, which may arrange the input signal samples $u_{k+L}, \ldots, u_k, \ldots, u_{k-L-N+1}$ in the form of the matrix $\overline{U}_k$ according to equation (38a). The output of the matrix vector evaluator 408, constituting the elements of the vector $\overline{U}_k \overline{\delta}_k^s$, may be multiplied by $\mu_2(2T_s/N)$ at 412 to provide the elements of the first component of the spectral error vector $\mu_2 \overline{\chi}_k^s$ where $\mu_2$ is some sufficiently small positive scalar selected so that the adaptive algorithm is convergent.

In order to simultaneously minimize the filter error and the out of band spectral regrowth, a weighted sum of the indices $\theta_1$ and $\theta_2$ may be minimized, as given by:

$$J = \lambda J_1 + (1-\lambda) J_2; \, 0 < \lambda < 1 \quad (47)$$

A stochastic gradient-based adaptive algorithm to minimize the optimization function $\theta$ may be given by:

$$\hat{\beta}_{i,k} = \hat{\beta}_{i,k-1} + \mu_1 \psi_k^d e_k u_{k-i} - \mu_2 \text{Re}\{\chi_{k,i}^s\}; \quad (48)$$

$$\mu_1 = \mu\lambda;\ \mu_2 = \mu(1-\lambda)$$

$$\overline{\chi}_k^s = \left(\frac{2T_s}{N}\right)\{\overline{U}_k G_0'(x_k) S_s \overline{z}_k^*\}; \quad (49)$$

$$\psi_k^d = g_0'(x_k);\ e_k = \kappa v_k - g_0(x_k)$$

Recall that in (49) $x_k$ is the output of the adaptive filter, $g_0(x_k)$ is the transformed amplifier output and $v_k$ is the output of the reference generator and $\chi_{k,i}^s$ in (48) denotes the $i^{th}$ element of the vector $\overline{\chi}_k^s$.

In various embodiments, an additional optimization function $\theta_3$, similar to the function $\theta_2$, may be utilized to avoid the possibility of the reduction in the power spectral density (PSD) in the filter pass band as a result of the minimization of the out of band PSD. The function $\theta_3$ may be defined as:

$$J_3 = \left(\frac{2T_s}{N}\right)\sum_k \sum_{m \in M_p} \gamma_m^p |Z_{m,k}|^2 = \left(\frac{2T_s}{N}\right)\sum_k \sum_{m \in M_p} \gamma_m^p Z_{m,k} Z_{m,k}^* \quad (50)$$

In (50), the function $\theta_3$ may denote the weighted sum of the amplifier output signal power spectral densities evaluated at a selected frequencies $\omega_m = 2\pi f_m = 2\pi m f_r$ in the filter pass band with the DFT resolution frequency $f_r = f_s/N$, $f_s$ being the sampling frequency. The set of selected indices, m, may be denoted by $M_p$ with the size of the set equal to $M_p$. In the following the set of indices $M_p$ is denoted by $\{i_1^p, i_2^p, \ldots, i_{M_p}^p\}$. The derivation of the gradient of $\theta_3$ with respect to the parameter vector $\overline{\beta}$ may be similar to that for $\theta_2$ in (31)-(49) except for the replacement of the matrix $W_s$ by $W_p$:

$$W_p = \begin{bmatrix} w_{0,0}^p & w_{1,0}^p & \ldots & w_{M_p-1,0}^p \\ w_{0,1}^p & w_{1,1}^p & \ldots & w_{M_p-1,1}^p \\ \vdots & \vdots & \ldots & \vdots \\ w_{0,N-1}^p & w_{1,N-1}^p & \ldots & w_{M_p-1,N-1}^p \end{bmatrix}_{(N,M_p)} \quad (51)$$

With:

$$w_{m,i}^p = \exp[-j2\pi i_m^p i/N]; \quad (52)$$

$$j \equiv \sqrt{-1}\ ;\ i = 0, 1, \ldots N-1;\ m = 1, 2, \ldots, M_p$$

The gradient of $\theta_3$ with respect to the parameter vector $\overline{\beta}$ may be given by (44) with $W_s$ and $\Xi_s$ replaced by $W_p$ and $\Xi_p$ respectively where $\Xi_p$ denotes the diagonal matrix with its diagonal elements equal to the weights $\gamma_m^p$ assigned to PSD of various frequency terms ($i_m^p f_m$) in the filter pass band appearing in the optimization function $\theta_3$ in (50) as:

$$\Xi_p = \text{diag}[\gamma_0^p \gamma_1^p \ldots \gamma_{M-1}^p] \quad (53)$$

thus:

$$\frac{\partial J_3}{\partial \overline{\beta}} = 2\left(\frac{2T_s}{N}\right)\sum_k \text{Re}\{\overline{U}_k G_0'(x_k) S_s \overline{z}_k^*\}; \quad (54)$$

$$S_p = W_p \Xi_p (W_p^T)^*$$

Referring back to FIG. 4, the spectral generator 322 may also generates the derivative $$\frac{\partial J_{3,k}}{\partial \overline{\beta}}$$

in equation (54), for example, to maximize the weighted sum of the power spectral densities at a set of selected frequencies in the filter pass band. As shown in FIG. 4, the conjugate output $z_k^*$ and its delayed versions along with the matrix $S_p$ are input to the matrix vector evaluator 414, which provides as output the N elements of the vector $\overline{\zeta}_k^p = S_p \overline{z}_k^*$. As may be observed from equation (38b), $G_0'(x_k)$ in (54) may be a diagonal matrix with its diagonal elements equal to $\psi_{k-i}^d = g_0'(x_{k-i})$; $i=0,1,\ldots, N-1$. Thus the pre multiplication of $\overline{\zeta}_k^p = S_p \overline{z}_k^*$ by $G_0'(x_k)$ may be obtained by multiplying the elements of $S_p \overline{z}_k^*$ by the respective delayed versions of $\psi_k^d$. The $i^{th}$ element of $S_p \overline{z}_k^*$ may be multiplied by the $i^{th}$ delayed version $\psi_{k-i+1}^d$ in the p-multiplier i for $i=0,1,\ldots, N-1$ providing the N elements of the vector $\overline{\delta}_k^p \equiv G_0'(x_k) S_p \overline{z}_k^*$. The N elements $\delta_{k,0}^p, \ldots, \delta_{k,N-1}^p$ of the vector $\overline{\delta}_k^p$ may be input to the matrix vector evaluator 416, which may also be inputted with the matrix $\overline{U}_k$ from the matrix $\overline{U}_k$ collator 410. The output of the matrix vector evaluator 416 (e.g., the elements of the vector $\overline{U}_k \overline{\delta}_p^k$) may be multiplied by $\mu_3(2T_s/N)$ in multipliers 418 to provide the elements of the second component of the spectral error vector $\mu_3 \overline{\chi}_k^p$, where $\mu_3$ is some sufficiently small positive scalar selected so that the adaptive algorithm is convergent.

As shown in the FIG. 4, the elements of the first component of the first spectral error vector $\mu_2 \overline{\delta}_k^s$ are subtracted from the corresponding elements of the second component of the spectral error vector $\mu_3 \overline{\chi}_k^p$ to provide the difference error vector, the real parts of the elements of the difference error vector provide elements $\epsilon_{k,-L}, \ldots, \epsilon_{k,0} \ldots \epsilon_{k,L}$ of the spectral error vector $\overline{\epsilon}_k$ which are input to the adaptive weights adjustor 232, where they may be added to the respective error signals $\mu_1 \psi_k^d e_k u_{k-i}$; $i=-L, \ldots, 0, \ldots L$ to provide a composite error signal for the adaptive filter weights adjustment.

An adaptive algorithm to minimize the optimization function $\theta$ in (47) while simultaneously maximizing the function $\theta_3$ and as implemented by the adaptive weights adjustor 232 may be given by:

$$\hat{\beta}_{i,k} = \hat{\beta}_{i,k-1} + \mu_1 \psi_k^d e_k u_{k-i} - \mu_2 \text{Re}\{\overline{\chi}_{k,i}^s\} + \mu_3 \text{Re}\{\overline{\chi}_{k,i}^p\} \quad (55)$$

$$= \hat{\beta}_{i,k-1} + \mu_1 \psi_k^d e_k u_{k-i} + \epsilon_{k,i};$$

$$i = -L, \ldots, 0, \ldots L;\ k = 0, 1, \ldots$$

A modification of the optimization function $\theta_1$ in (12) by the addition of a weighted fourth power of the error term $e_k$ results in the following modified version of the algorithm in (55).

$$\hat{\beta}_{i,k} = \hat{\beta}_{i,k-1} + \mu_1 \psi_k^d e_k u_{k-i} + \mu_{1,3} \psi_k^d e_k^3 u_{k-i} + \epsilon_{k,i};$$
$$i = -L, \ldots, 0, \ldots L;\ k = 0, 1, \ldots \quad (55a)$$

In (55) $\chi_{k,i}^s$ denotes the $i^{th}$ component of the vector $\overline{\chi}_k^s$ defined in (49), $\chi_{k,i}^p$ denotes the $i^{th}$ component of the vector $\overline{\chi}_k^p$ given by:

$$\overline{\chi}_k^p = \left(\frac{2T_s}{N}\right)\{\overline{U}_k G_0'(x_k) S_p \overline{z}_k^*\} \quad (56)$$

In (55) $\mu_1$, $\mu_2$, and $\mu_3$ are some sufficiently small positive scalars selected so that the algorithm in (55) is convergent and also determine the relative weights assigned to the objective functions $\theta_1$, $\theta_2$ and $\theta_3$. In (55a) $\mu_{1,3}$ is a positive scalar that determines the relative weight given to the fourth order term relative to the quadratic term in the modified optimization function $\theta_f$.

Figure 5A:
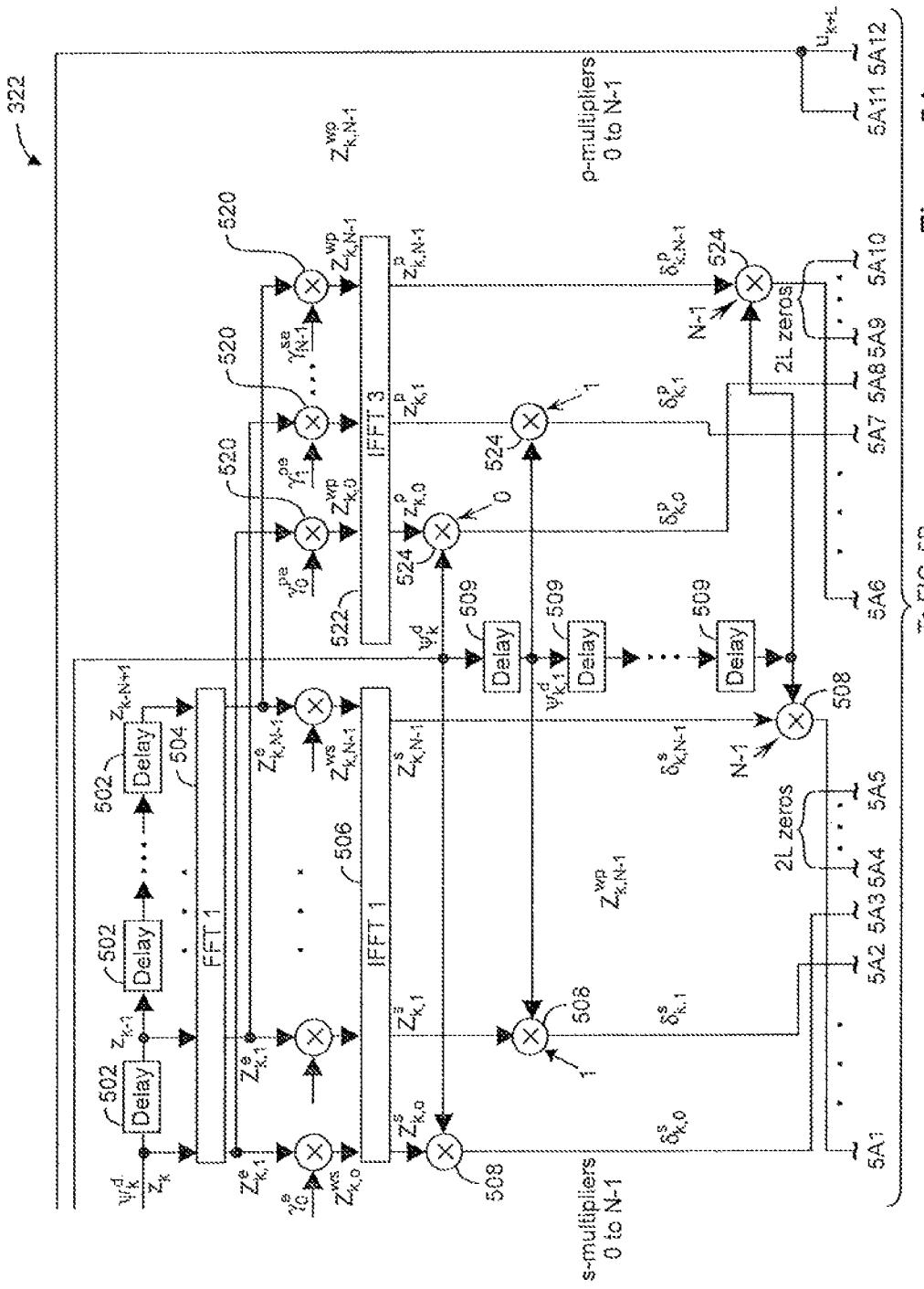
FIG. 5A shows a first portion of one embodiment of the spectral error generator of the adaptive control system of FIGS. 2 and 3 configured to implement matrix vector evaluations in terms of the Fast Fourier Transform (FFT).
Figure 5B:
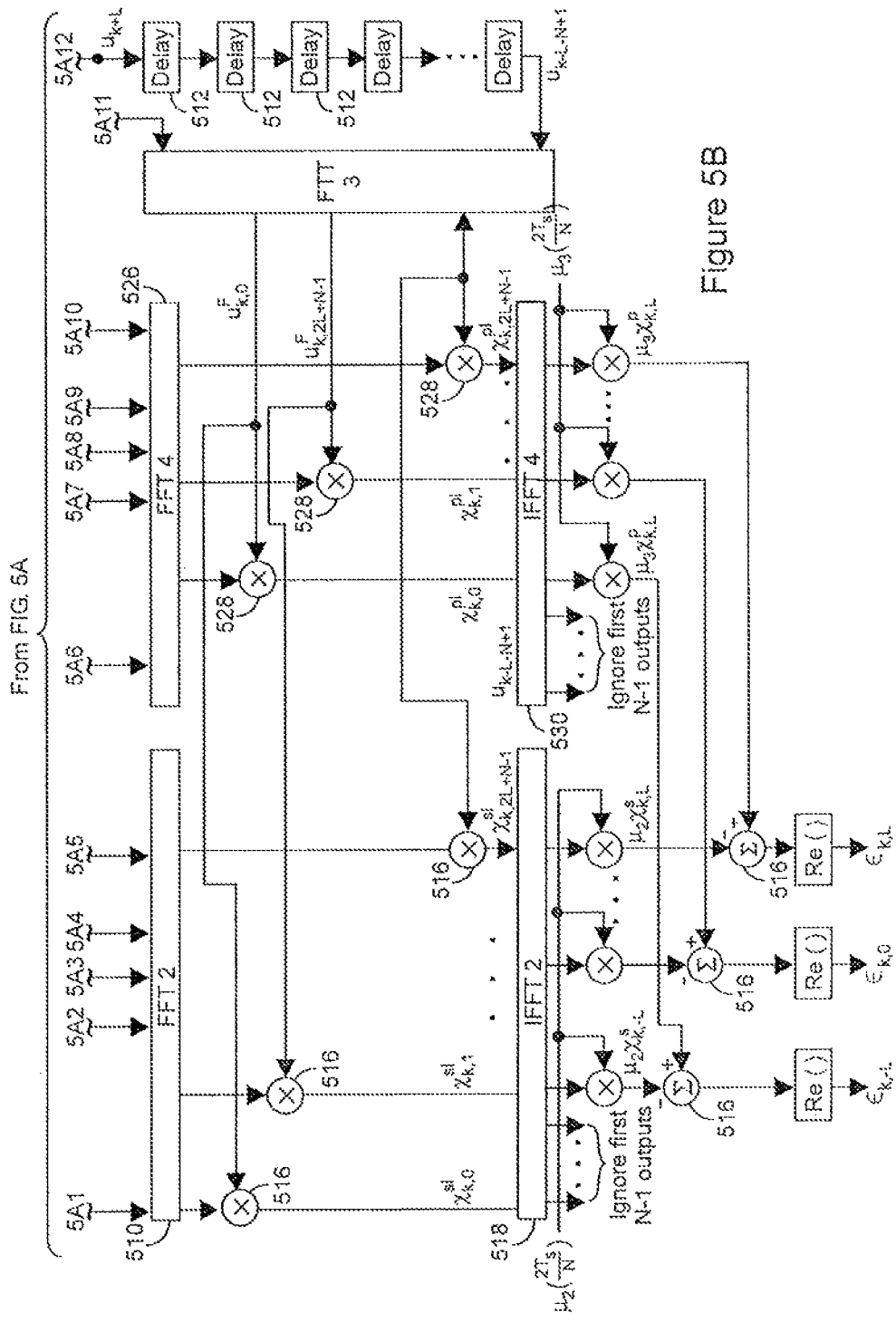
FIG. 5B shows a second portion of one embodiment of the spectral error generator of the adaptive control system of FIGS. 2 and 3 configured to implement matrix vector evaluations in terms of the Fast Fourier Transform (FFT).

According to various embodiments, the matrix vector evaluations in the spectral error generator 322 may be implemented in terms of FFT (Fast Fourier Transform) computations. FIG. 5 shows one embodiment of the spectral error generator 322 of the adaptive control system 200 configured to implement matrix vector evaluations in terms of the FFT. According to various embodiments, utilizing the FFT instead of the matrix product evaluation methods described herein above may be advantageous in terms of the number of computations needed when the number of frequencies selected in the filter stop band or the filter pass band is relatively high.

The real part of the normalized vector $\overline{\chi}_k^{sn} \equiv (N/2T_s)\overline{\chi}_k^s$ may be expressed as $$\mathrm{Re}\{\overline{\chi}_k^{sn}\} = \mathrm{Re}\{\overline{U}_k G_0'(x_k) W_s \Xi_s (W_s^T)^* \overline{z}_k^*\} \quad (57)$$
$$= \mathrm{Re}\{\overline{U}_k G_0'(x_k) W_s^* \Xi_s W_s^T \overline{z}_k\}$$
$$= \mathrm{Re}\{\overline{U}_k G_0'(x_k) W_{se}^* \Xi_{se} W_{se}^T \overline{z}_k\}$$

In (57) $W_{se}^T$ may be an (N×N) matrix with its (m, i)$^{th}$ element equal to $\exp[-j2\pi mi/N]$, $j=\sqrt{-1}$, i,m=0,1, ..., N−1, i.e., $W_{se}^T$ is the discrete Fourier transform matrix. Thus the product $W_{se}^T \overline{z}_k$ may be the discrete Fourier transform of $\overline{z}_k$ and, thus, can be evaluated by taking the FFT of $\overline{z}_k$. Similarly $W^*_{se}$ may be the inverse Fourier transform matrix. The matrix $\Xi_{se}$ may be the (N×N) diagonal matrix with all of its diagonal elements equal to zero except those that correspond to the selected set of frequencies given by $(f_s/N)$ times the indices in the set $M_s$.

As shown in FIG. 5, the transformed amplifier output $z_k$ may be provided as input to a cascade of (N−1) delays 502 providing various delayed versions of $z_k$ given by $z_{k-1}$, ..., $z_{k-N+1}$. The transformed amplifier output $z_k$ along with its various delayed versions may be provided as input to the FFT block 504, which may provide $\overline{Z}_k^e \equiv W_{se}^T \overline{z}_k$. The various elements of the vector $\overline{Z}_k^e$ may be weighted by the diagonal elements of the matrix $\Xi_{se}$ denoted by $\gamma_0^{se}, \gamma_1^{se}, \ldots, \gamma_{N-1}^{se}$ and only $M_s$ of which are non zero. The elements of the weighted vector $\overline{Z}_k^{ws} \equiv \Xi_{sc} \overline{Z}_k^e$, denoted by $Z_{k,0}^{ws}, Z_{k,1}^{ws}, \ldots, Z_{k,N-1}^{ws}$, may be input to the IFFT block 506 where the inverse Fourier transform of $\overline{Z}_k^{ws}$ equal to $W^*_{se}\overline{Z}_k^{ws}$ may be evaluated.

The outputs of the IFFT block 506, denoted by $z_{k,0}^s, z_{k,1}^s, \ldots z_{k,N-1}^s$, may be multiplied in N s-multipliers 508 by $\psi_k^d$ and its delayed versions $\psi_{k-1}^d, \psi_{k-2}^d, \ldots, \psi_{k-N+1}^d$, respectively, generating $\delta_{k,0}^s, \ldots, \delta_{k,N-1}^s$, which may constitute the elements of the N-vector $\overline{\delta}_k^s$. Delayed versions $\psi_{k-1}^d, \psi_{k-2}^d, \ldots, \psi_{k-N+1}^d$ of $\psi_k^d$ may be generated, for example, by delay elements 509. The vector $\overline{\delta}_k^s$ generated by the multipliers 508 may be multiplied by the matrix $\overline{U}_k$, given in terms of the input signal samples $u_{k+L}, \ldots, u_k, \ldots, u_{k-L-N+1}$ in equation (38a). As the rows of matrix $\overline{U}_k$ have a relative shift property, the required matrix vector product can be evaluated by the convolution of the vector $\overline{\delta}_k^{sI}$ that may be obtained by reversing the order of the elements in the vector $\overline{\delta}_k^s$, with the vector $\overline{u}_k^e \equiv [u_{k+L}, \ldots, u_k, \ldots, u_{k-L-N+1}]$ and ignoring the (N−1) elements on either side of the resulting (2L+2N−1) length vector obtained by convolution. The resulting (2L+1) length vector may be equal to the matrix vector product $\overline{U}_k \overline{\delta}_k^s$.

In turn, the partial convolution between $\overline{u}_k^e$ and $\overline{\delta}_k^{sI}$ may be obtained in terms of the (2L+N) point FFT of the vector $\overline{u}_k^e$ and the vector $\overline{\delta}_k^{sIe}$ of length (2L+N) obtained by appending 2L zeros at the end of the vector $\overline{\delta}_k^{sI}$, i.e., with $$\overline{\delta}_k^{sIe} = \left[\overline{\delta}_k^{sI}, \underbrace{0, 0, \ldots, 0}_{2L}\right].$$

As shown in FIG. 5, the elements of the vector $\overline{\delta}_k^{sIe}$ may be input to the FFT block 510, which may provide the FFT of the input vector at its output. Also, as shown in FIG. 5, the signal $u_{k+L}$ may be input to a cascade of (2L+N−1) delay elements 512, providing various delayed versions of $u_{k+L}$. The input signal $u_{k+L}$ and its (2L+N−1) delayed versions $u_{k+L-1}, \ldots, u_k, \ldots, u_{k-L-N+1}$ may be input to the FFT block 514, which may compute the (2L+N) point FFT of its input vector $\overline{u}_k^e$. The outputs of the FFT block 514, denoted by $u_{k,0}^F, u_{k,1}^F, \ldots u_{k,2L+N-1}^F$, may be multiplied by the respective (2L+N) outputs of the FFT block 510 by (2L+N) multipliers 516, providing the elements $\chi_{k,0}^{sI}, \chi_{k,1}^{sI}, \ldots \chi_{k,2L+N-1}^{sI}$ of the vector $\overline{\chi}_k^{sI}$ at the outputs of the multipliers 516. The elements of the vector $\overline{\chi}_k^{sI}$ may be input to an IFFT block 518 that may provide the inverse FFT of $\overline{\chi}_k^{sI}$ at its output. Ignoring the first N−1 outputs of the IFFT 518 block and multiplying the remaining (2L+1) outputs by $\mu_2(2T_s/N)$ may provide the elements of the vector $\mu_2 \overline{\chi}_k^s$, defined in (49).

The vector $\mu_3 \overline{\chi}_k^p$ with $\overline{\chi}_k^p$, given by equation (56), may be obtained in the same or similar manner as the computation of $\mu_2 \overline{\chi}_k^s$ in FIG. 5. For example, the various elements of the vector $\overline{Z}_k^e$ at the output of the FFT block 504 may be weighted by the diagonal elements of the matrix $\Xi_{pe}$ denoted by $\gamma_0^{pe}, \gamma_1^{pe}, \ldots, \gamma_{N-1}^{pe}$ at multipliers 520 and only $M_p$ of which are non zero. The elements of the weighted vector $\overline{Z}_k^{wp} \equiv \Xi_{pe} \overline{Z}_k^e$ denoted by $Z_{k,0}^{wp}, Z_{k,1}^{wp}, \ldots, Z_{k,N-1}^{wp}$ (e.g., the output of the multipliers 520) may be provided as input to an IFFT block 522, where the inverse Fourier transform of $\overline{Z}_k^{wp}$ equal to $z_k^p = W^*_{pe} \overline{Z}_k^{wp}$ may be evaluated. The outputs of the IFFT block 522, denoted by $z_{k,0}^p, z_{k,1}^p, \ldots, z_{k,N-1}^p$, may be multiplied in N p-multipliers 524 by $\psi_k^d$ and its delayed versions $\psi_{k-1}^d, \psi_{k-2}^d, \ldots, \psi_{k-N+1}^d$, respectively, generating $\delta_{k,0}^p, \ldots, \delta_{k,N-1}^p$, which may constitute the elements of the N-vector $\overline{\delta}_k^p$.

A vector $\overline{\delta}_k^{pIe}$ of length (2L+N) may be obtained by appending 2L zeros at the end of the vector $\overline{\delta}_k^{pI}$, the latter may be the vector obtained by reversing the order of the elements in the vector $\overline{\delta}_k^p$. Thus, $$\overline{\delta}_k^{pIe} = \left[\overline{\delta}_k^{pI}, \underbrace{0, 0, \ldots, 0}_{2L}\right].$$

The elements of the vector $\overline{\delta}_k^{pIe}$ may be connected to the inputs of the FFT block 526. In FIG. 5 the reversal of the order of elements of $\overline{\delta}_k^p$ may be achieved by reversing the order of the inputs $\delta_{k,0}^p, \ldots, \delta_{k,N-1}^p$ to the FFT block 526. The outputs of the FFT block 514, denoted by $u_{k,0}^F, u_{k,1}^F, \ldots u_{k,2L+N}^F$, may be multiplied by the respective (2L+N) outputs of the FFT block 526 by (2L+N) multipliers 528, providing the elements $\chi_{k,0}^{pI}, \chi_{k,1}^{pI}, \ldots \chi_{k,2L+N-1}^{pI}$ of the vector $\overline{\chi}_k^{pI}$ at the outputs of the multipliers 528. The elements of the vector $\overline{\chi}_k^{pI}$ may be input to the IFFT block 530 that may provide the inverse FFT of $\overline{\chi}_k^{pI}$ at its output. Ignoring the first N−1 outputs of the IFFT block 530 and multiplying the remaining (2L+1) outputs by $\mu_3(2T_s/N)$ may provide the elements of the vector $\mu_3 \bar{\chi}_k^p$ defined in (56).

As shown in the FIG. 5, the elements of the first component of the spectral error vector $\mu_2 \bar{\chi}_k^s$ are subtracted from the corresponding elements of the second component of the spectral error vector $\mu_3 \bar{\chi}_k^p$ by subtractors (532) to provide the difference error vector, the real parts of the elements of the difference error vector provide the elements $\epsilon_{k,-L}, \ldots, \epsilon_{k,0}, \ldots \epsilon_{k,L}$ of the spectral error vector $\bar{\epsilon}_k$ which are input to the adaptive weights adjustor of FIG. 3.

Figure 6A:
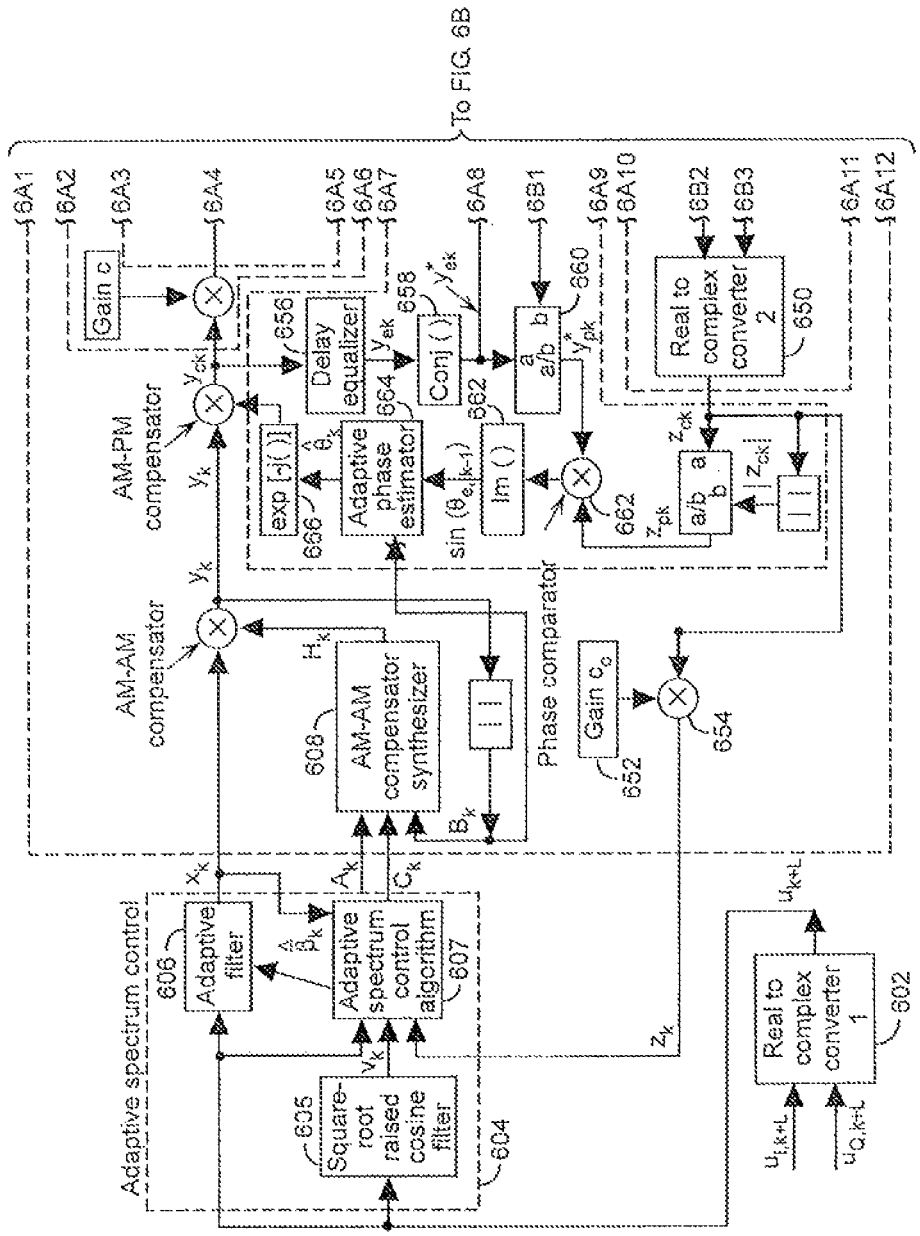
FIG. 6A shows a first portion of a block diagram of one embodiment of a spectrum control system where the input to the nonlinear system is complex valued as is the case for the quadrature phase shift-keying (QPSK) or more general quadrature amplitude modulation (QAM) and multiple or M'ary phase-shift keying (MPSK) modulation schemes.
Figure 6B:
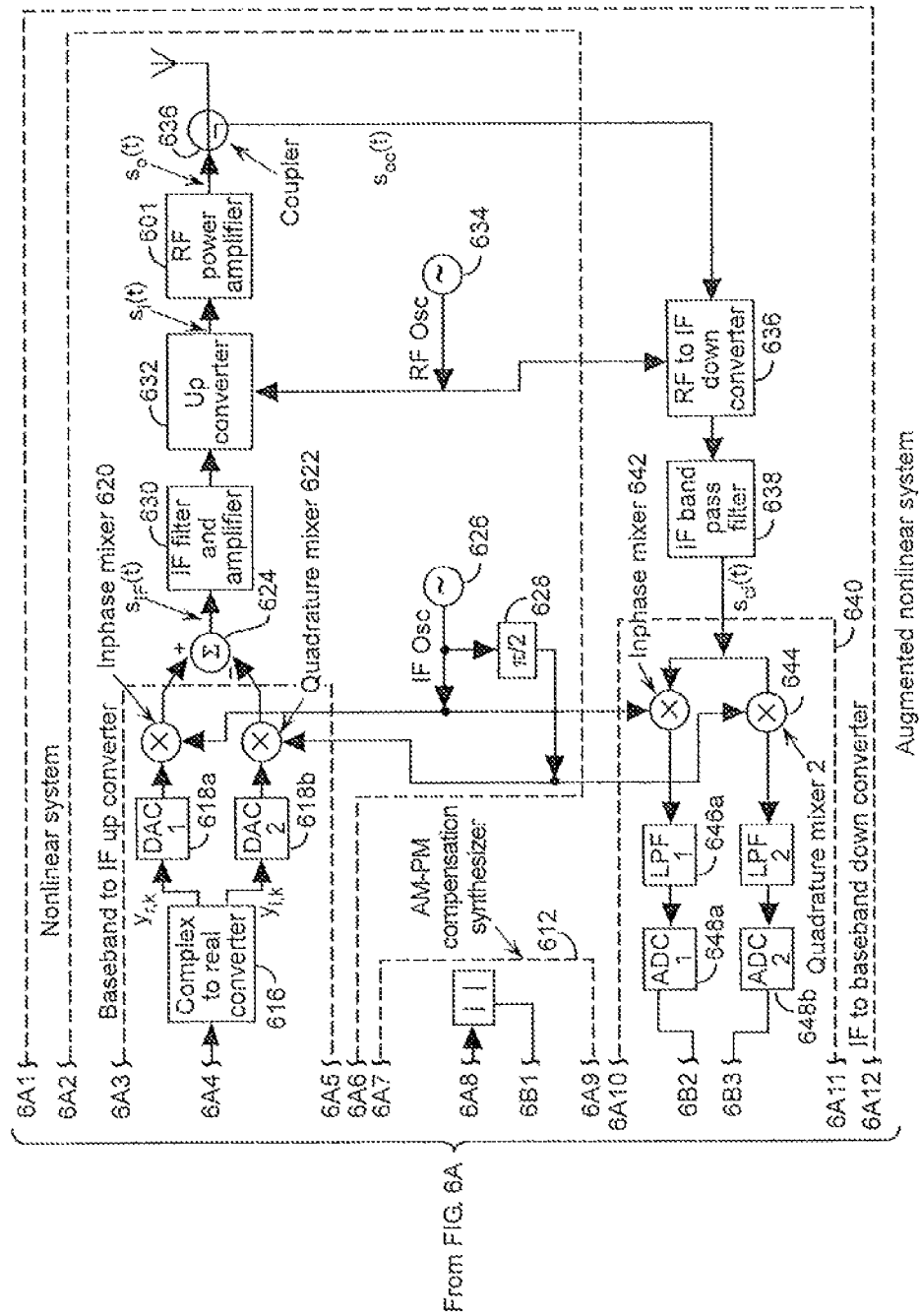
FIG. 6B shows a second portion of the block diagram of FIG. 6A.

FIG. 6 shows a block diagram of one embodiment of a spectrum control system 600 where the input to the nonlinear system is complex valued, as is the case for the QPSK or more general QAM and MPSK modulation schemes. Referring to FIG. 6, the pair of real inputs $u_{1,k+L}$ and $u_{Q,k+L}$ may be combined by a real to complex converter 602 into the complex input $u_{k+L}$ that may be input to an adaptive spectrum control system 604. The magnitude $A_k$ of the output $x_k$ of an adaptive filter 606 may be provided as input to an AM-AM compensation synthesizer 608. The output, ($H_k$), of the AM-AM compensation synthesizer 608 may be input to an AM-AM compensator 609, that may multiply the input $x_k$ by a gain $H_k$. A resulting AM-AM compensated signal $y_k$ may be input to an AM-PM compensator 610, which may pre-compensate for AM-PM distortion introduced by the amplifier 601. The AM-AM and AM-PM compensated signal $y_{ck}$, after being multiplied by a gain $c_i$, may be provided as input to a baseband-to-IF converter 614 comprised of a complex-to-real converter 616, digital-to-analog converters (DACs) 618a, 618b, an in-phase mixer 620, a quadrature mixer 622, and an adder 624, so as to generate an IF signal $s_{IF}(t)$ at the output of the baseband-to-IF converter 614.

Referring to the baseband-to-IF converter block 614, the complex-to-real converter 616 may generate a real part $y_{rk}$ and an imaginary part $y_{ik}$, respectively, of the complex input signal $c_i y_{ck}$ at its output. The signal $y_{rk}$, after being converted into the analog form by DAC 618a, may be provided as input to the in-phase mixer 620, where the other input of the in-phase mixer may be connected to the output of an IF oscillator 626. The output of the IF oscillator 626, after a $\pi/2$ phase shift introduced by the $\pi/2$ phase shifter 628, may also be provided to the quadrature mixer 622. The other input of the quadrature mixer may be the analog version of the signal $y_{ik}$ present at the output of DAC 618b. The IF signal, after being filtered and amplified by the IF filter and amplifier block 630, may be up-converted to the RF signal $s_r(t)$ by the up-converter 632, where the other input of the up-converter 632 may be connected to the output of an RF oscillator 634. The RF signal may be amplified by the RF power amplifier 601, generating the signal $s_o(t)$ at the output. The amplifier output may be connected to a coupler 636, which may direct most of the signal power to the antenna with a small fraction of the power fed back to achieve the desired phase compensation and spectrum control.

The coupler output signal $s_{oc}(t)$ may be converted to the IF signal $s_{cI}(t)$ by the cascade of the RF-to-IF down converter 636 and the IF band pass filter 638. The IF band pass signal $s_{cI}(t)$ may be provided as input to the IF-to-baseband down converter 640. The IF-to-baseband down converter 640 may be comprised of an in-phase mixer 642, a quadrature mixer 644, low pass filters 646a, 646b, ADC's 648a, 648b, and a real-to-complex converter 650. The IF signal may be provided as input to the pair of mixers 640, 642, which may generate the in-phase and quadrature baseband signals at their outputs. The in-phase and quadrature baseband signals, after being filtered by the low pass filters 646a, 646b, may be converted in to digital baseband signals by the ADC's 648a, 648b. The digital in-phase and quadrature baseband signals may be combined to form the complex baseband signal $z_{ck}$ by the real to complex converter 650.

The complex baseband signal $z_{ck}$ may be multiplied by the gain $c_o$ (652) at 654 to generate the complex signal $z_k$ that may be input to the adaptive spectrum control system 604. The gain $c_o$ may be selected equal to the inverse of the product of $A_{oN}$, appearing in (4) and the feedback gain between the sampled complex baseband envelope of $s_o(t)$ at the amplifier output and the complex signal $z_{ck}$. The signal $z_k$ may be provided as input to the adaptive spectrum control system 604.

The AM-AM compensation synthesizer and the AM-AM compensator of FIG. 6 may be similar to those in [5]. The complex baseband signal $z_{ck}$ may also be input to the AM-PM compensation synthesizer 612, where the signal $z_{ck}$ may be divided by its absolute value to generate the signal $z_{pk} = z_{ck}/|z_{ck}| = \exp\{j\theta_c\}$, where $\theta_c$ is the phase of $z_{ck}$. The compensated signal $y_{ck}$ may also be fed back to the AM-PM synthesizer block 612, where it may be delayed at 565 by a time equal to the round trip delay between the input $y_{ck}$ to the gain multiplier by $c_i$ and the output $z_{ck}$ of the IF to baseband down converter. The delayed equalized signal $y_{ek}$ may be conjugated at 658 and divided by its norm at 660 to generate $y^*_{pk} = y^*_{ek}/|y_{ek}| = \exp\{-j\theta_y\}$, where $\theta_y$ is the phase of $y_{ek}$. The two signals $z_{pk}$ and $y^*_{pk}$ may be multiplied in the phase comparator 662, generating the signal $\exp\{j(\theta_c - \theta_y)\}$. The imaginary part of the phase comparator 662 output, equal to $\sin(\theta_{e,k})$, may be input to an adaptive phase estimator 664, which may generate the required phase estimate $\hat{\theta}_k$, for example, based on a polynomial approximation to the phase distortion introduced by the nonlinear system as a function of the magnitude $B_k$ of the AM-AM compensator output signal $y_k$. The phase estimate $\hat{\theta}_k$ may be given by a polynomial r( ) of $B_k$ of degree $n_r$ as $$\hat{\theta}_k = \hat{r}_{o,k} + \hat{r}_{1,k} B_k + \ldots + \hat{r}_{n_r,k} B_k^{n_r}; \; k=1,2,\ldots \quad (58)$$

$$\hat{r}_{m,k} = \hat{r}_{m,k-1} + \|\mu_\theta B_{k-1}^m \sin(\theta_{e,k-1}); \; m=0,1, \ldots, n_r; \\ k=1,2 \ldots \quad (59)$$

with some appropriate estimate for $\hat{r}_{m,0}$; $m=0,1,\ldots,n_r$ and with $\mu_\theta$ selected to be some sufficiently small positive scalar for convergence. The phase estimator output $\hat{\theta}_k$ may be provided as input to the complex exponential operator 666, which may generate a phase compensation signal $\exp\{-j\hat{\theta}_k\}$ at its output. The phase compensation signal $\exp\{-j\hat{\theta}_k\}$ may be provided as input to the AM-PM compensator 610, which may subtracts $\hat{\theta}_k$ from the phase of the input signal $y_k$.

Figure 7:
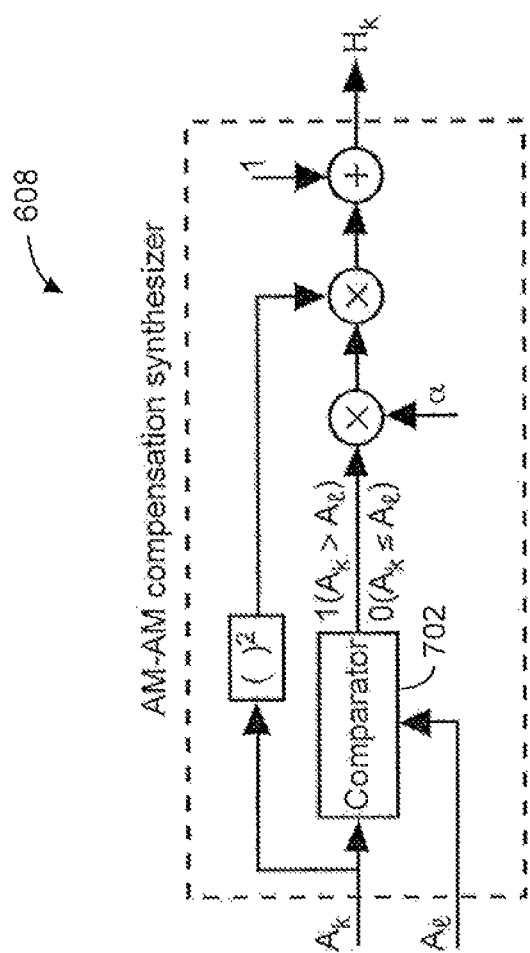
FIG. 7 shows the block diagram of one embodiment of the AM-AM compensation synthesizer of FIG. 6.

FIG. 7 shows the block diagram of one embodiment of the AM-AM compensation synthesizer 608 of FIG. 6. A comparator 702 may be provided with input comprising $A_k = |x_k|$ and a threshold $A_1$, where $A_1$ is the amplitude such that the amplitude transfer characteristic function of the nonlinear system is nearly linear over the range 0 to $A_1$. If $A_k \le A_1$, then the output of the comparator 702 may be 0, and thus the output ($H_k$) of the AM-AM compensation synthesizer 608 may be equal to 1. If $A_k > A_1$, then the output of the comparator 702 may be 1 and thus the output ( ) of the AM-AM compensation synthesizer 608 may be $H_k = (1 + \alpha A_k^2)$, where $\alpha$ may be an appropriately selected constant. Thus the magnitude of the AM-AM compensator output $y_k$ in FIG. 6 may be given by:

$$|y_k| = B_k = \begin{cases} A_k + \alpha A_k^3; & A_k > A_1 \\ A_k; & A_k \leq A_1 \end{cases} \quad (60)$$

In FIG. 7 $\alpha \approx 0.1$ if the gain $c_i$ is selected so that the small signal (linear) gain of the nonlinear system from $y_k$ to the real envelope of the RF power amplifier output normalized by $A_{oN}$ is equal to 1. Otherwise $A_k$ and $A_1$ may be normalized by an appropriate constant before being provided as input the AM-AM compensation synthesizer 608, or equivalently a may be appropriately scaled. In an alternative embodiment, the AM-AM compensation synthesizer 608 may be designed on the basis of an inverse function approach.

Referring back to FIG. 6, the complex valued output of the adaptive filter 606 may be expressed as:

$$x_k = x_{I,k} + j x_{Q,k}; \; j = \sqrt{-1} \quad (61)$$

Where $x_{I,k}$ and $x_{Q,k}$ denote the outputs of the in-phase and quadrature adaptive filters, respectively. The transformed output of the nonlinear system 603 may be given by:

$$z_k = \frac{g_0(A_k)}{A_k} x_k = \frac{g_0(A_k)}{A_k} [x_{I,k} + j x_{Q,k}] \equiv z_{I,k} + j z_{Q,k} \quad (62)$$

where $A_k$ is the magnitude of $x_k$ with:

$$A_k = [x_{I,k}^2 + x_{Q,k}^2]^{1/2} \quad (63)$$

The in-phase signal $x_{I,k}$ and quadrature signals $x_{Q,k}$ in (61) may be expressed in terms of the input signals $u_{I,k+L}$ and $u_{Q,k+L}$ and are given by:

$$x_{I,k} = \sum_{i=-L}^{L} \beta_i u_{I,k-i} \quad (64a)$$

$$x_{Q,k} = \sum_{i=-L}^{L} \beta_i u_{Q,k-i} \quad (64b)$$

In (64a) and (64b) $u_{I,k}$ and $u_{Q,k}$ respectively denote the in-phase and quadrature signals at the inputs of the respective adaptive in-phase and quadrature filters and it is assumed that both the filters have the same set of coefficients $\{\beta_i\}$ due to the symmetry. The procedure can be appropriately modified when the two filters have different sets of coefficients. The adaptive filter coefficients may be obtained by the optimization of the following function $\theta_1$ given by $$J_1 = J_{1,I} + J_{1,Q} = \sum_k J_{1,k} \quad (65)$$

$$J_{1,I} = \sum_k [\kappa v_{I,k} - z_{I,k}]^2 \quad (66a)$$

$$J_{1,Q} = \sum_k [\kappa v_{Q,k} - z_{Q,k}]^2 \quad (66b)$$

In (65) $\theta_{1,k}$ denotes the sum of the $k^{th}$ terms in the summations in (66a) and the $k^{th}$ term in (66b) and in (66), $v_{I,k}$ and $v_{Q,k}$ respectively denote the outputs of the reference square root raised cosine filters with their respective inputs equal to $u_{I,k}$ and $u_{Q,k}$ similar to that specified by (8).

Now:

$$\frac{\partial}{\partial \beta_i} \left[ \frac{g_0(A_k)}{A_k} \right] = \frac{A_k g_0'(A_k) - g_0(A_k)}{A_k^2} \frac{\partial A_k}{\partial \beta_i} \quad (67)$$

From the definition of $A_k$ in (63) one obtains:

$$\frac{\partial A_k}{\partial \beta_i} = \frac{1}{A_k} \left[ x_{I,k} \frac{\partial x_{I,k}}{\partial \beta_i} + x_{Q,k} \frac{\partial x_{Q,k}}{\partial \beta_i} \right] \quad (68)$$

Furthermore it may follow from (64a) and (64b) that:

$$\frac{\partial x_{I,k}}{\partial \beta_i} = u_{I,k-i}; \; \frac{\partial x_{Q,k}}{\partial \beta_i} = u_{Q,k-i} \quad (69)$$

From (67)-(69) one obtains:

$$\frac{\partial}{\partial \beta_i} \left[ \frac{g_0(A_k)}{A_k} \right] = \frac{A_k g_0'(A_k) - g_0(A_k)}{A_k^3} [x_{I,k} u_{I,k-i} + x_{Q,k} u_{Q,k-i}] \quad (70)$$

From (66a) it follows that:

$$\frac{\partial J_{1,I}}{\partial \beta_i} = -2 \sum_k e_{I,k} \frac{\partial z_{I,k}}{\partial \beta_i}; \; e_{I,k} = \kappa v_{I,k} - z_{I,k} \quad (71)$$

From the definition of $z_{1,k}$ in (62), and equations (69) and (70) one obtains the derivative of $\theta_{1,1}$ with respect to $\beta_i$ as:

$$\frac{\partial J_{1,I}}{\partial \beta_i} = -2 \sum_k \left\{ \frac{A_k g_0'(A_k) - g_0(A_k)}{A_k^3} [x_{I,k} u_{I,k-i} + x_{Q,k} u_{Q,k-i}] x_{I,k} + \frac{g_0(A_k)}{A_k} u_{I,k-i} \right\} e_{I,k} \quad (72)$$

Similarly:

$$\frac{\partial J_{1,Q}}{\partial \beta_i} = -2 \sum_k e_{Q,k} \frac{\partial z_{Q,k}}{\partial \beta_i}; \; e_{Q,k} = \kappa v_{Q,k} - z_{Q,k} \quad (73)$$

$$\frac{\partial J_{1,Q}}{\partial \beta_i} = -2 \sum_k \left\{ \frac{A_k g_0'(A_k) - g_0(A_k)}{A_k^3} [x_{I,k} u_{I,k-i} + x_{Q,k} u_{Q,k-i}] x_{Q,k} + \frac{g_0(A_k)}{A_k} u_{Q,k-i} \right\} e_{Q,k} \quad (74)$$

From (65), (72) and (74) one obtains the derivative of the objective function $\theta_1$ with respect to $\beta_i$ as:

$$\frac{\partial J_1}{\partial \beta_i} = \sum_k \frac{\partial J_{1,k}}{\partial \beta_i} = \quad (75)$$

-continued $$-2\sum_k \left\{ \begin{array}{l} \frac{A_k g_0'(A_k) - g_0(A_k)}{A_k^3}[x_{I,k}u_{I,k-i} + x_{Q,k}u_{Q,k-i}][x_{I,k}e_{I,k} + \\ x_{Q,k}e_{Q,k}] + \frac{g_0(A_k)}{A_k}[u_{I,k-i}e_{I,k} + u_{Q,k-i}e_{Q,k}] \end{array} \right\}$$

If for any k, the amplitude of the signal at the amplifier input $A_k$ is zero (or relatively small) then $g(A_k)/A_k=1$ and the expression for $\theta_{1,k}$ reduces to the following expression resulting from (62)-(66):

$$J_{1,k} = \left[\kappa v_{I,k} - \sum_{i=-L}^{L} \beta_i u_{I,k-i}\right]^2 + \left[\kappa v_{Q,k} - \sum_{i=-L}^{L} \beta_i u_{Q,k-i}\right]^2 \quad (76)$$

The derivative of $\theta_{1,k}$ with respect to $\beta_i$ in (76) yields:

$$\frac{\partial J_{1,k}}{\partial \beta_i} = -2[u_{I,k-i}e_{I,k} + u_{Q,k-i}e_{Q,k}]; \quad (77)$$

$$e_{I,k} = \kappa v_{I,k} - x_{I,k}; \quad e_{Q,k} = \kappa v_{Q,k} - x_{Q,k}$$

Figure 8A:
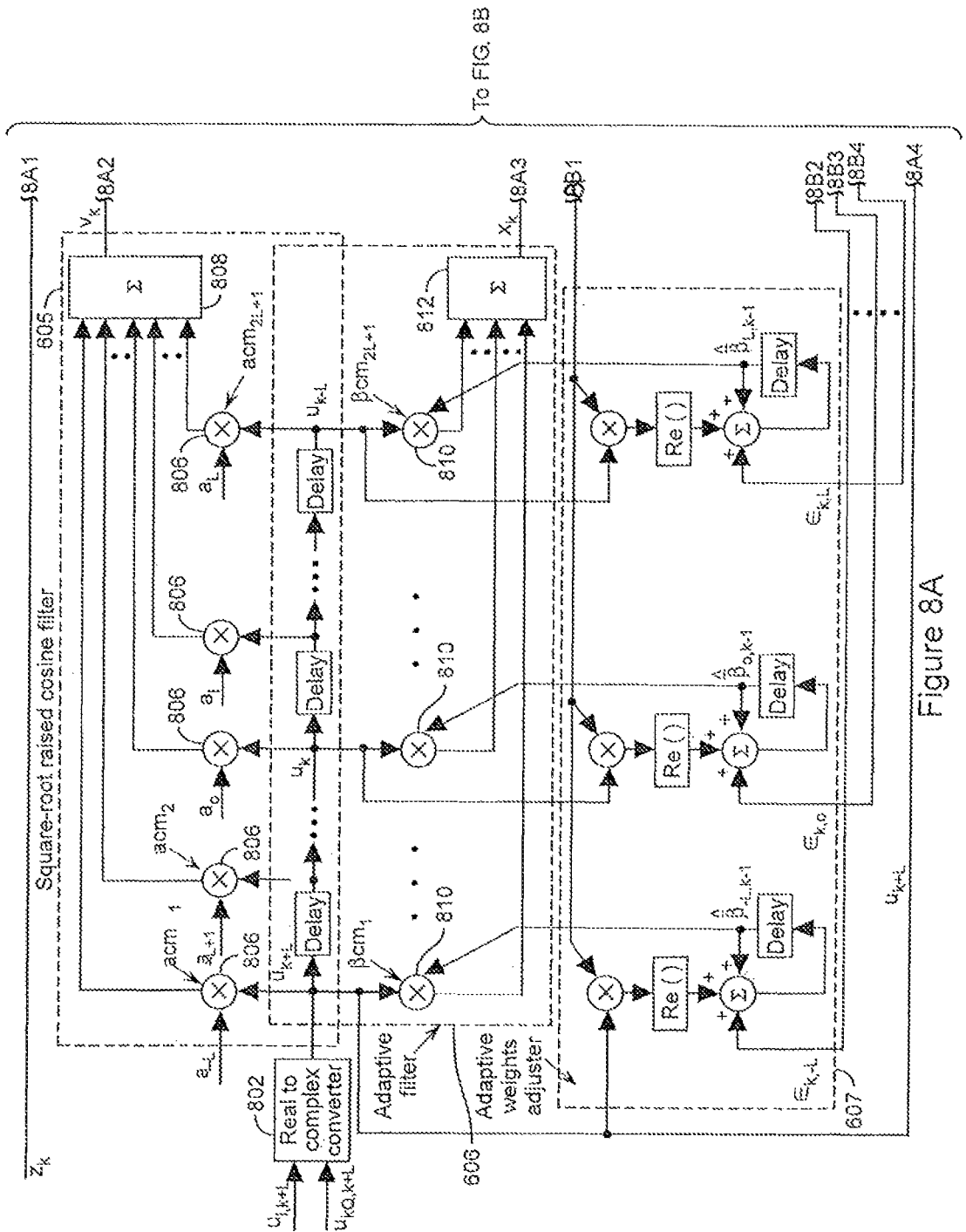
FIG. 8A shows a first portion of a block diagram of one embodiment of the adaptive spectrum controller of FIG. 6.
Figure 8B:
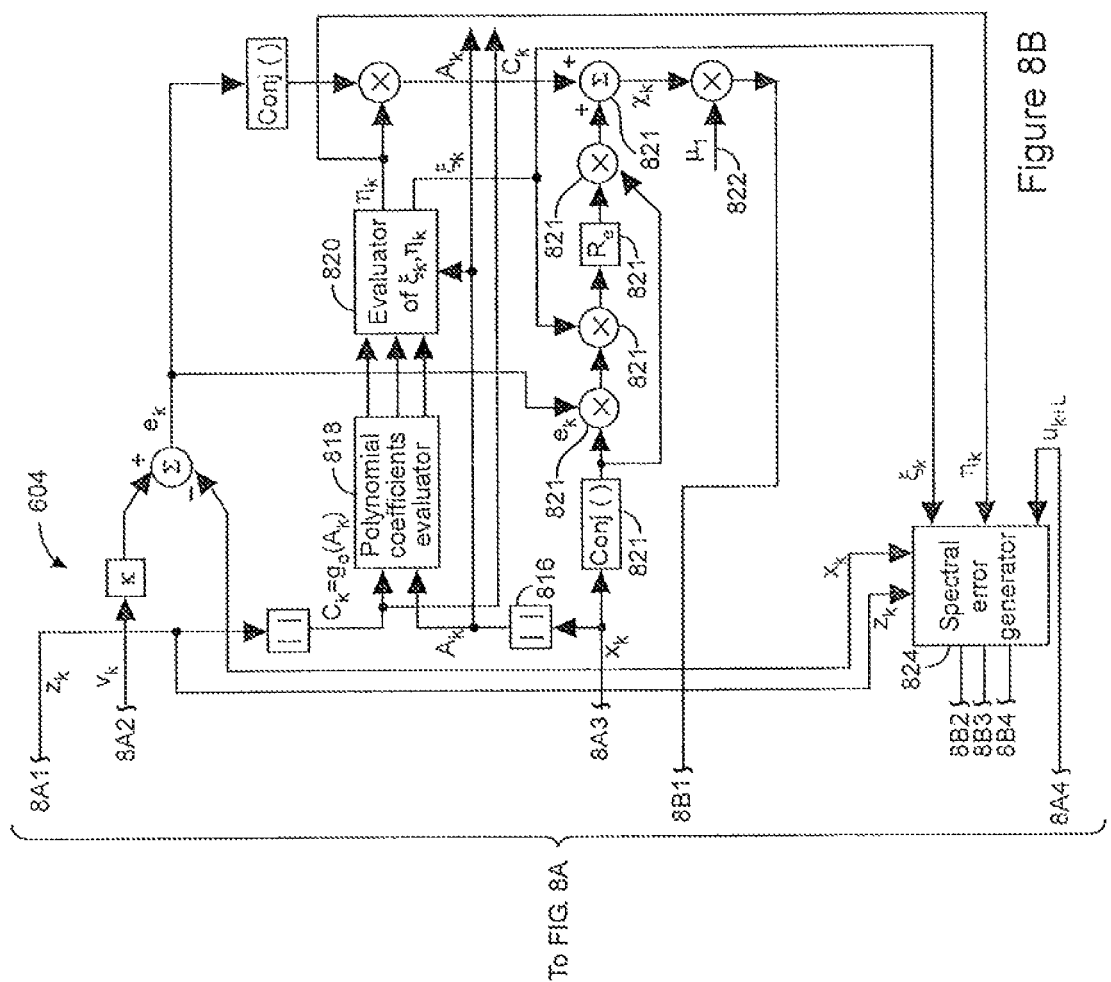
FIG. 8B shows a second portion of the block diagram of FIG. 8A.

FIG. 8 shows a block diagram of one embodiment of the adaptive spectrum control system 604 of FIG. 6. As shown in FIG. 8, the input signal $u_{k+L}$ that is complex valued at 802, may be provided as input to a cascade of 2L delay elements 804, providing the 2L delayed versions of $u_{k+L}$ denoted by $u_{k+L-1}, \ldots, u_k, \ldots, u_{k-L}$. Each delay element 804 for delaying the complex signal may comprise a pair of real delay elements one each for the real and imaginary parts of the complex signal. The input $u_{k+L}$, along with its various delayed versions, may be provided as input to (2L+1) a-coefficient multipliers 806 that may multiply the complex inputs $u_{k+L}, \ldots, u_k, \ldots, u_{k-L}$ by the real srrc filter coefficients respectively. The outputs of the various a-coefficient multipliers 806 are input an srrc summer 808, generating the srrc filter output $v_k$ at its output according to equation (8).

The input $u_{k+L}$ along with its various delay versions may also be provided as input to (2L+1) β-coefficient multipliers 810 that may multiply the complex inputs $u_{k+L}, \ldots, u_k, \ldots, u_{k-L}$ by the adaptive filter coefficients $\hat{\beta}_{-L} \ldots, \hat{\beta}_0, \ldots, \hat{\beta}_L$, respectively. The outputs of the various β-coefficient multipliers 810 may be provided as input at the adaptive filter summer 812, generating the adaptive filter output $x_k$ at its output. In some embodiments, the srrc filter 605 and the adaptive filter 606 may share the same 2L delay elements, however, in an alternative embodiment the srrc filter 605 and the adaptive filter 606 may have their own delay elements, thereby making the two filters distinct entities.

The adaptive algorithm to minimize may require evaluation of the derivative function $g'_o(\ )$ at the magnitude $A_k$ of the adaptive filter output $x_k$ in addition to $C_k=|z_k|=g_o(A_k)$. The absolute value of $z_k$ may be obtained directly as shown in FIG. 8 by the absolute value | | block 814 of the figure. Similarly the absolute value of $x_k$ may be obtained by another absolute value | | block 816. In order to evaluate the derivative $g'_o(A_k)$ the function $C_k=g_o(A_k)$ may be approximated by a polynomial of degree $n_b$, for example, in the range of 5 to 7. The polynomial may have nonzero coefficients corresponding to only the odd degree terms in the polynomial as $g_o(A_k)$ is an odd function of $A_k$. Thus:

$$C_k = g_o(A_k) \approx b_1 A_k + b_3 A_k^3 + \ldots + b_{n_b} A_k^{n_b} \quad (78)$$

The adaptive algorithm to estimate the coefficients $b_1, b_3, \ldots, b_{n_b}$ from $A_k$ and $C_k$ may be given by:

$$\hat{b}_{i,k} = \hat{b}_{i,k-1} + \mu_p A_k^i e_{p,k}; \quad (79)$$

$$e_{p,k} = C_k - \sum_{\substack{m=1 \\ m:\ odd}}^{n_b} \hat{b}_{m,k-1} A_k^m;$$

$$m = 1, 3, \ldots, n_b;$$

$$k = 1, 2, \ldots$$

where $\mu_p$ is some sufficiently small positive number. The initial estimates for the polynomial coefficients may be taken as $\hat{b}_{1,0}=1$; $\hat{b}_{i,0}=0, i>1$. Alternatively the initial estimates may be selected on the basis of an a-priori knowledge of the function $g_o(A_k)$ or $g(A_k)$. The polynomial b( ) coefficient evaluator block 818 may evaluate the coefficients $b_1, b_3, \ldots, b_{ab}$ according to (79) and may provide the coefficients as input to the evaluator of $\xi_k$ and $\eta_k$ block 820, which may evaluate $\xi_k$ and $\eta_k$, for example, according to the following equation (80):

$$\xi_k = \begin{cases} \frac{A_k g_0'(A_k) - g_0(A_k)}{A_k^3}; & A_k > 0 \\ 0; & A_k = 0 \end{cases} \quad (80a)$$

$$\eta_k = \begin{cases} \frac{g_0(A_k)}{A_k}; & A_k > 0 \\ 1; & A_k = 0 \end{cases} \quad (80b)$$

In order to evaluate the derivative $$\frac{\partial J_{1,k}}{\partial \beta_i}$$

in (75), the expression in (75) may be rewritten as:

$$\frac{\partial J_{1k}}{\partial \beta_i} = -2\xi_k \text{Re}\{x_k^* e_k\} \cdot \text{Re}\{x_k^* u_{k-i}\} - 2\eta_k \text{Re}\{e_k^* u_{k-i}\} \quad (81)$$

$$= -2\text{Re}\{[\text{Re}\{\xi_k x_k^* e_k\}x_k^* + \eta_k e_k^*]u_{k-i}\}$$

$$= -2\text{Re}\{\chi_k u_{k-i}\}$$

where $$\chi_k \equiv \text{Re}\{\xi_k x_k^* e_k\}x_k^* + \eta_k e_k^* \quad (82a)$$

$$e_k = e_{I,k} + je_{Q,k}; j = \sqrt{-1} \quad (82b)$$

The pre gradient evaluator block 821 may evaluate $\chi_k$ according to (82a) above and, after being multiplied by a positive scalar $\mu_1$ at 822, is input to the adaptive weights adjustor 607.

Referring to FIG. 8, the input $u_{k+L}$ and the signals $z_k, x_k, \xi_k$ and $\eta_k$ may be input to a spectral error generator block 824. The spectral error generator block 824 may generate signals $\epsilon_{k,-L}, \ldots, \epsilon_0, \ldots \epsilon_{k,L}$ derived on the basis of the optimization of the amplifier output spectrum at the selected sets of frequencies. The adaptive weights block 607 may adjust the adaptive filter coefficients $\hat{\beta}_{-L,k}, \ldots, \hat{\beta}_{0,k}, \ldots, \hat{\beta}_{L,k}$ according to the following adaptive algorithm:

$$\hat{\beta}_{i,k} = \hat{\beta}_{i,k-1} + \mu_1 Re\{\chi_k u_{k-i}\} + \epsilon_{k,i}; \; i = -L, \ldots, 0, \ldots, L; \\ k = 1, 2, \ldots \quad (83)$$

where $\mu_1$ is some sufficiently small positive scalar so that the algorithm in (83) is convergent.

In embodiments of the spectrum control systems described herein that utilize QPSK or more general QAM/MPSK modulation, a weighted sum of the power spectral densities evaluated at a number of selected frequencies in the filter stop band is minimized (e.g., so as to minimize the out of band spectral growth of the signal due to the amplifier nonlinearity). Differentiation of (62) with respect to $\beta_i$ may yield:

$$\frac{\partial z_k}{\partial \beta_i} = \frac{\partial}{\partial \beta_i}\left[\frac{g_0(A_k)}{A_k} x_{I,k}\right] + j\frac{\partial}{\partial \beta_i}\left[\frac{g_0(A_k)}{A_k} x_{Q,k}\right] \quad (84a)$$

The expression in (84a) may be evaluated to obtain:

$$\frac{\partial z_k}{\partial \beta_i} = \frac{\partial}{\partial \beta_i}\left[\frac{g_0(A_k)}{A_k}\right] \cdot [x_{I,k} + jx_{Q,k}] + \frac{g_0(A_k)}{A_k}\left[\frac{\partial x_{I,k}}{\partial \beta_i} + j\frac{\partial x_{Q,k}}{\partial \beta_i}\right] \quad (84b)$$

From (70) and (80) one may further evaluate the derivative of $z_k$ as:

$$\frac{\partial z_k}{\partial \beta_i} = \xi_k [x_{I,k} u_{I,k-i} + x_{Q,k} u_{Q,k-i}] \cdot [x_{I,k} + jx_{Q,k}] + \eta_k [u_{I,k-i} + j u_{Q,k-i}] \quad (85)$$

Grouping the terms containing $u_{I,k-i}$ and $u_{Q,-i}$ in (85) one may obtain:

$$\frac{\partial z_k}{\partial \beta_i} = \quad (86)$$
$$\{\xi_k x_{I,k}[x_{I,k} + jx_{Q,k}] + \eta_k\} u_{I,k-i} + \{\xi_k x_{Q,k}[x_{I,k} + jx_{Q,k}] + j\eta_k\} u_{Q,k-i}$$

Equation (86) may further be rewritten as:

$$\frac{\partial z_k}{\partial \beta_i} = \quad (87)$$
$$\{(\xi_k x_{I,k}^2 + \eta_k) + j\xi_k x_{I,k} x_{Q,k}\} u_{I,k-i} + \{\xi_k x_{I,k} x_{Q,k} + j(\xi_k x_{Q,k}^2 + \eta_k)\} u_{Q,k-i}$$

For notational convenience (87) may be rewritten as:

$$\frac{\partial z_k}{\partial \beta_i} = p_k u_{I,k-i} + q_k u_{Q,k-i} \quad (88)$$

$$p_k = (\xi_k x_{I,k}^2 + \eta_k) + j\xi_k x_{I,k} x_{Q,k}; \quad (89)$$
$$q_k = \xi_k x_{I,k} x_{Q,k} + j(\xi_k x_{Q,k}^2 + \eta_k)$$

The signals $\xi_k$ and $\eta_k$ appearing in (89) have been defined in (80).

As for the case of BPSK/PAM modulation, the N-point DFT of the amplifier output $z_k$ may be evaluated at a number $M_s$ of selected frequencies $f_m = m f_r = m f_s/N$ in the filter stop band with the set of indices $m$ denoted by $M_s$. The N-point DFT of the amplifier output at the $m^{th}$ frequency in the set of selected frequencies in the filter stop band may be given by:

$$Z_{m,k} = w_{m,0}^s z_k + w_{m,1}^s z_{k-1} + \ldots + w_{m,N-1}^s z_{k-N+1}; \\ m = 1, 2, \ldots, M_s \quad (90)$$

with $w_{m,i}^s$ given by (29). From (88) and (90), the derivative of $Z_{m,k}$ with respect to $\beta_i$ is given by $$\frac{\partial Z_{m,k}}{\partial \beta_i} = \sum_{\iota=0}^{N-1} w_{m,\iota}^s \frac{\partial z_{k-\iota}}{\partial \beta_i} \quad (91)$$
$$= \sum_{\iota=0}^{N-1} w_{m,\iota}^s p_{k-\iota} u_{I,k-i-\iota} + \sum_{\iota=0}^{N-1} w_{m,\iota}^s q_{k-\iota} u_{Q,k-i-\iota}$$

With $\bar{\beta} = [\beta_{-L}, \ldots, \beta_0, \ldots \beta_L]^T$, (91) may be rewritten in the following matrix vector form:

$$\frac{\partial Z_{m,k}}{\partial \bar{\beta}} = \begin{bmatrix} u_{I,k+L} & u_{I,k+L-1} & \cdots & u_{I,k+L-N+1} \\ \vdots & \vdots & \vdots & \vdots \\ u_{I,k} & u_{I,k-1} & \cdots & u_{I,k-N+1} \\ \vdots & \vdots & \vdots & \vdots \\ u_{I,k-L} & u_{I,k-L-1} & \cdots & u_{I,k-L-N+1} \end{bmatrix} \begin{bmatrix} w_{m,0}^s p_k \\ w_{m,1}^s p_{k-1} \\ \vdots \\ w_{m,N-1}^s p_{k-N+1} \end{bmatrix} + \quad (92)$$

$$\begin{bmatrix} u_{Q,k+L} & u_{Q,k+L-1} & \cdots & u_{Q,k+L-N+1} \\ \vdots & \vdots & \vdots & \vdots \\ u_{Q,k} & u_{Q,k-1} & \cdots & u_{Q,k-N+1} \\ \vdots & \vdots & \vdots & \vdots \\ u_{Q,k-L} & u_{Q,k-L-1} & \cdots & u_{Q,k-L-N+1} \end{bmatrix} \begin{bmatrix} w_{m,0}^s q_k \\ w_{m,1}^s q_{k-1} \\ \vdots \\ w_{m,N-1}^s q_{k-N+1} \end{bmatrix}$$

With $Z_k$ denoting the $M_s$ vector defined in (36), then the gradient of $Z_k$ with respect to the parameter vector may be written in the following compact form:

$$\frac{\partial Z_k^T}{\partial \bar{\beta}} = \bar{U}_{I,k} P_k W_s + \bar{U}_{Q,k} Q_k W_s \quad (93)$$

where $$\bar{U}_{I,k} = \begin{bmatrix} u_{I,k+L} & u_{I,k+L-1} & \cdots & u_{I,k+L-N+1} \\ \vdots & \vdots & \vdots & \vdots \\ u_{I,k} & u_{I,k-1} & \cdots & u_{I,k-N+1} \\ \vdots & \vdots & \vdots & \vdots \\ u_{I,k-L} & u_{I,k-L-1} & \cdots & u_{I,k-L-N+1} \end{bmatrix} \quad (94a)$$

$$\bar{U}_{Q,k} = \begin{bmatrix} u_{Q,k+L} & u_{Q,k+L-1} & \cdots & u_{Q,k+L-N+1} \\ \vdots & \vdots & \vdots & \vdots \\ u_{Q,k} & u_{Q,k-1} & \cdots & u_{Q,k-N+1} \\ \vdots & \vdots & \vdots & \vdots \\ u_{Q,k-L} & u_{Q,k-L-1} & \cdots & u_{Q,k-L-N+1} \end{bmatrix} \quad (94b)$$

$$P_k = \begin{bmatrix} p_k & 0 & \cdots & 0 \\ 0 & p_{k-1} & \cdots & 0 \\ \vdots & \vdots & \vdots & \vdots \\ 0 & 0 & \cdots & p_{k-N+1} \end{bmatrix}; \quad (94c)$$

$$Q_k = \begin{bmatrix} q_k & 0 & \cdots & 0 \\ 0 & q_{k-1} & \cdots & 0 \\ \vdots & \vdots & \vdots & \vdots \\ 0 & 0 & \cdots & q_{k-N+1} \end{bmatrix}$$

and $W_s$ is the matrix in (38c). With the objective function $\theta_2$ defined in (30) and for the case of $\gamma_m^s=1$ for all m, the gradient of $\theta_2$ with respect to the parameter vector $\bar{\beta}$ is given by (39) which after substitution from (93) may be rewritten as:

$$\frac{\partial J_2}{\partial \bar{\beta}} = 2\left(\frac{2T_s}{N}\right)\sum_k \mathrm{Re}\{[\overline{U}_{I,k}P_k + \overline{U}_{Q,k}Q_k]W_s Z_k^*\} \quad (95)$$

For the case of unequal $\gamma_m$, the gradient in (95) is modeled as:

$$\frac{\partial J_2}{\partial \bar{\beta}} = 2\left(\frac{2T_s}{N}\right)\sum_k \mathrm{Re}\{[\overline{U}_{I,k}P_k + \overline{U}_{Q,k}Q_k]W_s \Xi_s Z_k^*\} \quad (96)$$

where $\Xi_s$ is the diagonal matrix with its diagonal elements equal to $\gamma_m^s$ as given in (42). The vector $Z_k$ may be related to the amplifier output $z_k$ by $$Z_k = W_s^T \bar{z}_k;\ \bar{z}_k = [z_k\ z_{k-1} \ldots z_{k-N+1}]^T \quad (97)$$

With the application of (73) the gradient vector may be written in the following alternative form $$\frac{\partial J_2}{\partial \bar{\beta}} = \quad (98)$$

$$\sum_k \frac{\partial J_{2,k}}{\partial \bar{\beta}} = 2\left(\frac{2T_s}{N}\right)\sum_k \mathrm{Re}\{[\overline{U}_{I,k}P_k + \overline{U}_{Q,k}Q_k]S_s \bar{z}_k^*\} \equiv 2\sum_k \mathrm{Re}\{\bar{\chi}_k^s\};$$

$$S_s = W_s \Xi_s (W_s^T)^*$$

Figure 9A:
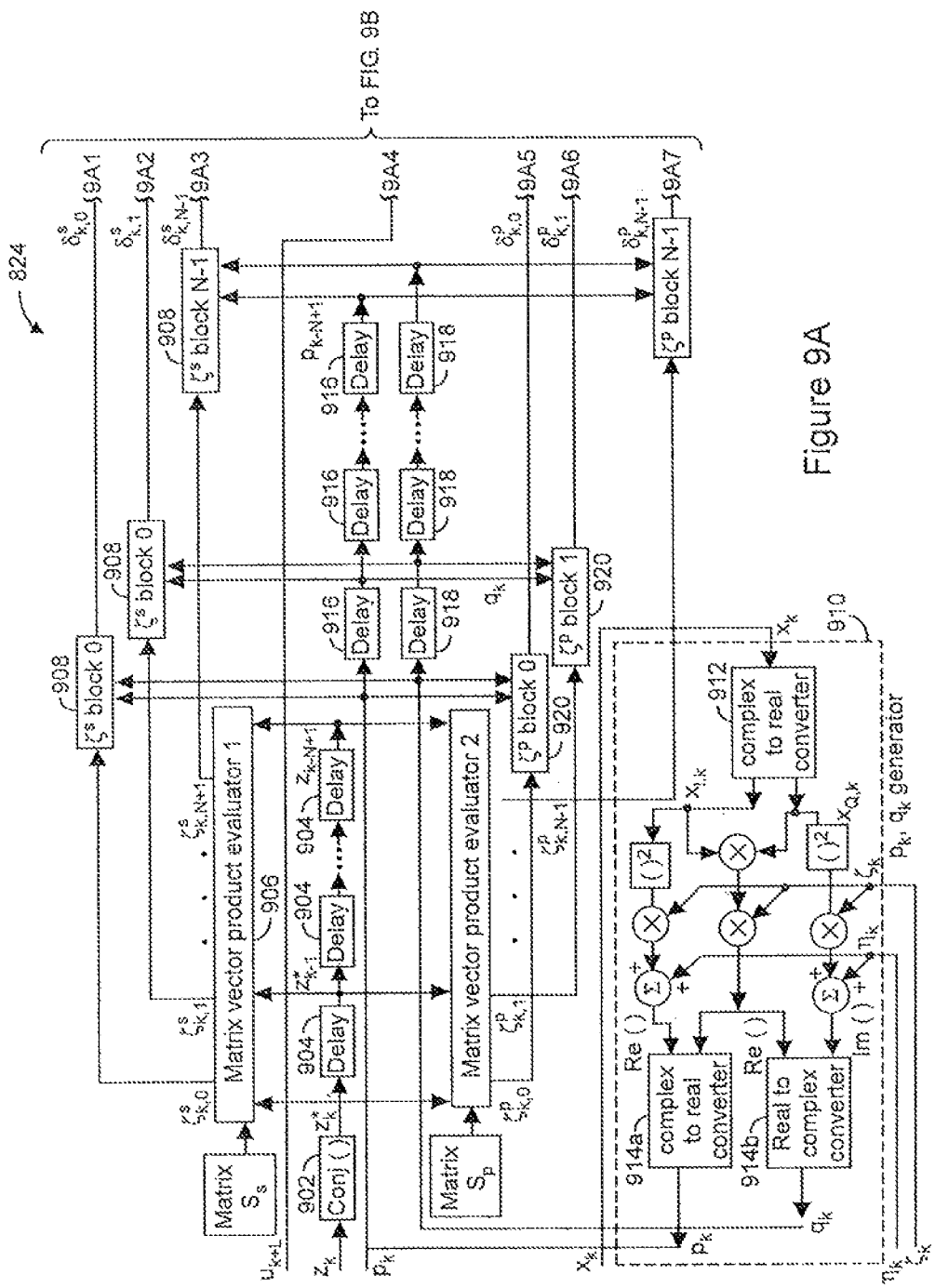
FIG. 9A shows a first portion of a block diagram of one embodiment of the spectral error generator of FIG. 8 configured to generate the error signals $\epsilon_{k,-L}, \ldots, \epsilon_0, \ldots \epsilon_{k,L}$.
Figure 9B:
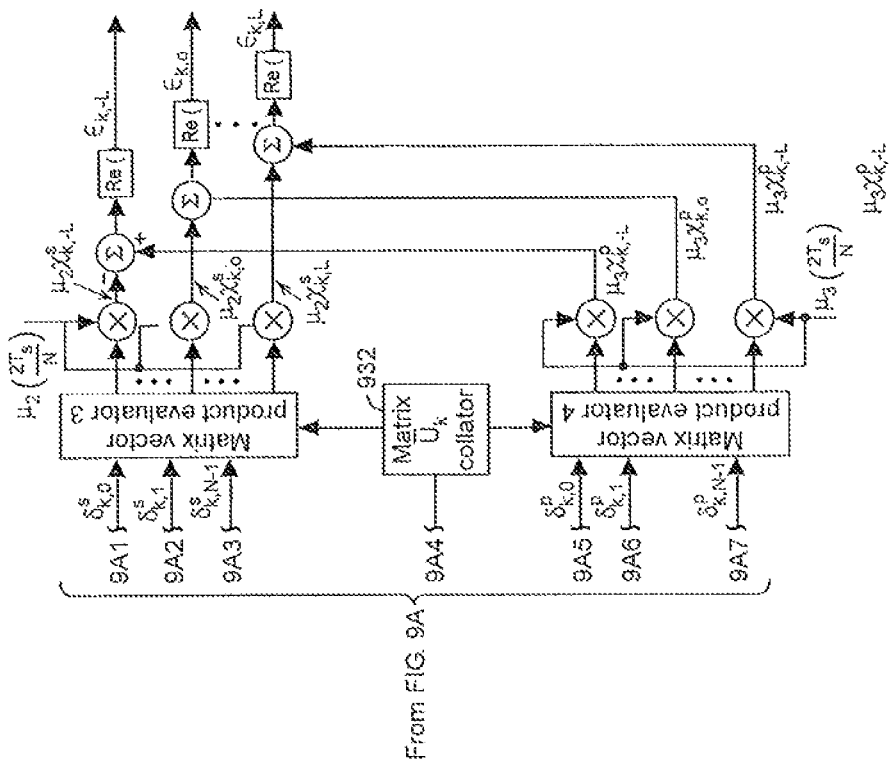
FIG. 9B shows a second portion of the block diagram of FIG. 9A.

FIG. 9 shows a block diagram of one embodiment of the spectral error generator 824 configured to generate the error signals $\epsilon_{k,-L}, \ldots, \epsilon_0, \ldots \epsilon_{k,L}$. For example, the error signals $\epsilon_{k,-L}, \ldots, \epsilon_0, \ldots \epsilon_{k,L}$ may be equal to ½ times the derivative $$\frac{\partial J_{2,k}}{\partial \bar{\beta}}$$

in equation (98) so as to minimize the weighted sum of the power spectral densities at a set of selected frequencies in the filter stop band at the output of the nonlinear system. As shown in FIG. 9, the transformed amplifier output $z_k$ may be conjugated at 902 to obtain the conjugate output $z^*_k$. The conjugate output $z^*_k$ may be provided as input to a cascade of (N−1) delay elements 904, providing the (N−1) delayed versions $z^*_{k-1}, \ldots, z^*_{k-N+1}$. The conjugate output $z^*_k$ and its various delayed versions along with the matrix $S_s$ may be provided as input to a matrix vector evaluator 906, which may output the N elements of the vector $S_s z^*_k$. The N elements of the vector $S_s z^*_k$ may, in turn, be provided as input to $\zeta^s$ blocks 908 (e.g., $\zeta^s$ block 0 to $\zeta^s$ block N−1), respectively. As may be observed from FIG. 9, the adaptive filter output $x_k$ and the signals $\xi_k$ and $\eta_k$ (generated as described above with respect to FIG. 8) may be input to a $p_k$, $q_k$ generator block 910. In the $p_k$, $q_k$ generator block 910, $x_k$ may be provided as input to a complex-to-real converter block 912, which may provide the real and imaginary parts $x_{I,k}$ and $x_{Q,k}$ at its output. As shown in FIG. 9, $x_{I,k}$, $x_{Q,k}$, $\xi_k$ and $\eta_k$ may be processed in the $p_k$, $q_k$ generator block 910 to provide the real and imaginary parts of $p_k$ and $q_k$ according to equation (89) and are given by:

$$Re(p_k)=\xi_k x_{I,k}^2 + \eta_k;\ Im(p_k)=\xi_k x_{I,k}x_{Q,k}$$

$$Re(q_k)=\xi_k x_{I,k}x_{Q,k};\ Im(q_k)=\xi_k x_{Q,k}^2 + \eta_k \quad (99)$$

Real-to-complex converters 914a, 914b may combine the real and imaginary parts of $p_k$ and $q_k$, respectively present at their inputs, and generate $p_k$ and $q_k$, respectively, at their outputs. Both $p_k$ and $q_k$ may be input to the two cascades of N−1 delay elements 916, 918 each that generate the various delayed versions of $p_k$ and $q_k$. The signals $p_k$ and $q_k$ and their various delayed versions $p_{k-1}, q_{k-1}, \ldots, p_{k-N+1}, q_{k-N+1}$ may be provided as input to the N $\zeta^s$ blocks 908. Evaluating $$\frac{\partial J_2}{\partial \bar{\beta}}$$

from (98), and with $\bar{\zeta}_k^s = S_s \bar{z}^*_k$, one obtains:

$$(2T_s/N)^{-1}\mathrm{Re}\{\bar{\chi}_k^s\} = \mathrm{Re}\{\overline{U}_{I,k}P_k\bar{\zeta}_k^s + \overline{U}_{Q,k}Q_k\bar{\zeta}_k^s\} \quad (100)$$

$$= \overline{U}_{I,k}\mathrm{Re}\{P_k\bar{\zeta}_k^s\} + \overline{U}_{Q,k}\mathrm{Re}\{Q_k\bar{\zeta}_k^s\}$$

$$= \mathrm{Re}\{(\overline{U}_{I,k} + j\overline{U}_{Q,k})[\mathrm{Re}\{P_k\bar{\zeta}_k^s\} - j\mathrm{Re}\{Q_k\bar{\zeta}_k^s\}]\}$$

$$= \mathrm{Re}\{(\overline{U}_{I,k} + j\overline{U}_{Q,k})\bar{\delta}_k^s\}$$

The equation (100) implicitly defines $\bar{\delta}_k^s$. The $P_k$ and $Q_k$ are diagonal matrices with their diagonal elements equal to $p_{k-i}$, $q_{k-i}$ respectively with i=0,1 ..., N−1. Thus the multiplication of $P_k$ and $\bar{\zeta}_k^s$ may be obtained by multiplying the N elements of the vector $\bar{\zeta}_k^s$ by $p_k, p_{k-1}, \ldots, p_{k-N+1}$ respectively with similar operation for obtaining the product of $Q_k$ and $\bar{\zeta}_k^s$. FIG. 10 shows a block diagram of one embodiment of a $\zeta$ block i, which may be either one of the $\zeta^s$ blocks 908 or one of the $\zeta^p$ blocks 920. As shown in FIG. 10, the block 908/920 may multiply the input $\zeta_{k,i}^s$ by $p_{k-i}$ and $q_{k-i}$ in multipliers 922, 924, respectively. The Re( ) operation (926a, 926b) may take the real part of the two products. The real part of $\zeta_{k,i}^s p_{k-i}$ and the negative of the real part of $\zeta_{k,i}^s q_{k-i}$ may both be input to the real-to-complex converter 928, with its output $\delta_{k,i}^s$ given by:

$$\delta_{k,i}^s = \{Re[\zeta_{k,i}^s p_{k-i}] - Re[\zeta_{k,i}^s q_{k-i}]\} \quad (101)$$

that is the $i^{th}$ element of the vector $\bar{\delta}_k^s$ in (100) for i=0,1, ..., N−1.

Referring back to FIG. 9, the N elements of the vector $\bar{\delta}_k^s$ may be provided as input to the matrix vector product evaluator 930, which may also be provided with the matrix $\overline{U}_k = \overline{U}_{I,k} + j\overline{U}_{Q,k}$; $j=\sqrt{-1}$, and the matrices $\overline{U}_{I,k}$ and $\overline{U}_{Q,k}$ given by (94a,b). The matrix $\overline{U}_k$ may be provided as inputted by the matrix $\overline{U}_k$ collator 932, which may arrange the complex valued symbols $u_{k+L}, \ldots, u_k, u_{k-L-N+1}$ in the form of the matrix $\overline{U}_k$ according to equation (94a) with the suffix I deleted from all the elements in (94a). The outputs of the matrix vector product evaluator 930 constituting the elements of the vector $\overline{U}_k \bar{\delta}_k^s$ in (100) may be multiplied by $\mu_2(2T_s/N)$ to provide the elements of the first component of the spectral error vector $\mu_2 \bar{\chi}_k^s$ with $\bar{\chi}_k^s$ given by (98) and (100) and where $\mu_2$ is some sufficiently small positive scalar selected so that the adaptive algorithm is convergent.

An adaptive algorithm to update the estimate of the parameter vector $\bar{\beta}$ so as to minimize $\theta_2$ may be given by:

$$\bar{\beta}_k = \bar{\beta}_{k-1} - \mu_2 \frac{\partial J_{2,k}}{\partial \bar{\beta}} = \bar{\beta}_{k-1} - \mu_2 \left(\frac{2T_s}{N}\right)\mathrm{Re}\{[\overline{U}_{I,k}P_k + \overline{U}_{Q,k}Q_k]S_s \bar{z}_k^*\}; \quad (102)$$

$$S_s = W_s \Xi_s (W_s^T)^*$$

$$= \bar{\beta}_{k-1} - \mu_2 \mathrm{Re}\{\bar{\chi}_k^s\}$$

In (102) $\mu_2$ may be some sufficiently small positive scalar selected so that the algorithm in (102) is convergent. In order to simultaneously minimize the filter error and the out of band spectral regrowth, a weighted sum of the indices $\theta_1$ and $\theta_2$ may be minimized, for example, as given by:

$$J = \lambda J_1 + (1-\lambda) J_2; \quad 0 < \lambda < 1 \tag{103}$$

The stochastic gradient algorithm to minimize the optimization function $\theta$ is given by:

$$\overline{\beta}_k = \overline{\beta}_{k-1} - \frac{\mu_1}{2}\frac{\partial J_{1,k}}{\partial \overline{\beta}} - \frac{\mu_2}{2}\frac{\partial J_{2,k}}{\partial \overline{\beta}}; \quad k = 0, 1, \ldots \tag{104}$$

Substitution for the stochastic gradient $\partial J_{1,k}/\partial \overline{\beta}$ from (81) and for the stochastic gradient $\partial J_{2,k}/\partial \overline{\beta}$ from (98) results in the following adaptive algorithm $$\overline{\beta}_k = \overline{\beta}_{k-1} + \mu_1 Re\{\overline{\chi}_k \overline{u}_k\} - \mu_2 Re\{\overline{\chi}_k^s\}; \quad \overline{u}_k = [u_{k+L}, \ldots, u_k, \ldots, u_{k-L}]^T \tag{105}$$

In order to avoid the possibility of the reduction in the power spectral density in the filter pass band as a result of the minimization of the out-of-band PSD, an additional optimization function $\theta_3$ similar to the function $\theta_2$ may be defined as:

$$J_3 = \left(\frac{2T_s}{N}\right)\sum_k \sum_{m \in M_p} \gamma_m^p |Z_{m,k}|^2 = \left(\frac{2T_s}{N}\right)\sum_k \sum_{m \in M_p} \gamma_m^p Z_{m,k} Z_{m,k}^* \tag{106}$$

In (106), the function $\sigma_3$ denotes the weighted sum of the amplifier output signal power spectral densities evaluated at a selected frequencies $\omega_m = 2\pi f_m = 2\pi m f_r$ in the filter pass band with the DFT resolution frequency $f_r = f_s/N$, $f_s$ being the sampling frequency. The set of selected indices m is denoted by $M_p$ with the size of the set equal to $M_p$. In the following the set of indices $M_p$ is denoted by $\{i_1^p, i_2^p, \ldots, i_{M_p}^p\}$. The derivation of the gradient of $\theta_3$ with respect to the parameter vector $\overline{\beta}$ is similar to that for $\theta_2$ in (90)-(98) except for the replacement of the matrix $W_s$ by $W_p$ $$W_p = \begin{bmatrix} w_{0,0}^p & w_{1,0}^p & \cdots & w_{M_p-1,0}^p \\ w_{0,1}^p & w_{1,1}^p & \cdots & w_{M_p-1,1}^p \\ \vdots & \vdots & \cdots & \vdots \\ w_{0,N-1}^p & w_{1,N-1}^p & \cdots & w_{M_p-1,N-1}^p \end{bmatrix}_{(N, M_p)} \tag{107}$$

with:

$$w_{m,i}^p = \exp[-j2\pi i_m^p i/N]; \quad j \equiv \sqrt{-1}; \quad i = 0, 1, \ldots N-1; \tag{108}$$
$$m = 1, 2, \ldots, M_p$$

The gradient of $\theta_3$ with respect to the parameter vector $\overline{\beta}$ is given by (98) with $W_s$ and $\Xi_s$ replaced by $W_p$ and $\Xi_p$ respectively where $\Xi_p$ denotes the diagonal matrix with its diagonal elements equal to the weights assigned to PSD of various frequency terms $f_m$ in the filter pass band appearing in the optimization function $\theta_3$ in (106) as:

$$\Xi_p = diag[\gamma_0^p \gamma_1^p \ldots \gamma_{M-1}^p] \tag{109}$$

Thus $$\frac{\partial J_3}{\partial \overline{\beta}} = \sum_k \frac{\partial J_{3,k}}{\partial \overline{\beta}} = 2\left(\frac{2T_s}{N}\right)\sum_k Re\{[\overline{U}_{I,k}P_k + \overline{U}_{Q,k}Q_k]S_p \overline{z}_k^*\}; \tag{110}$$
$$S_p = W_p \Xi_p (W_p^T)^*$$

FIG. 9 shows the spectral error generator of FIG. 8 that generates ½ times the derivative $$\frac{\partial J_{3,k}}{\partial \overline{\beta}}$$

given in equation (110) so as to maximize the weighted sum of the power spectral densities at a set of selected frequencies in the filter pass band at the output of the nonlinear system. As shown in FIG. 9, the conjugate output $z_k^*$ and its various delayed versions (as found by delay elements 904) along with the matrix $S_p$ may be provided as input to the matrix vector evaluator 940, which may output the N elements of the vector $S_p z_k^*$. The N elements of the vector $S_p z_k^*$ may be, in turn, provided as input to the $\zeta^p$ block 920 (e.g., $\zeta^p$ block 0 to $\zeta^p$ block N-1, respectively).

The signals $p_k$ and $q_k$ and their various delayed versions $p_{k-1}, q_{k-1}, \ldots, p_{k-N+1}, q_{k-N+1}$ may also be provided as input to the N $\zeta^p$ blocks 920. In order to evaluate $$\frac{\partial J_3}{\partial \overline{\beta}}$$

from (110), and with $\overline{\zeta}_k^p = S_p \overline{z}_k^*$, one obtains as for (100):

$$(2T_s/N)^{-1} Re\{\overline{\chi}_k^p\} = Re\{\overline{U}_{I,k} P_k \overline{\zeta}_k^p + \overline{U}_{Q,k} Q_k \overline{\zeta}_k^p\} Re\{(\overline{U}_{I,k} + jU_{Q,k})[Re\{P_k \overline{\zeta}_k^p\} - jRe\{Q_k \overline{\zeta}_k^p\}]\} \tag{111}$$
$$= Re\{(\overline{U}_{I,k} + j\overline{U}_{Q,k})\overline{\delta}_k^p\}$$

The $i^{th}$ element $\delta_{k,i}^p$ of the vector $\overline{\delta}_k^p$ may be obtained by the $i^{th}$ $\zeta^p$ block for $i=0,1,\ldots,N-1$. The operation of the $i^{th}$ $\zeta^p$ block is identical to that of the operation of the $i^{th}$ $\zeta^s$ block as shown in FIG. 10 with its output $\delta_{k,i}^p$ given by:

$$\delta_{k,i}^p = \{Re[\zeta_{k,i}^p p_{k-i}] - Re[\zeta_{k,i}^p q_{k-i}]\} \tag{112}$$

Referring to FIG. 9, the N elements of the vector $\overline{\delta}_k^p$ may be provided as input to a matrix vector product evaluator 942 which may also be provided with the matrix $\overline{U}_k$ (e.g., from the matrix $\overline{U}_k$ collator 932). The outputs of the matrix vector product evaluator 942, constituting the elements of the vector $\overline{U}_k \overline{\delta}_k^p$ in (111), may be multiplied by $\mu_3(2T_s/N)$ to provide the elements of the second component of the spectral error vector $\mu_3 \overline{\chi}_k^p$ where $\mu_3$ is some sufficiently small positive scalar selected so that the adaptive algorithm is convergent.

As shown in the FIG. 9, the elements of the first component of the spectral error vector $\mu_2 \overline{\chi}_k^s$ may be subtracted from the corresponding elements of the second component of the spectral error vector $\mu_3 \overline{\chi}_k^p$ at adders 944 to provide the difference error vector. The real parts of the elements of the difference error vector (at boxes 946) may provide the elements $\epsilon_{k,-L}, \ldots, \epsilon_{k,0}, \ldots \epsilon_{k,L}$ of the spectral error vector $\overline{\epsilon}_k$ which may be provided as input to the adaptive weights adjustor 607 of FIG. 8, where they may be added to the respective error signals $\mu_1 \chi_k u_{k-i}$; $i=-L, \ldots, 0, \ldots L$ to provide the composite error signal for the adaptive filter weights adjustment.

An example of an adaptive algorithm to minimize the optimization function $\theta$ while simultaneously maximizing the function $\theta_3$ and as implemented by the adaptive weights adjustor 607 may be given by:

$$\bar{\beta}_k = \bar{\beta}_{k-1} - \frac{1}{2}\mu_1 \frac{\partial J_{1,k}}{\partial \bar{\beta}} - \frac{1}{2}\mu_2 \frac{\partial J_{2,k}}{\partial \bar{\beta}} + \mu_3 \frac{1}{2}\frac{\partial J_{3,k}}{\partial \bar{\beta}}; \quad (113)$$

$$k = 0, 1, \ldots$$

The substitution for the various gradient terms in (113) yields the following adaptive algorithm:

$$\hat{\beta}_{i,k} = \hat{\beta}_{i,k-1} + \mu_1 \mathrm{Re}\{\chi_k u_{k-i}\} - \mu_2 \mathrm{Re}\{\chi^s_{k,i}\} + \mu_3 \mathrm{Re}\{\chi^p_{k,i}\} \quad (114)$$

$$= \hat{\beta}_{i,k-1} + \mu_1 \mathrm{Re}\{\chi_k u_{k-i}\} + \in_{k,i};$$

$$i = -L, \ldots, 0, \ldots L; k = 0, 1, \ldots$$

Where in (114) $\chi^s_{k,i}$ denotes the $i^{th}$ component of the vector $\bar{\chi}^s_k$, and $\chi^p_{k,i}$ denotes the $i^{th}$ component of the vector $\bar{\chi}^p_k$ given by:

$$\bar{\chi}^s_k = \left(\frac{2T_s}{N}\right)[\bar{U}_{I,k}P_k + \bar{U}_{Q,k}Q_k]S_s \bar{z}^*_k; \quad (115)$$

$$\bar{\chi}^p_k = \left(\frac{2T_s}{N}\right)[\bar{U}_{I,k}P_k + \bar{U}_{Q,k}Q_k]S_p \bar{z}^*_k$$

According to various embodiments, the various spectrum control systems described herein may operate on multiple modulated signals. For example, the various systems described herein may operate on a number of signals of differing, non-overlapping bandwidths. In this case the complex baseband signal at the input to the amplifier may be given by:

$$x_{I,k} + jx_{Q,k} = \sum_{\upsilon=1}^{\Psi} \sum_{i=-L_\upsilon}^{L_\upsilon} [\beta^\upsilon_i u^\upsilon_{I,k-i} + j\beta^\upsilon_i u^\upsilon_{Q,k-i}]\exp(j\Omega_\upsilon k) \quad (116)$$

In (116) $\psi$ denotes the number of baseband signals centered at frequencies $\Omega_\upsilon$, for $\upsilon=1, 2, \ldots, \psi$, $\beta^\upsilon_i$ denotes the coefficients of the filter for the signal $\upsilon$ with the length of the filter equal to $(2L_\upsilon+1)$, and $u^\upsilon_{I,k}$ and $u^\upsilon_{Q,k}$ denote the in phase and quadrature symbols at the input to the $\upsilon^{th}$ pair of filters. In some embodiments the filter coefficients $\beta^\upsilon_i$ may be same for all the filters and the following optimization may be carried out for only a single set of coefficients. The center frequencies $\Omega_\upsilon$ may be positive, 0 or negative. From (116) the real and imaginary parts of the signal at the augmented amplifier input may be given by:

$$x_{I,k} = \sum_{\upsilon=1}^{\Psi}\left\{\sum_{i=-L_\upsilon}^{L_\upsilon} \beta^\upsilon_i u^\upsilon_{I,k-i}\cos(\Omega_\upsilon k) - \sum_{i=-L_\upsilon}^{L_\upsilon} \beta^\upsilon_i u^\upsilon_{Q,k-i}\sin(\Omega_\upsilon k)\right\} \quad (117)$$

$$x_{Q,k} = \sum_{\upsilon=1}^{\Psi}\left\{\sum_{i=-L_\upsilon}^{L_\upsilon} \beta^\upsilon_i u^\upsilon_{I,k-i}\sin(\Omega_\upsilon k) + \sum_{i=-L_\upsilon}^{L_\upsilon} \beta^\upsilon_i u^\upsilon_{Q,k-i}\cos(\Omega_\upsilon k)\right\} \quad (118)$$

As for the previous case of a single signal, the magnitude of the complex baseband signal denoted by $A_k$ and its derivative with respect to the various filter parameters may be evaluated as follows for $\upsilon=1,2,\ldots,\psi$:

$$A_k = [x^2_{I,k} + x^2_{Q,k}]^{1/2} \quad (119)$$

$$\frac{\partial A_k}{\partial \beta^\upsilon_i} = \frac{1}{A_k}\left[x_{I,k}\frac{\partial x_{I,k}}{\partial \beta^\upsilon_i} + x_{Q,k}\frac{\partial x_{Q,k}}{\partial \beta^\upsilon_i}\right] \quad (120)$$

$$\frac{\partial x_{I,k}}{\partial \beta^\upsilon_i} = \quad (121)$$

$$u^\upsilon_{I,k-i}\cos(\Omega_\upsilon k) - u^\upsilon_{Q,k-i}\sin(\Omega_\upsilon k) = \mathrm{Re}\{[u^\upsilon_{I,k-i} + ju^\upsilon_{Q,k-i}]\exp(j\Omega_\upsilon k)\}$$

$$\frac{\partial x_{Q,k}}{\partial \beta^\upsilon_i} = \quad (122)$$

$$u^\upsilon_{I,k-i}\sin(\Omega_\upsilon k) + u^\upsilon_{Q,k-i}\cos(\Omega_\upsilon k) = \mathrm{Im}\{[u^\upsilon_{I,k-i} + ju^\upsilon_{Q,k-i}]\exp(j\Omega_\upsilon k)\}$$

In the complex notations the complex baseband signal at the nonlinear system input and output may be given by:

$$x_k = x_{I,k} + jx_{Q,k}; j = \sqrt{-1} \quad (123)$$

$$z_k = \frac{g_0(A_k)}{A_k}x_k = \frac{g_0(A_k)}{A_k}[x_{I,k} + jx_{Q,k}] = z_{I,k} + jz_{Q,k} \quad (124)$$

As for the case of single modulated signal, the first optimization index may be given by:

$$J_1 = J_{1,I} + J_{1,Q} = \sum_k J_{1,k} \quad (125)$$

$$J_{1,I} = \sum_k [\kappa v_{I,k} - z_{I,k}]^2 \quad (126)$$

$$J_{1,Q} = \sum_k [\kappa v_{Q,k} - z_{Q,k}]^2 \quad (127)$$

where $v_{I,k}$ and $v_{Q,k}$ represent the input to the amplifier obtained with the reference square root raised cosine filters for various signals, i.e., for the case of distortion less amplifier. The derivatives of the functions $\theta_{1,I}$ and $\theta_{1,Q}$ with respect to various filter coefficients are given by $$\frac{\partial J_{1,I}}{\partial \beta^\upsilon_i} = -2\sum_k e_{I,k}\frac{\partial z_{I,k}}{\partial \beta^\upsilon_i}; e_{I,k} = \kappa v_{I,k} - z_{I,k} \quad (128)$$

$$\frac{\partial J_{1,Q}}{\partial \beta^\upsilon_i} = -2\sum_k e_{Q,k}\frac{\partial z_{Q,k}}{\partial \beta^\upsilon_i}; e_{Q,k} = \kappa v_{Q,k} - z_{Q,k} \quad (129)$$

In order to evaluate the desired derivatives in (128) and (129), it is observed that for the case of $A_k \neq 0$, $z_{I,k}$ and $z_{Q,k}$ may be given by:

$$z_{I,k} = \frac{g_0(A_k)}{A_k} x_{I,k}; \; z_{Q,k} = \frac{g_0(A_k)}{A_k} x_{Q,k} \qquad (130)$$

Therefore the derivatives of $z_{I,k}$ and $z_{Q,k}$ with respect to various filter parameters may be evaluated as:

$$\frac{\partial z_{I,k}}{\partial \beta_i^\upsilon} = \xi_k \left[ x_{I,k} \frac{\partial x_{I,k}}{\partial \beta_i^\upsilon} + x_{Q,k} \frac{\partial x_{Q,k}}{\partial \beta_i^\upsilon} \right] x_{I,k} + \eta_k \frac{\partial x_{I,k}}{\partial \beta_i^\upsilon} \qquad (131)$$

$$\frac{\partial z_{Q,k}}{\partial \beta_i^\upsilon} = \xi_k \left[ x_{I,k} \frac{\partial x_{I,k}}{\partial \beta_i^\upsilon} + x_{Q,k} \frac{\partial x_{Q,k}}{\partial \beta_i^\upsilon} \right] x_{Q,k} + \eta_k \frac{\partial x_{Q,k}}{\partial \beta_i^\upsilon} \qquad (132)$$

In (131) and (132), the terms $\xi_k$ and $\eta_k$ are same as in (80) and are reproduced below in (133).

$$\xi_k = \frac{A_k g_0'(A_k) - g_0(A_k)}{A_k^3} \qquad (133a)$$

$$\eta_k = \frac{g_0(A_k)}{A_k} \qquad (133b)$$

The derivatives of $x_{I,k}$ and $x_{Q,k}$ in (121) and (122) may be expressed in terms of the modulated symbols $\bar{u}_k^\upsilon$ defined as follows:

$$\tilde{u}_k^\upsilon = \tilde{u}_{I,k}^\upsilon + j\tilde{u}_{Q,k}^\upsilon = [u_{I,k}^\upsilon + ju_{Q,k}^\upsilon]\exp(j\Omega_\upsilon k) \qquad (134)$$

$$\frac{\partial x_{I,k}}{\partial \beta_i^\upsilon} = \qquad (135)$$
$$\mathrm{Re}\{[\tilde{u}_{I,k-i}^\upsilon + j\tilde{u}_{Q,k-i}^\upsilon]\exp(j\Omega_\upsilon i)\} = \tilde{u}_{I,k-i}^\upsilon \cos(\Omega_\upsilon i) - \tilde{u}_{Q,k-i}^\upsilon \sin(\Omega_\upsilon i)$$

$$\frac{\partial x_{Q,k}}{\partial \beta_i^\upsilon} = \qquad (136)$$
$$\mathrm{Im}\{[\tilde{u}_{I,k-i}^\upsilon + j\tilde{u}_{Q,k-i}^\upsilon]\exp(j\Omega_\upsilon i)\} = \tilde{u}_{I,k-i}^\upsilon \sin(\Omega_\upsilon i) + \tilde{u}_{Q,k-i}^\upsilon \cos(\Omega_\upsilon i)$$

Substitution of (135) and (136) in (131) and (132) and substitution of the resulting expressions for the derivatives of $z_{I,k}$ and $z_{Q,k}$ with respect to various filter parameters in (128) and (129) results in the following expressions for the derivatives of the optimization functions $\theta_{1,I}$ and $\theta_{1,Q}$ with respect to the filter parameters $\beta_i^\upsilon$.

$$\frac{\partial J_{1,I}}{\partial \beta_i^\upsilon} = -2\sum_k \left\{ \begin{array}{l} \xi_k[(x_{I,k}\tilde{u}_{I,k-i}^\upsilon + x_{Q,k}\tilde{u}_{Q,k-i}^\upsilon)\cos(\Omega_\upsilon i) + \\ (-x_{I,k}\tilde{u}_{Q,k-i}^\upsilon + x_{Q,k}\tilde{u}_{I,k-i}^\upsilon)\sin(\Omega_\upsilon i)]x_{I,k} + \\ \eta_k[\tilde{u}_{I,k-i}^\upsilon \cos(\Omega_\upsilon i) - \tilde{u}_{Q,k-i}^\upsilon \sin(\Omega_\upsilon i)] \end{array} \right\} e_{I,k} \qquad (137)$$

$$\frac{\partial J_{1,Q}}{\partial \beta_i^\upsilon} = -2\sum_k \left\{ \begin{array}{l} \xi_k[(x_{I,k}\tilde{u}_{I,k-i}^\upsilon + x_{Q,k}\tilde{u}_{Q,k-i}^\upsilon)\cos(\Omega_\upsilon i) + \\ (-x_{I,k}\tilde{u}_{Q,k-i}^\upsilon + x_{Q,k}\tilde{u}_{I,k-i}^\upsilon)\sin(\Omega_\upsilon i)]x_{Q,k} + \\ \eta_k[\tilde{u}_{I,k-i}^\upsilon \sin(\Omega_\upsilon i) + \tilde{u}_{Q,k-i}^\upsilon \cos(\Omega_\upsilon i)] \end{array} \right\} e_{Q,k} \qquad (138)$$

Addition of both sides of the equations (137) and (138) yields the following derivative of the optimization function $\theta_1$ with respect to the filter parameters $\beta_i^\upsilon$:

$$\frac{\partial J_{1,Q}}{\partial \beta_i^\upsilon} = -2\sum_k \left\{ \begin{array}{l} \xi_k[(x_{I,k}\tilde{u}_{I,k-i}^\upsilon + x_{Q,k}\tilde{u}_{Q,k-i}^\upsilon)\cos(\Omega_\upsilon i) + \\ (-x_{I,k}\tilde{u}_{Q,k-i}^\upsilon + x_{Q,k}\tilde{u}_{I,k-i}^\upsilon)\sin(\Omega_\upsilon i)] \times \\ [x_{I,k}e_{I,k} + x_{Q,k}e_{Q,k}] + \\ \eta_k\left[\begin{array}{l}(\tilde{u}_{I,k-i}^\upsilon \cos(\Omega_\upsilon i) + \tilde{u}_{Q,k-i}^\upsilon \sin(\Omega_\upsilon i))e_{I,k} + \\ (\tilde{u}_{I,k-i}^\upsilon \sin(\Omega_\upsilon i) + \tilde{u}_{Q,k-i}^\upsilon \cos(\Omega_\upsilon i))e_{Q,k}\end{array}\right] \end{array} \right\} \qquad (139)$$

In terms of the complex notations for $x_k$, $\bar{u}_k^\upsilon$, and $e_k = e_{I,k} + je_{Q,k}$, the derivative in (139) may be written in the following more compact form:

$$\frac{\partial J_1}{\partial \beta_i^\upsilon} = -2\sum_k \{\xi_k \mathrm{Re}[x_k \tilde{u}_{k-i}^{\upsilon*}\exp(-j\Omega_\upsilon i)]\mathrm{Re}[x_k e_k^*] + \qquad (140)$$
$$\eta_k \mathrm{Re}[e_k \tilde{u}_{k-i}^{\upsilon*}\exp(-j\Omega_\upsilon i)]\}$$

With $\bar{\beta}^\upsilon = [\rho_{-L_\upsilon}^\upsilon, \ldots, \rho_0^\upsilon, \ldots \beta_{L_\upsilon}^\upsilon]^T$ the gradient of $\theta_{1,k}$ with respect to the parameter vector $\bar{\beta}^\upsilon$ may be written in the following matrix vector form:

$$\frac{\partial J_{1,k}}{\partial \bar{\beta}^\upsilon} = -2\{\xi_k \mathrm{Re}[\Gamma^{\upsilon*} x_k \tilde{\bar{u}}_k^{\upsilon*}] \cdot \mathrm{Re}[x_k e_k^*] + \eta_k \mathrm{Re}[\Gamma^{\upsilon*} e_k \tilde{\bar{u}}_k^{\upsilon*}]\}; \qquad (141)$$
$$\upsilon = 1, 2, \ldots, \Psi$$

Or equivalently:

$$\frac{\partial J_{1,k}}{\partial \bar{\beta}^\upsilon} = -2\mathrm{Re}\{\Gamma^{\upsilon*}\tilde{\bar{u}}_k^\upsilon \chi_k\}; \; \chi_k = \xi_k x_k^* \mathrm{Re}[x_k^* e_k] + \eta_k e_k^* \qquad (142)$$

In (142) $\tilde{\bar{u}}_k^\upsilon$ denotes the following vector comprised of the samples of the complex signal $\tilde{u}_k^\upsilon$, $$\tilde{\bar{u}}_k^\upsilon = [\tilde{u}_{k+L_\upsilon}^\upsilon \ldots \tilde{u}_k^\upsilon \ldots \tilde{u}_{k-L_\upsilon}^\upsilon]^T \qquad (143)$$

and $\Gamma^\upsilon$ is the following diagonal matrix:

$$\Gamma^\upsilon = \exp(j\Omega_\upsilon I_\upsilon); \; I_\upsilon = \mathrm{diag}([-L_\upsilon - (L_\upsilon - 1) \ldots 0\; 1 \ldots (L_\upsilon - 1)L_\upsilon]) \qquad (144)$$

If for any k, the amplitude of the signal at the amplifier input $A_k$ is zero (or relatively small) then $g(A_k)/A_k = 1$ resulting in $z_k = x_k$ and the expression for the gradient of $\theta_{1,k}$ with respect to $\bar{\beta}^\upsilon$ is obtained from (142) after substituting $\xi_k = 0$ and $\eta_k = 1$.

Figure 11A:
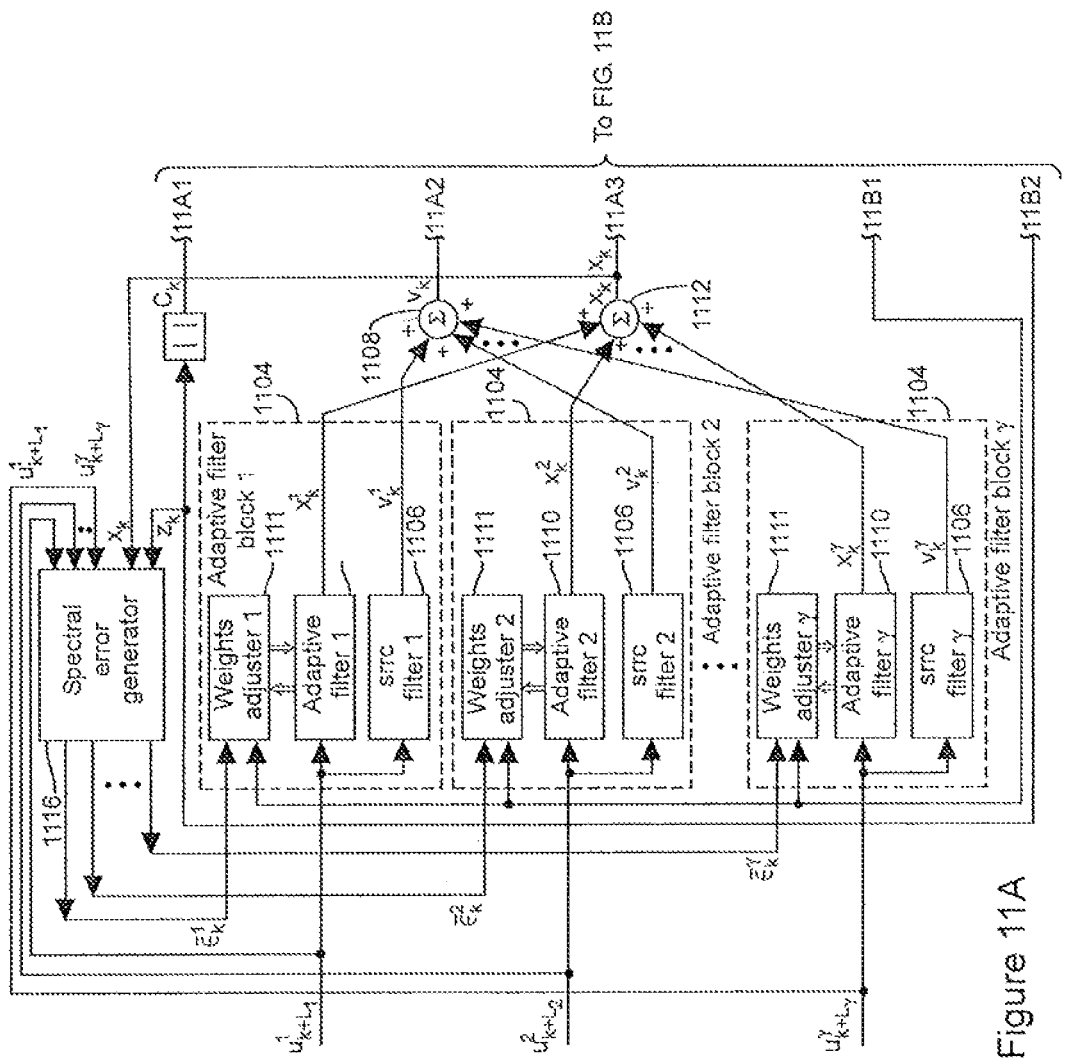
FIG. 11A shows a first portion of a block diagram of one embodiment of a spectrum control system where the nonlinear system has multiple signals at its input.
Figure 11B:
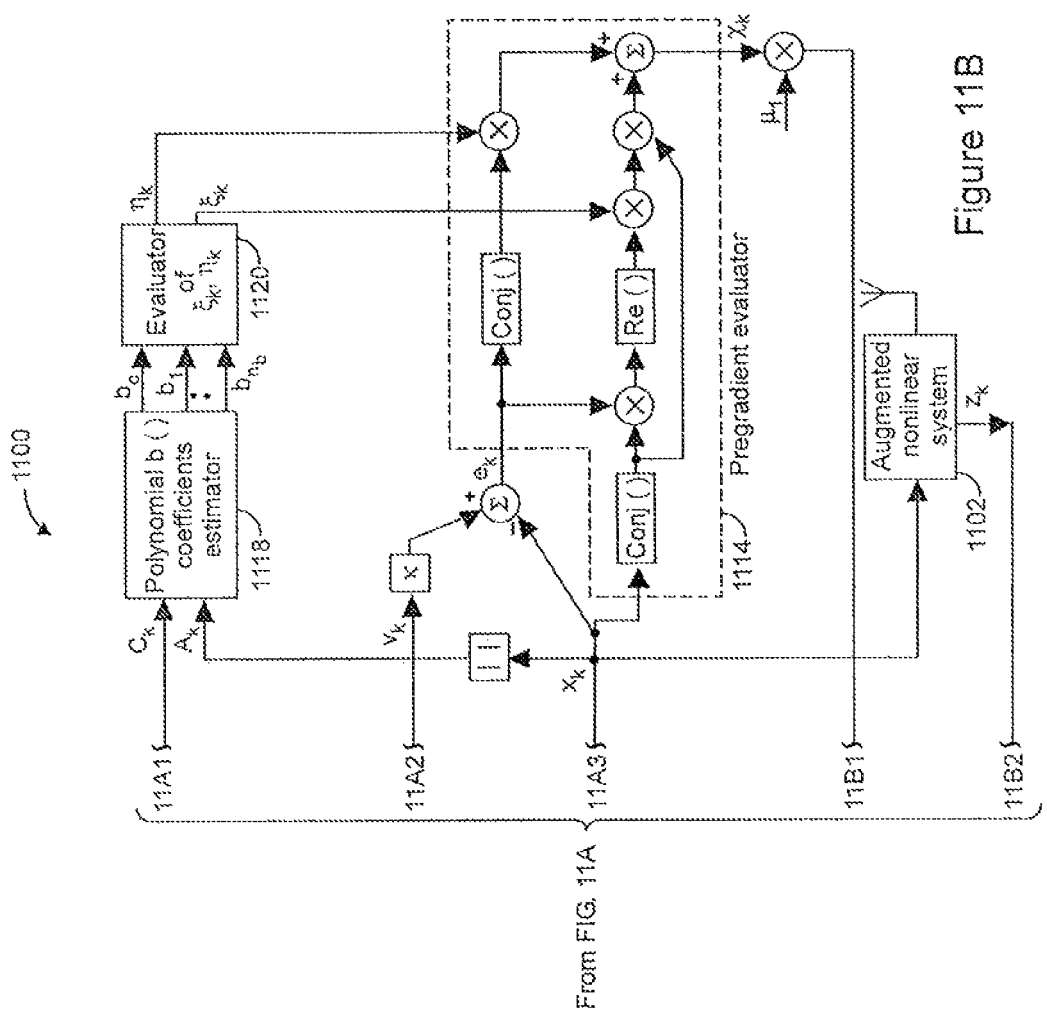
FIG. 11B shows a second portion of the block diagram of FIG. 11A.

FIG. 11 shows a block diagram of one embodiment of a spectrum control system 1100 where the nonlinear system 1102 has multiple signals at its input. For example, the system 1100 may be suited to handle multiple QPSK and/or QAM signals. The augmented nonlinear system 1102 as shown in FIG. 11 may comprise components similar to those of the nonlinear system is as shown in FIG. 6. For example, the augmented non-linear system 1102 of FIG. 11 may comprise a nonlinear system and a feedback chain comprised of a coupler, an RF-to-IF converter, an IF band pass filter, an IF-to-baseband down converter, gain $c_i$, as well as AM-AM and AM-PM compensation synthesizers and AM-AM and AM-PM compensators.

Referring to FIG. 11, $\Psi$, in general, complex-valued, signals $u_{k+L_1}^1, u_{k+L_2}^2, \ldots, u_{k+L_Y}^Y$ may be provided as input to $\Psi$ adaptive filter blocks 1104 (indicated as 1,2, ..., $\Psi$, respectively). Each filter block 1104 may be comprised of an srrc filter 1106 with its output $v_k^i$ for $i=1,2,\ldots,\Psi$. The $\Psi$ srrc filter outputs $v_k^i$ may be added by a summer 1108, generating a sum $v_k$ at the output of the summer 1108. Similarly outputs $x_k^i$ of Ψ adaptive filters 1110 may be added by a summer 1112 to generate the output $x_k$, which may be provided as input to the augmented nonlinear system 1102. The sum of the outputs of the adaptive filters $x_k$ may be subtracted from κ times the sum of the srrc filters' outputs $v_k$, generating the error $e_k$. κ between 0 and 1 may be selected to adjust the power at the output of the nonlinear system 1102. The error $e_k$ and the sum of the outputs of the adaptive filters $x_k$ may both be provided as input to a pre-gradient evaluator 1114, which may generate a pre gradient $\chi_k$ of the required gradient of the optimization function $\theta_1$. The pre gradient $\chi_k$ may be multiplied by a scalar $\mu_1$ and the resulting product $\mu_1\chi_k$ may be provided as inputted to the Ψ adaptive filter blocks 1104. The sum $x_k$, the augmented nonlinear system output $z_k$, and the Ψ input signals $u_{k+L_1}^1, u_{k+L_2}^2, \ldots, u_{k+L_Y}^Y$ may all be provided as input to a spectral error generator 1116 that may output the vector error signals $\bar{\epsilon}_k^1, \bar{\epsilon}_k^2, \ldots, \bar{\epsilon}_k^Y$ that are provided as input to the respective adaptive filter blocks 1104.

The signals $A_k = |x_k|$ and $C_k = |z_k|$ may be input to the polynomial b( ) coefficients evaluator 1118 that may approximate the function $g_o(x_k)$ by a polynomial of odd degree as in (78-79). The polynomial coefficients $b_0, b_1, \ldots, b_{nb}$ may be provided as input to the evaluator of $\xi_k$, $\eta_k$ block 1120, generating the signals $\xi_k$ and $\eta_k$ according to equation (80). The signals $\xi_k$ and $\eta_k$ may be provided as input to the pre-gradient evaluator block 1114, which may generate the pre gradient $\chi_k$ at its output.

Figure 12:
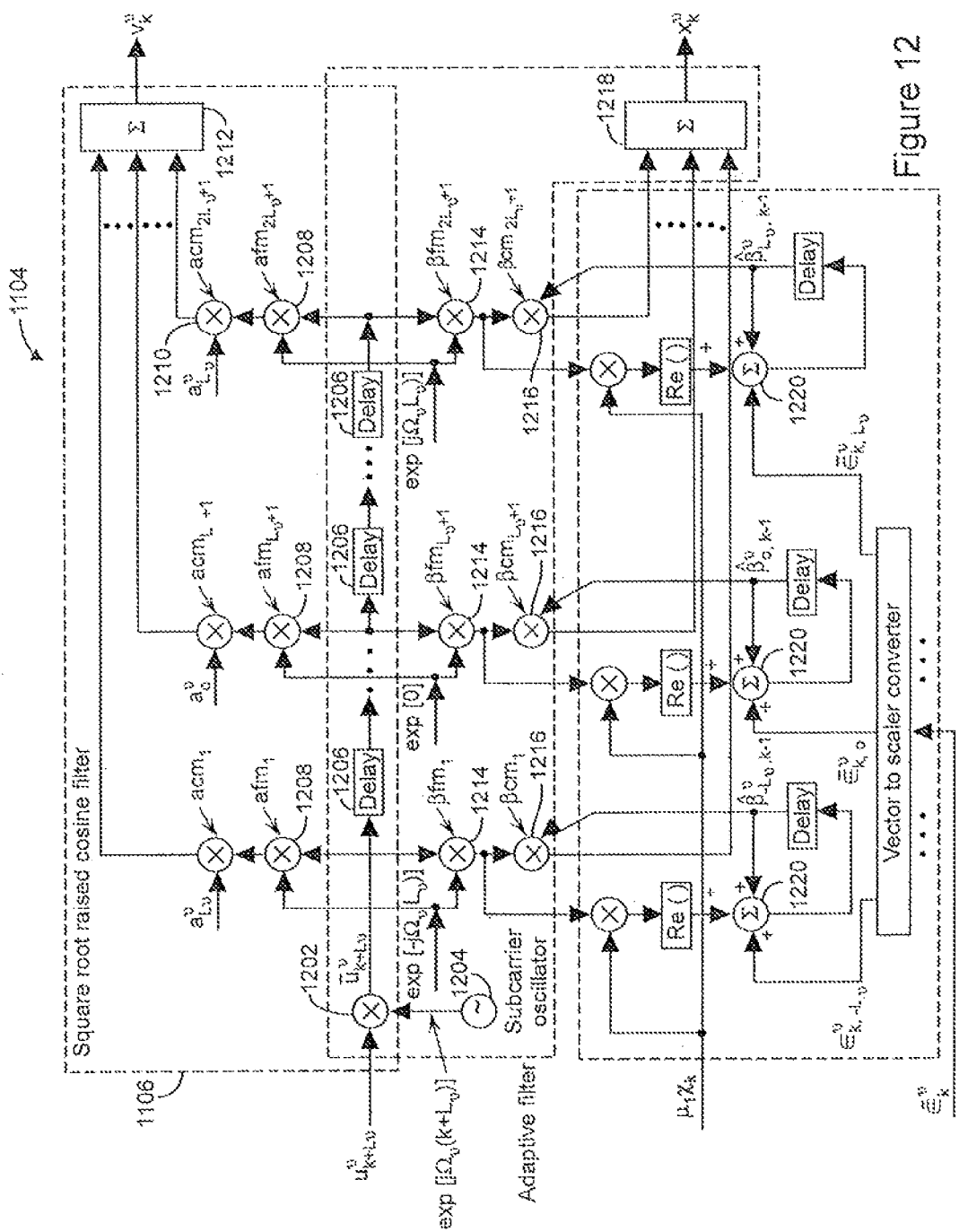
FIG. 12 shows a block diagram of one embodiment of an adaptive filter block as shown in FIG. 11.

FIG. 12 shows a block diagram of one embodiment of an adaptive filter block 1104. Referring to FIG. 12, the $\upsilon^{th}$ input signal $u_{k+L_\upsilon}^\upsilon$ may be modulated by the subcarrier oscillator signal $\exp[j\Omega_\upsilon(k+L_\upsilon)]$ generated by the subcarrier oscillator 1204 (e.g., at modulator 1202). The subcarrier modulated signal $\tilde{u}_{k+L_\upsilon}^\upsilon$ may be input to a cascade of $(2L_\upsilon+1)$ delay elements 1206, providing the $2L_\upsilon$ delayed versions of $\tilde{u}_{k+L_\upsilon}^\upsilon$ denoted by $\tilde{u}_{k+L_\upsilon-1}^\upsilon, \ldots, \tilde{u}_k^\upsilon, \ldots, \tilde{u}_{k-L_\upsilon}^\upsilon$. The subcarrier modulated signal $\tilde{u}_{k+L_\upsilon}^\upsilon$ and its various delayed versions may be input to $(2L_\upsilon+1)$ a-frequency multipliers 1208 (individually denoted as $afm_1, afm_2, \ldots, afm_{(2L\upsilon+1)}$). The a-frequency multipliers 1208 may multiply the signals $\tilde{u}_{k+L_\upsilon}^\upsilon, \ldots, \tilde{u}_k^\upsilon, \ldots, \tilde{u}_{k-L_\upsilon}^\upsilon$ by the elements of the vector $\exp\{j\Omega_\upsilon \times [-L_\upsilon, \ldots, 0, \ldots L_\upsilon]\}$, where the exponential function applies to each element of the vector in its argument. The outputs of the $(2L_\upsilon+1)$ a-frequency multipliers 1208 may be provided as input to $(2L_\upsilon+1)$ a-coefficient multipliers 1210 (individually denoted by $acm_1, acm_2, \ldots, acm_{(2L\upsilon+1)}$). The a-coefficient multipliers 1210 may multiply the outputs of the afm multipliers 1208 by the coefficients $a_{-L_\upsilon}^\upsilon, \ldots, a_0^\upsilon, \ldots, a_{L_\upsilon}^\upsilon$ of the srrc filter 1106, respectively. The outputs of the various a-coefficient multipliers 1210 may be provided as input to an srrc summer 1212 to generate the srrc filter output $v_k^\upsilon$.

The subcarrier modulated signal $\tilde{u}_{k+L_\upsilon}^\upsilon$ and its various delayed versions are also input to $(2L_\upsilon+1)$ β-frequency multipliers 1214 (individually denoted as $\beta fm_1, \beta fm_2, \ldots, \beta fm_{(2L\upsilon+1)}$). The β-frequency multipliers 1214 may multiply the modulated and delayed signals $\tilde{u}_{k+L_\upsilon}^\upsilon, \ldots, \tilde{u}_k^\upsilon, \ldots, \tilde{u}_{k-L_\upsilon}^\upsilon$ by the elements of the vector $\exp[j\Omega_\upsilon]\times[-L_\upsilon, \ldots, 0, \ldots L_\upsilon]$. The outputs of the $(2L_\upsilon+1)$ β-frequency multipliers 1214 may be provided as input to the $(2L_\upsilon+1)$ β-coefficient multipliers 1216 (individually denoted by $\beta cm_1, \beta cm_2, \ldots, \beta cm_{(2L\upsilon+1)}$). The β-coefficient multipliers 1216 may multiply the outputs of the βfm multipliers 1214 by the coefficients $\beta_{-L_\upsilon}^\upsilon, \ldots, \beta_0^\upsilon, \ldots, \beta_{L_\upsilon}^\upsilon$ of the adaptive filter 1110, respectively. The outputs of the various β-coefficient multipliers 1216 may be provided as input to the adaptive filter summer 1218, generating the adaptive filter output $x_k^\upsilon$ at the output of the summer 1218.

In the adaptive weights adjustor of FIG. 12, the outputs of the $(2L_\upsilon+1)$ β-frequency multipliers 1214 may be multiplied by the signal $\mu_1\chi_k$ and the real parts of the resulting $(2L_\upsilon+1)$ products may be provided as inputs to adders 1220, respectively. The output $\bar{\epsilon}_k^\upsilon$ of the spectral error generator 1116 (shown in FIG. 11) may also be provided as input to a vector to scalar converter 1222 of FIG. 12. The $(2L_\upsilon+1)$ outputs $\epsilon_{-L_\upsilon}^\upsilon, \ldots, \epsilon_0^\upsilon, \ldots, \epsilon_{L_\upsilon}^\upsilon$ of the vector to scalar converter 1222 may be provided as input to the $(2L_\upsilon+1)$ adders 1220 of the adaptive weights adjustor. The present estimates of the adaptive filter weights $\beta_{-L_\upsilon,k-1}^\upsilon, \ldots, \beta_{0,k-1}^\upsilon, \ldots, \beta_{L_\upsilon,k-1}^\upsilon$ may also be provided as input to the $(2L_\upsilon+1)$ adders 1220, the outputs of which may provide an updated version of the adaptive filter weights $\beta_{-L_\upsilon,k}^\upsilon, \ldots, \beta_{0,k}^\upsilon, \ldots, \beta_{L_\upsilon,k}^\upsilon$ at the outputs of the $(2L_\upsilon+1)$ adders 1220. The present estimates of the adaptive filter weights $\beta_{-L_\upsilon,k-1}^\upsilon, \ldots, \beta_{0,k-1}^\upsilon, \ldots, \beta_{L_\upsilon,k-1}^\upsilon$ may be provided as input to the β-coefficient multipliers 1216 of the adaptive filter 1110.

To minimize the weighted sum of the power spectral densities at a set of selected frequencies in the stop band at the output of the nonlinear system, an N-point DFT of the transformed amplifier output $z_k$ may be evaluated at a number $M_s$ of selected frequencies $f_m = mf_r = mf_s/N$ in the stop band with the set of indices m denoted by $M_s$. For the case of multiple signals at the amplifier input, the stop band may include the band gaps between spectrums of various signals or the edge frequencies of pass bands of individual signals in case the band gap is zero. The N-point DFT of the amplifier output at the $m^{th}$ frequency in the set of selected frequencies in the filter stop band may be given by:

$$Z_{m,k} = w_{m,0}^s z_k + w_{m,1}^s z_{k-1} + \ldots + w_{m,N-1}^s z_{k-N+1}; \quad m=1,2,\ldots,M_s \tag{145}$$

with $w_{m,i}^s$ given by (29). Differentiation of $Z_{m,k}$ in (143) with respect to the parameter $\beta_i^\upsilon$ yields $$\frac{\partial Z_{m,k}}{\partial \beta_i^\upsilon} = \sum_{l=0}^{N-1} w_{m,l}^s \frac{\partial z_{k-l}}{\partial \beta_i^\upsilon} \tag{146}$$

From (131) and (132) one obtains the following derivative of $z_k$ with respect to the filter parameter $\beta_i^\upsilon$:

$$\frac{\partial z_k}{\partial \beta_i^\upsilon} = \xi_k \left[ x_{I,k} \frac{\partial x_{I,k}}{\partial \beta_i^\upsilon} + x_{Q,k} \frac{\partial x_{Q,k}}{\partial \beta_i^\upsilon} \right] \cdot [x_{I,k} + j x_{Q,k}] + \eta_k \left[ \frac{\partial x_{I,k}}{\partial \beta_i^\upsilon} + j \frac{\partial x_{Q,k}}{\partial \beta_i^\upsilon} \right] \tag{147}$$

Substitution of (121) and (122) in (147) yields:

$$\frac{\partial z_k}{\partial \beta_i^\upsilon} = \xi_k [(x_{I,k} \tilde{u}_{I,k-i}^\upsilon + x_{Q,k} \tilde{u}_{Q,k-i}^\upsilon)\cos(\Omega_\upsilon i) + (-x_{I,k} \tilde{u}_{Q,k-i}^\upsilon + x_{Q,k} \tilde{u}_{I,k-i}^\upsilon)\sin(\Omega_\upsilon i)] \cdot [x_{I,k} + j x_{Q,k}] + \eta_k [(\tilde{u}_{I,k-i}^\upsilon + j \tilde{u}_{Q,k-i}^\upsilon)\cos(\Omega_\upsilon i) + (j \tilde{u}_{I,k-i}^\upsilon - \tilde{u}_{Q,k-i}^\upsilon)\sin(\Omega_\upsilon i)] \tag{148}$$

Alternatively the derivative in (148) may be written in the following more compact complex notation as:

$$\frac{\partial z_k}{\partial \beta_i^{\upsilon}} = \xi_k x_k \operatorname{Re}\left[x_k \tilde{u}_{k-i}^{\upsilon^*}\exp(-j\Omega_{\upsilon}i)\right] + \eta_k \tilde{u}_{k-i}^{\upsilon}\exp(j\Omega_{\upsilon}i) \quad (149)$$

An equivalent form for (149) may be given by:

$$\frac{\partial z_k}{\partial \beta_i^{\upsilon}} = \frac{1}{2}\xi_k x_k^2 \tilde{u}_{k-i}^{\upsilon^*}\exp(-j\Omega_{\upsilon}i) + \left[\frac{1}{2}\xi_k|x_k|^2 + \eta_k\right]\tilde{u}_{k-i}^{\upsilon}\exp(j\Omega_{\upsilon}i) \quad (150)$$

For the convenience of notations let:

$$\varphi_k = \frac{1}{2}\xi_k x_k^2; \psi_k = \frac{1}{2}\xi_k|x_k|^2 + \eta_k \quad (151)$$

The variables $\phi_k$ and $\psi_k$ in (151) do not depend upon the index $\upsilon$. The derivative of $z_k$ in (150) may now be expressed in the following compact notation:

$$\frac{\partial z_k}{\partial \beta_i^{\upsilon}} = \varphi_k \tilde{u}_{k-i}^{\upsilon^*}\exp(-j\Omega_{\upsilon}i) + \psi_k \tilde{u}_{k-i}^{\upsilon}\exp(j\Omega_{\upsilon}i) \quad (152)$$

Substitution of (152) in (146) yields the following derivative of $Z_{m,k}$ with respect to the parameter $\beta_i^{\upsilon}$:

$$\frac{\partial Z_{m,k}}{\partial \beta_i^{\upsilon}} = \sum_{t=0}^{N-1} w_{m,t}^s \varphi_{k-t}\tilde{u}_{k-t-i}^{\upsilon^*}\exp(-j\Omega_{\upsilon}i) + \sum_{t=0}^{N-1} w_{m,t}^s \psi_{k-t}\tilde{u}_{k-t-i}^{\upsilon}\exp(j\Omega_{\upsilon}i) \quad (153)$$

From (153), the gradient of $Z_{m,k}$ with respect to the parameter vector $\overline{\beta}^{\upsilon}$ may be expressed as:

$$\frac{\partial Z_{m,k}}{\partial \overline{\beta}^{\upsilon}} = \Gamma^{\upsilon^*}\tilde{U}_k^{\upsilon^*}\begin{bmatrix} w_{m,0}^s \varphi_k \\ w_{m,1}^s \varphi_{k-1} \\ \vdots \\ w_{m,N-1}^s \varphi_{k-N+1} \end{bmatrix} + \Gamma^{\upsilon}\tilde{U}_k^{\upsilon}\begin{bmatrix} w_{m,0}^s \psi_k \\ w_{m,1}^s \psi_{k-1} \\ \vdots \\ w_{m,N-1}^s \psi_{k-N+1} \end{bmatrix} \quad (154)$$

In (154) $\Gamma^{\upsilon}$ is the matrix defined in (144) and $\overline{U}_k^{\upsilon}$ is the matrix defined below:

$$\tilde{U}_k^{\upsilon} = \begin{bmatrix} \tilde{u}_{k+L_{\upsilon}} & \tilde{u}_{k+L_{\upsilon}-1} & \cdots & \tilde{u}_{k+L_{\upsilon}-N+1} \\ \vdots & \vdots & \vdots & \vdots \\ \tilde{u}_k & \tilde{u}_{k-1} & \cdots & \tilde{u}_{k-N+1} \\ \vdots & \vdots & \vdots & \vdots \\ \tilde{u}_{k-L_{\upsilon}} & \tilde{u}_{k-L_{\upsilon}-1} & \cdots & \tilde{u}_{k-L_{\upsilon}-N+1} \end{bmatrix} \quad (155)$$

With the diagonal matrices $\Phi_k$ and $\Psi_k$ defined as:

$$\Phi_k = \operatorname{diag}([\phi_k \phi_{k-1} \cdots \phi_{k-N+1}]) \quad (156)$$

$$\Psi_k = \operatorname{diag}([\psi_k \psi_{k-1} \cdots \psi_{k-N+1}]) \quad (157)$$

and $W_s$ denoting the Fourier transform matrix in (38c) and reproduced as (158) in the following:

$$W_s = \begin{bmatrix} w_{0,0}^s & w_{1,0}^s & \cdots & w_{M_s-1,0}^s \\ w_{0,1}^s & w_{1,1}^s & \cdots & w_{M_s-1,1}^s \\ \vdots & \vdots & \cdots & \vdots \\ w_{0,N-1}^s & w_{1,N-1}^s & \cdots & w_{M_s-1,N-1}^s \end{bmatrix}_{(N,M_s)} \quad (158)$$

then the gradient of the vector $Z_k = [Z_{1,k}, Z_{2,k}, \ldots, Z_{M_s,k}]^T$ with respect to the parameter vector $\overline{\beta}^{\upsilon}$ may be given by:

$$\frac{\partial Z_k^T}{\partial \overline{\beta}^{\upsilon}} = \Gamma^{\upsilon^*}\tilde{U}_k^{\upsilon^*}\Phi_k W_s + \Gamma^{\upsilon}\tilde{U}_k^{\upsilon}\Psi_k W_s \quad (159)$$

From (39), for the case of $\gamma_m^s = 1$ for all m, the gradient of $\theta_2$ with respect to the parameter vector $\overline{\beta}^{\upsilon}$ may be given by:

$$\frac{\partial J_2}{\partial \overline{\beta}^{\upsilon}} = 2\left(\frac{2T_s}{N}\right)\sum_k \operatorname{Re}\left\{\frac{\partial Z_k^T}{\partial \overline{\beta}^{\upsilon}}Z_k^*\right\} \quad (160)$$

Substitution from (159) in (160) results in the following gradient of $\theta_2$ with respect to $\overline{\beta}^{\upsilon}$:

$$\frac{\partial J_2}{\partial \overline{\beta}^{\upsilon}} = 2\left(\frac{2T_s}{N}\right)\sum_k \operatorname{Re}\left\{[\Gamma^{\upsilon^*}\tilde{U}_k^{\upsilon^*}\Phi_k + \Gamma^{\upsilon}\tilde{U}_k^{\upsilon}\Psi_k]W_s Z_k^*\right\} \quad (161)$$

For unequal weights $\gamma_m^s$, the gradient in (161) may be modified as:

$$\frac{\partial J_2}{\partial \overline{\beta}^{\upsilon}} = \sum_k \frac{\partial J_{2,k}}{\partial \overline{\beta}^{\upsilon}} = 2\left(\frac{2T_s}{N}\right)\sum_k \operatorname{Re}\left\{[\Gamma^{\upsilon^*}\tilde{U}_k^{\upsilon^*}\Phi_k + \Gamma^{\upsilon}\tilde{U}_k^{\upsilon}\Psi_k]W_s \Xi_s Z_k^*\right\} \quad (162)$$

where $\Xi_s$ is the diagonal matrix with its diagonal elements equal to $\gamma_m^s$ for $m=0,1,\ldots,N-1$. From (43), the gradient may also be expressed in terms of the amplifier input $z_k$ by:

$$\frac{\partial J_2}{\partial \overline{\beta}^{\upsilon}} = \sum_k \frac{\partial J_{2,k}}{\partial \overline{\beta}^{\upsilon}} = 2\left(\frac{2T_s}{N}\right)\sum_k \operatorname{Re}\left\{[\Gamma^{\upsilon^*}\tilde{U}_k^{\upsilon^*}\Phi_k + \Gamma^{\upsilon}\tilde{U}_k^{\upsilon}\Psi_k]S_s \tilde{z}_k^*\right\};$$

$$S_s = W_s \Xi_s (W_s^T)^* \quad (163)$$

Figure 13A:
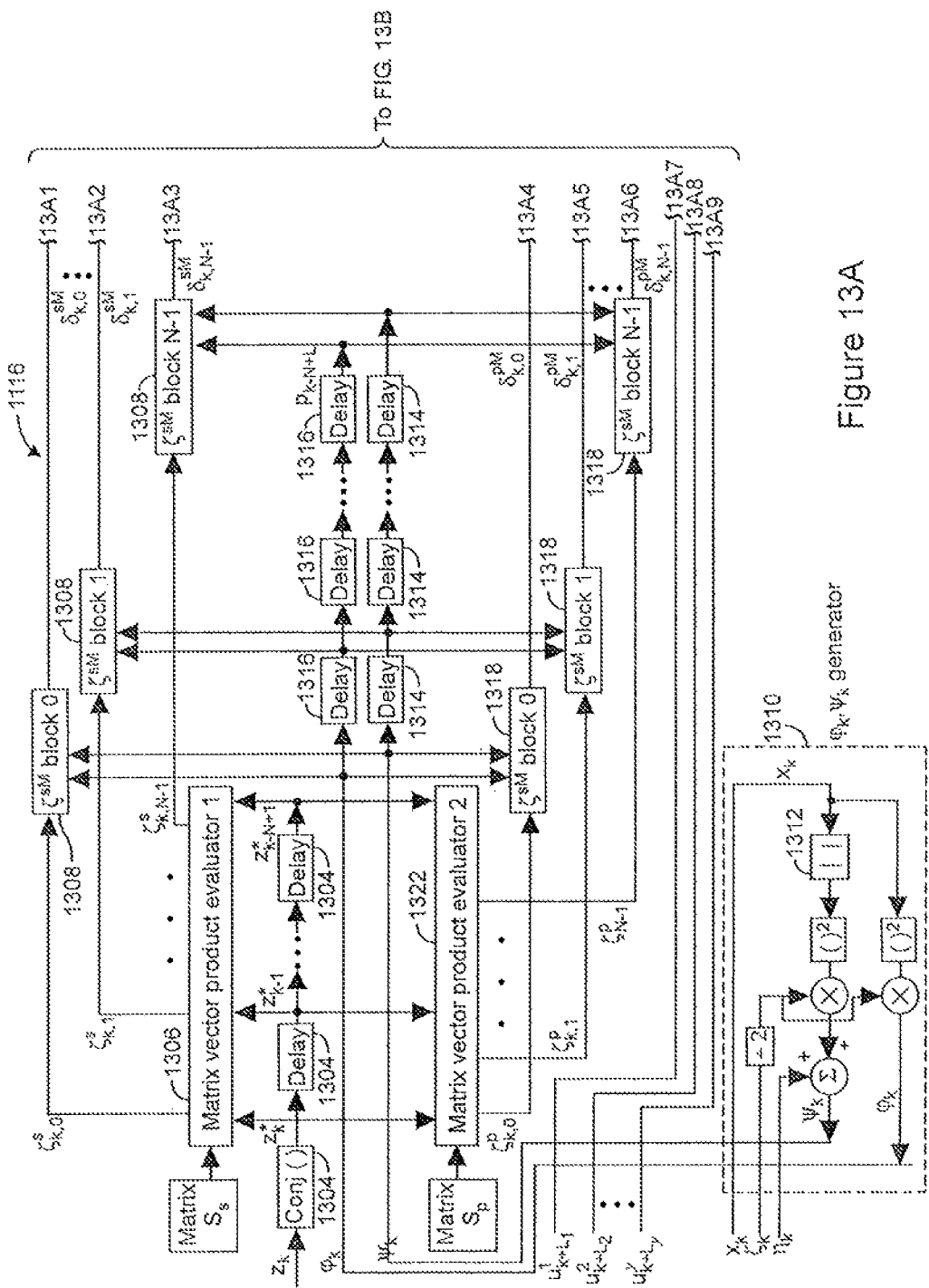
FIG. 13A shows a first portion of a block diagram of one embodiment of the spectral error generator shown in FIG. 11 configured to generate the derivative $$\frac{\partial J_{2,k}}{\partial \bar{\beta}^v}.$$
Figure 13B:
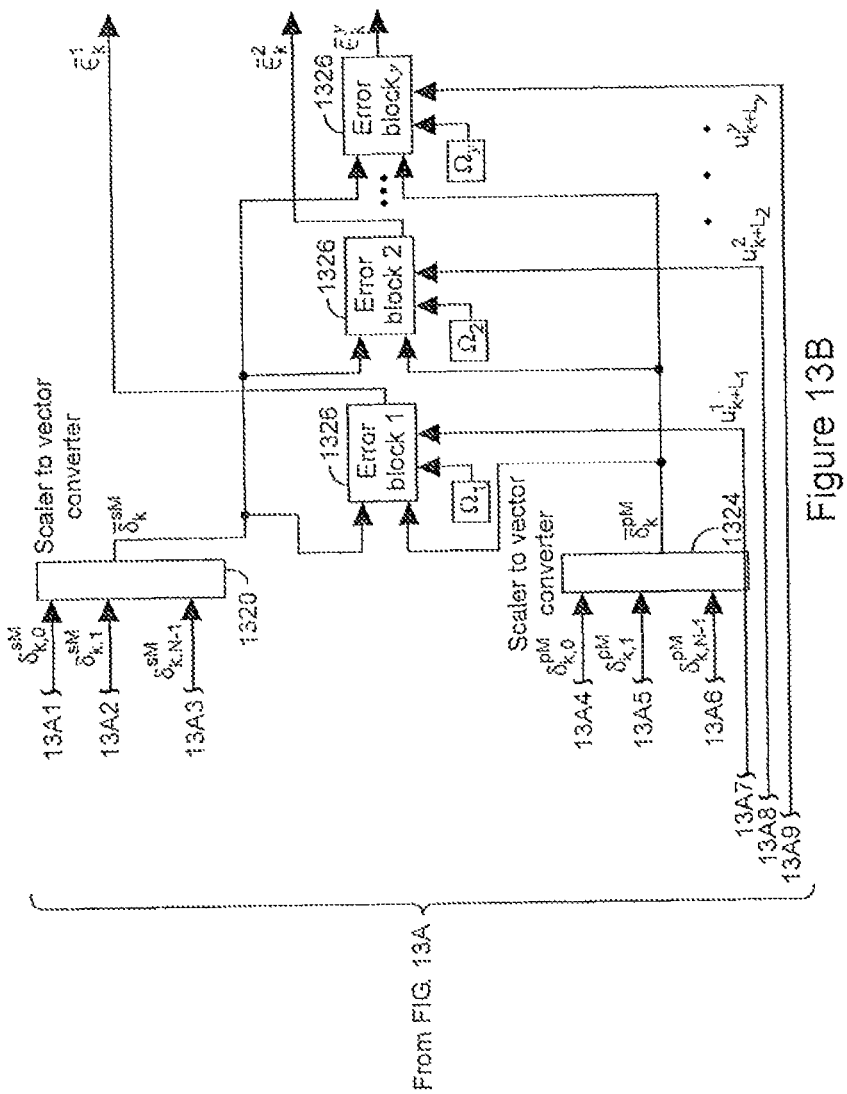
FIG. 13B shows a second portion of the block diagram of FIG. 13A.

FIG. 13 shows a block diagram of one embodiment of the spectral error generator 1116 configured to generate the derivative $$\frac{\partial J_{2,k}}{\partial \overline{\beta}^{\upsilon}}$$

of (163). As shown in FIG. 13, the nonlinear system transformed output $z_k$ may be conjugated at 1302 to obtain a conjugated output $z_k^*$. The conjugate output $z_k^*$ may be provided as input to a cascade of (N−1) delay elements 1304, providing the (N−1) delayed versions $z_{k-1}^*$, $z_{k-2}^*$, ..., $z^*_{k-N+1}$. The conjugate output $z^*_k$ and its various delayed versions, along with the matrix $S_s$, may be provided as input to a matrix vector product evaluator 1306, that may provide as output the N elements of the vector $S_s z^*_k$. The N elements of the vector $S_s z^*_k$ may be provided as input to $\zeta^{sM}$ blocks 1308 (individually denoted as 0 to N−1, respectively). The outputs $x_k$ of the adaptive filter 1110 and the signals $\xi_k$ and $\eta_k$ from FIG. 11 may be provided as input to a $\phi_k$, $\psi_k$ generator block 1310. In FIG. 13, $x_k$ may be provided as input to an absolute value | | block 1312, generating its absolute value $|x_k|$. Both $x_k$ and $|x_k|$ may be processed in the $\phi_k$, $\psi_k$ generator block 1310 to generate the signals $\phi_k$, $\psi_k$, for example, according to equation (151) with:

$$\varphi_k = \frac{1}{2}\xi_k x_k^2; \psi_k = \frac{1}{2}\xi_k |x_k|^2 + \eta_k \tag{151}$$

Both $\phi_k$, $\psi_k$ may be provided as input to the respective cascades of N−1 delay elements 1314, 1316 that may each generate the various delayed versions of $\phi_k$, $\psi_k$. The signals $\phi_k$, $\psi_k$ and their various delayed versions $\phi_{k-1}$, $\psi_{k-1}$, ..., $\phi_{k-N+1}$, $\psi_{k-N+1}$ may be provided as input to the N $\zeta^{sM}$ block 1308 and N $\zeta^{pM}$ blocks 1318.

Figure 14:
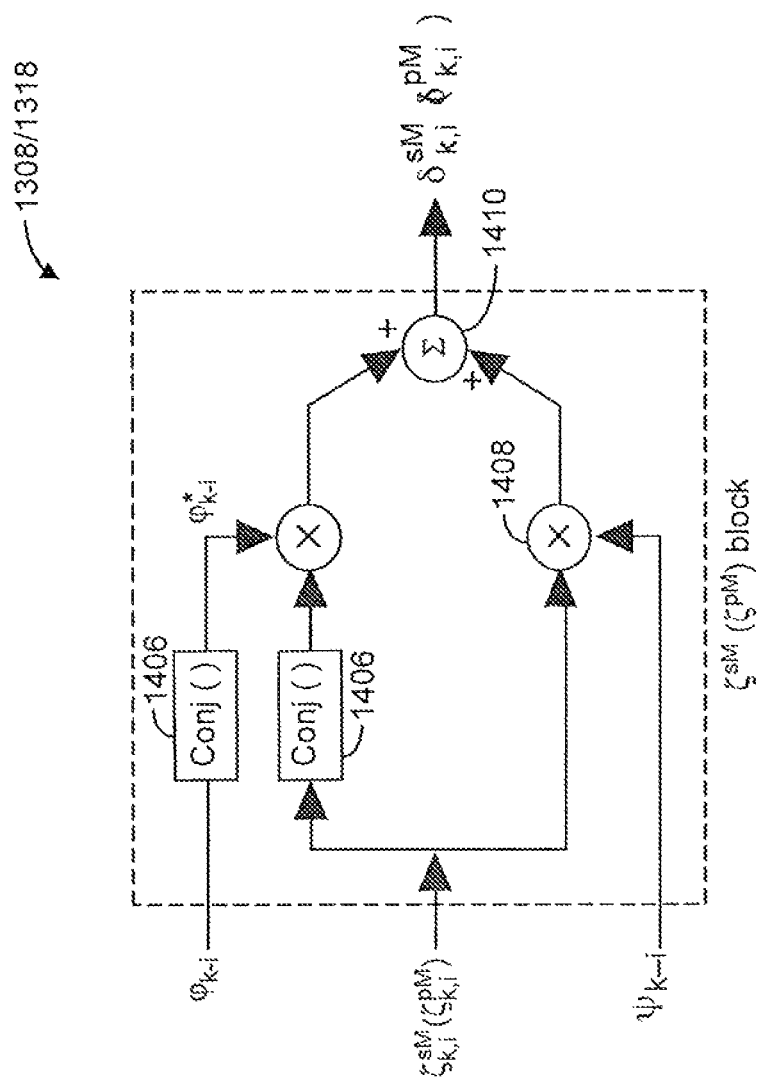
FIG. 14 shows a block diagram of one embodiment of a $\zeta$ block i, which may be either one of the $\zeta^{sM}$ blocks or one of the $\zeta^{pM}$ blocks shown in FIG. 13.

FIG. 14 shows a block diagram of one embodiment of a $\zeta$ block i, which may be either one of the $\zeta^{sM}$ blocks 1308 or one of the $\zeta^{pM}$ blocks 1318. The input to the block $\zeta_{k,i}^{sM}$ may be conjugated at 1402 and, at 1404, multiplied by the conjugate of the input $\phi_{k-i}$ (found at 1406). This may generate the first $\delta$ term. The block input $\zeta_{k,i}^{sM}$ may also be multiplied by $\psi_{k-i}$ at 1408, generating the second $\delta$ term. The first and second $\delta$ terms may be added by an adder 1410, generating the block output $\delta_{k,i}^{sM}$.

The matrices $\Phi_k$ and $\Psi_k$ may be diagonal matrices with their respective $i^{th}$ diagonal elements equal to $\phi_{k-i}$ and $\psi_{k-i}$ for $i=0,1 \ldots$, N−1 according to equations (156) and (157). Therefore, $\delta_{k,i}^{sM}$ may be equal to the $i^{th}$ element of the vector:

$$\delta_k^{sM} = \Phi^*_k(\bar{\zeta}_k^s)^* + \Psi_k \bar{\zeta}_k^s = \Phi^*_k(S_s \bar{z}^*_k)^* + \Psi_k S_s \bar{z}^*_k \tag{164}$$

The signals $\delta_{k,i}^{sM}$ at the outputs of the $i^{th}$ $\zeta^{sM}$ block 1308 for $i=0,1 \ldots$, N−1 may be provided as input to a scalar-to-vector converter 1320, generating the vector $\bar{\delta}_k^{sM}$ in FIG. 13. Substitution of (164) in (163) may yield:

$$\frac{\partial J_2}{\partial \bar{\beta}} = \sum_k \frac{\partial J_{2,k}}{\partial \bar{\beta}} = 2\left(\frac{2T_s}{N}\right)\sum_k \text{Re}\{\Gamma^\upsilon \tilde{U}_k^\upsilon \bar{\delta}_k^{sM}\} \tag{165}$$

An adaptive algorithm to update the estimation of $\bar{\beta}^\upsilon$ so as to minimize $\theta_2$ may be given by:

$$\bar{\beta}_k^\upsilon = \bar{\beta}_{k-1}^\upsilon - \frac{\mu_2}{2}\frac{\partial J_{2,k}}{\partial \bar{\beta}^\upsilon} \tag{166}$$

$$= \bar{\beta}_{k-1}^\upsilon - \mu_2\left(\frac{2T_s}{N}\right)\text{Re}\{\Gamma^\upsilon \tilde{U}_k^\upsilon \bar{\delta}_k^{sM}\}$$

Where $\mu$ may be sufficiently small positive scalar selected so that the algorithm is convergent. In order to simultaneously minimize the filter error and the spectral re growth, a weighted sum of the indices $\theta_1$ and $\theta_2$ may be minimized, for example, as given by:

$$J = \lambda J_1 + (1-\lambda)J_2; \ 0 < \lambda < 1 \tag{167}$$

The stochastic gradient algorithm to minimize the optimization function $\theta$ may be given by:

$$\bar{\beta}_k^\upsilon = \bar{\beta}_{k-1}^\upsilon - \frac{\mu_1}{2}\frac{\partial J_{1,k}}{\partial \bar{\beta}} - \frac{\mu_2}{2}\frac{\partial J_{2,k}}{\partial \bar{\beta}}; k = 0, 1, \ldots ; \tag{168}$$

$$\upsilon = 1, 2, \ldots, \Psi$$

Substitution of the stochastic gradient $\partial J_{1,k}/\partial \bar{\beta}^\upsilon$ from (142) and the stochastic gradient $\partial J_{2,k}/\partial \bar{\beta}^\upsilon$ from (165) results:

$$\bar{\beta}_k^\upsilon = \bar{\beta}_{k-1}^\upsilon + \mu_1 \text{Re}\{\Gamma^\upsilon \bar{\tilde{u}}_k^\upsilon \chi_k\} - \mu_2\left(\frac{2T_s}{N}\right)\text{Re}\{\Gamma^\upsilon \tilde{U}_k^\upsilon \bar{\delta}_k^{sM}\} \tag{169}$$

In order to avoid the possibility of the reduction in the power spectral density in the filter pass band as a result of the minimization of the out of band PSD, an additional optimization function $\theta_3$ similar to the function $\theta_2$ may be incorporated, for example, as defined in Equation (170) below:

$$J_3 = \left(\frac{2T_s}{N}\right)\sum_k \sum_{m \in M_p} \gamma_m^p |Z_{m,k}|^2 = \left(\frac{2T_s}{N}\right)\sum_k \sum_{m \in M_p} \gamma_m^p Z_{m,k} Z_{m,k}^* \tag{170}$$

In (170), the function $\theta_3$ denotes the weighted sum of the amplifier output signal power spectral densities evaluated at a selected frequencies $\omega_m = 2\pi f_m = 2\pi m f_r$ in the pass band with the DFT resolution frequency $f_r = f_s/N$, $f_s$ being the sampling frequency. For the case of multiple signals at the amplifier input, the pass band is the combined pass bands of individual signals. The set of selected indices m is denoted by $M_p$ with the size of the set equal to $M_p$. In the following set of indices $M_p$ is denoted by $\{i_1^p, i_2^p, \ldots, i_{M_p}^p\}$. The gradient of $\theta_3$ with respect to the parameter vector $\bar{\beta}^\upsilon$ is given by (161)-(163) with $W_s$ and $\Xi_s$ replaced with $W_p$ and $\Xi_p$ respectively, where $\Xi_p$ denotes the diagonal matrix with its diagonal elements equal to the weights assigned to PSD of various frequency terms $f_m$, in the pass band appearing in the optimization function $\theta_3$ in (170) with:

$$W_p = \begin{bmatrix} w_{0,0}^p & w_{1,0}^p & \ldots & w_{M_p-1,0}^p \\ w_{0,1}^p & w_{1,1}^p & \ldots & w_{M_p-1,1}^p \\ \vdots & \vdots & \ldots & \vdots \\ w_{0,N-1}^p & w_{1,N-1}^p & \ldots & w_{M_p-1,N-1}^p \end{bmatrix}_{(N, M_p)} \tag{171}$$

$$w_{m,i}^p = \exp[-j2\pi i_m^p i/N]; j \equiv \sqrt{-1}; i = 0, 1, \ldots N-1; \tag{172}$$
$$m = 1, 2, \ldots, M_p$$

$$\Xi_p = \text{diag}[\gamma_0^p \gamma_1^p \ldots \gamma_{M-1}^p] \tag{173}$$

Thus:

$$\frac{\partial J_3}{\partial \bar{\beta}^\upsilon} = \sum_k \frac{\partial J_{3,k}}{\partial \bar{\beta}^\upsilon} = 2\left(\frac{2T_s}{N}\right)\sum_k \text{Re}\{[\Gamma^{\upsilon*}\tilde{U}_k^{\upsilon*}\Phi_k + \Gamma^\upsilon \tilde{U}_k^\upsilon \Psi_k]S_p \bar{z}_k^*\}; \tag{174}$$

$$S_p = W_p \Xi_p W_p$$

Alternatively

-continued $$\frac{\partial J_3}{\partial \overline{\beta}} = \sum_k \frac{\partial J_{3,k}}{\partial \overline{\beta}} = 2\left(\frac{2T_s}{N}\right)\sum_k \text{Re}\{\Gamma^\upsilon \tilde{U}_k^\upsilon \overline{\delta}_k^{pM}\} \qquad (175)$$

Where:

$$\overline{\delta}_k^{pM} = \Phi_k^*(\overline{\zeta}_k^p)^* + \Psi_k \overline{\zeta}_k^p = \Phi_k^*(S_p \overline{z}_k^*)^* + \Psi_k S_p \overline{z}_k^* \qquad (176)$$

The adaptive algorithm to minimize the optimization function $\theta$, while simultaneously maximizing the function $\theta_3$, may be given by:

$$\overline{\beta}_k^\upsilon = \overline{\beta}_{k-1}^\upsilon - \frac{\mu_1}{2}\frac{\partial J_{1,k}}{\partial \overline{\beta}^\upsilon} - \frac{\mu_2}{2}\frac{\partial J_{2,k}}{\partial \overline{\beta}^\upsilon} + \frac{\mu_3}{2}\frac{\partial J_{3,k}}{\partial \overline{\beta}^\upsilon}; \qquad (177)$$

$$k = 0, 1, \ldots; \upsilon = 1, 2, \ldots, \Psi$$

where the gradient $\partial J_{1,k}/\partial \overline{\beta}^\upsilon$ is given by (142), the gradient $\partial J_{2,k}/\partial \overline{\beta}^\upsilon$ is given by (165) and the stochastic gradient $\partial J_{3,k}/\partial \overline{\beta}^\upsilon$ is given by (175). Substitution of the three gradients in (177) may result in the following adaptive algorithm:

$$\overline{\beta}_k^\upsilon = \overline{\beta}_{k-1}^\upsilon + \mu_1 \text{Re}\{\Gamma^\upsilon \tilde{u}_k^\upsilon \chi_k\} - \mu_2\left(\frac{2T_s}{N}\right)\text{Re}\{\Gamma^\upsilon \tilde{U}_k^\upsilon \overline{\delta}_k^{sM}\} + \qquad (178)$$

$$\mu_3\left(\frac{2T_s}{N}\right)\text{Re}\{\Gamma^\upsilon \tilde{U}_k^\upsilon \overline{\delta}_k^{pM}\}$$

$$\equiv \overline{\beta}_{k-1}^\upsilon + \mu_1 \text{Re}\{\Gamma^\upsilon \tilde{u}_k^\upsilon \chi_k\} + \overline{\epsilon}_k^\upsilon$$

In (178) $\mu_3$ is some sufficiently small positive scalar selected so that the algorithm in (178) is convergent and also determines the relative weight assigned to the objective function $\theta_3$ relative to the other two functions $\theta_1$ and $\theta_2$.

Referring again to FIG. 13, the conjugate output $z^*_k$ and its various delayed versions along with the matrix $S_p$ may be provided as input to the matrix vector product evaluator 1322, that may provide as output the N elements of the vector $\overline{\zeta}_k^p = S_p \overline{z}^*_k$. The N elements of the vector $\overline{\zeta}_k^p = S_p \overline{z}^*_k$ may be provided as input to the $\zeta^{pM}$ blocks 1318 (individually denoted as 0 to N−1, respectively). The signals $\delta_{k,i}^{pM}$ at the outputs of the $i^{th}$ $\zeta^{pM}$ block for i=0,1 . . . , N−1 may be provided as input to a scalar-to-vector converter 1324, generating the vector $\overline{\delta}_k^{pM}$ in FIG. 13.

The vectors $\overline{\delta}_k^{sM}$ and $\overline{\delta}_k^{pM}$ may be provided as input to the error blocks 1326 (individually indicated as 1,2, . . . , Ψ), which may also receive as input the signals $u_{k+L_1}^1, \ldots, u_{k+L_Y}^Y$, respectively. Each error block 1326 may receive as input the $\upsilon^{th}$ subcarrier frequency $\Omega_\upsilon$ for $\upsilon=1,2 \ldots, \Psi$. The error block 1326 may then generate the spectral error vector $\overline{\epsilon}_k^\upsilon$ that may be provided input to the weights adjustor 1111 of the $\upsilon^{th}$ adaptive filter block 1104 (shown in FIG. 11) for $\upsilon=1,2 \ldots, \Psi$.

Figure 15:
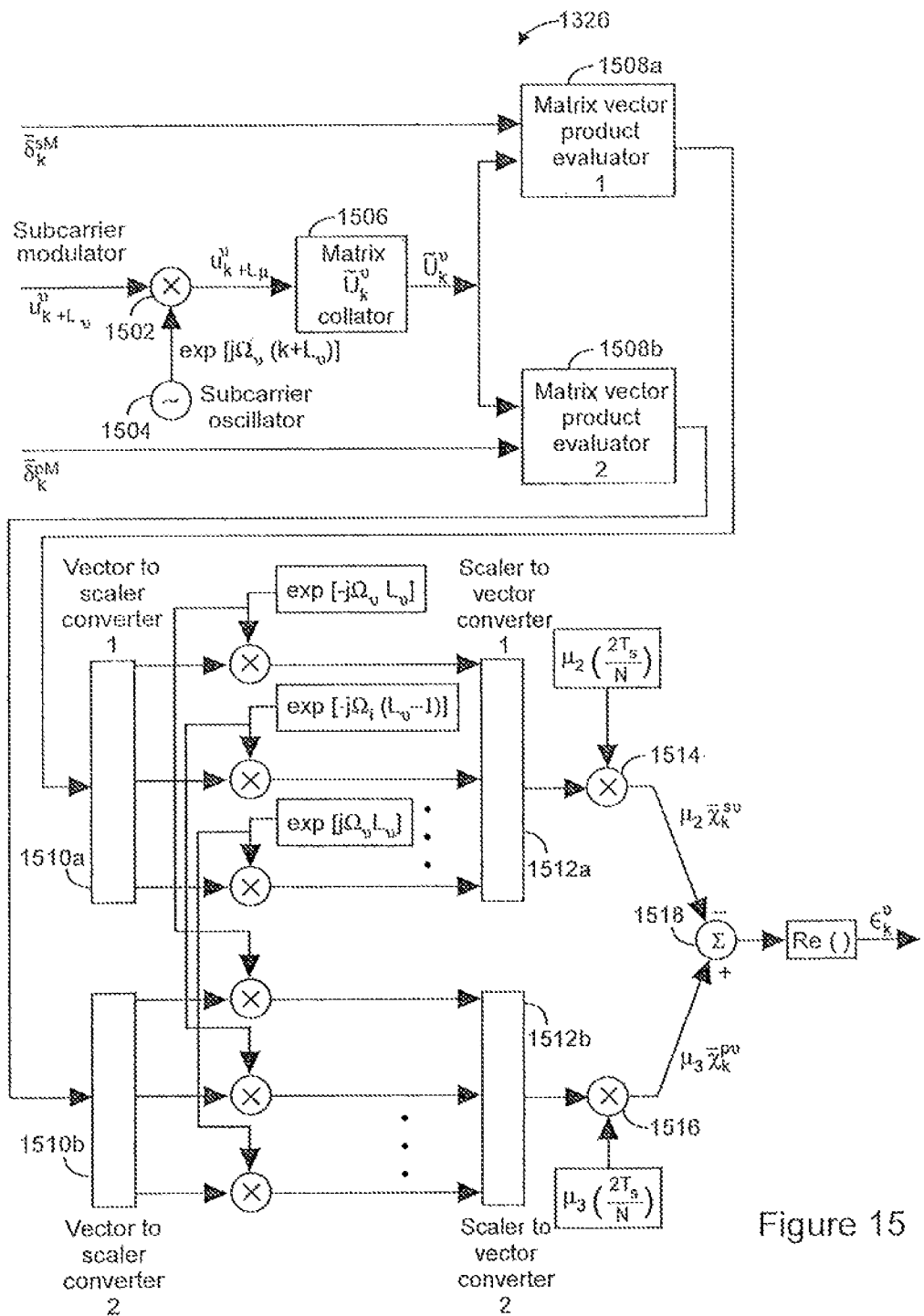
FIG. 15 shows a block diagram of one embodiment of one of the error blocks of FIG. 13.

FIG. 15 shows a block diagram of one embodiment of one of the error blocks 1326 of FIG. 13. The error block 1326 may receive as input a $\upsilon^{th}$ input signal $u_{k+L_\upsilon}^\upsilon$, which may be modulated at 1502 by an output of a $\upsilon^{th}$ subcarrier oscillator 1504. The output of the oscillator 1504 may be given by $\exp[j\Omega_\upsilon (k+L_\upsilon)]$, where $\Omega_\upsilon$ is the radian frequency of the $\upsilon^{th}$ subcarrier. The subcarrier modulator 1502 output $\tilde{u}_{k+L_\upsilon}^\upsilon$ may be provided as input to a matrix $\tilde{U}_k^\upsilon$ collator 1506, that may arrange the input $\tilde{u}_{k+L_\upsilon}^\upsilon$ and its delayed versions $\tilde{u}_{k+L_\upsilon-1}^\upsilon, \ldots, \tilde{u}_{k-L_\upsilon-N-1}^\upsilon$ according to equation (155). The matrix $\tilde{U}_k^\upsilon$ may be provided as input to matrix vector product evaluators 1508a, 1508b, which may also receive as input the vectors $\overline{\delta}_k^{sM}$ and $\overline{\delta}_k^{pM}$, respectively. The outputs of the matrix vector product evaluators 1508a, 1508b may be provided as input to vector-to-scalar converters 1510a and 1510b, respectively. The $(2L_\upsilon+1)$ outputs of both the vector-to-scalar converters 1510a and 1510b may be multiplied by the elements $\exp(-j\Omega_\upsilon L_\upsilon), \ldots, \exp(j\Omega_\upsilon 0), \ldots, \exp(j\Omega_\upsilon L_\upsilon)$, respectively, and collated back into two vectors by scalar-to-vector converters 1512a and 1512b, respectively.

The output of the scalar-to-vector converters 1512a may be multiplied, at 1514, by $\mu_2(2T_s/N)$, generating a first component $\mu_2 \overline{\chi}_k^{s\upsilon}$ of the $\upsilon^{th}$ spectral error vector. The output of the scalar-to-vector converter 1512b may be multiplied, at 1516, by $\mu_3(2T_s/N)$, generating the second component $\mu_3 \overline{\chi}_k^{p\upsilon}$ of the $\upsilon^{th}$ spectral error vector. The first component $\mu_2 \overline{\chi}_k^{s\upsilon}$ of the $\upsilon^{th}$ spectral error vector may be subtracted from the second component $\mu_3 \overline{\chi}_k^{p\upsilon}$ of the $\upsilon^{th}$ spectral error vector at summer 1518, generating the $\upsilon^{th}$ difference error vector. The real part of the $\upsilon^{th}$ difference error vector may be the $\upsilon^{th}$ spectral error vector $\overline{\epsilon}_k^\upsilon$, provided as input to the $\upsilon^{th}$ adaptive filter block 1104 of FIG. 11 to adjust the parameters of the $\overline{\beta}_k^\upsilon$ $\upsilon^{th}$ adaptive filter 1110, for example, according to equation (178).

In alternative embodiments of the spectral error generator 1116, the matrix vector product evaluators 1306, 1322, 1508a, and 1508b may be implemented in terms of the FFTs as for the spectral error generator in FIG. 5 for the case of single signal at the input of the nonlinear system.

In alternative embodiments, the input signal may be a filtered composite signal such as an OFDM (orthogonal frequency division multiplexed), the square root raised cosine filter may be eliminated so that the input signal is also the reference signal and the adaptive system minimizes the distortion due to the nonlinear amplifier and at the same time minimizes the out of band spectral regrowth of the signal at the amplifier output.

In other embodiments, the adative filter may be an infinite impulse response filter, i.e., a filter with its output $x_k$ related to input $u_k$ by the following recursive equation $$x_k = \sum_{i=1}^{K} \alpha_i x_{k-i} + \sum_{i=-L_1}^{L_2} \beta_i u_{k-i}; k = 1, 2, \ldots \qquad (178a)$$

For some integers $K$, $L_1$, $L_2$ wherein generally $L_1$ is equal to 0. The adaptive spectrum control system optimizes the parameters $\{\alpha_1, \ldots, \alpha_K, \beta_{-L_1}, \ldots, \beta_{L_2}\}$ so that the amplifier output is equal to some, potentially transformed, version of the reference generator output while minimizing the power spectral density (PSD) of the nonlinear system output at a set of selected frequencies and simultaneously maximizing the power spectral density at a different set of selected frequencies to achieve a desired PSD function at the nonlinear system output. The gradient of the optimization functions $\theta_1$, $\theta_2$, and $\theta_3$ with respect to the parameter vector $\overline{\alpha}=[\alpha_1 \alpha_2 \ldots \alpha_K]^T$ may have expressions similar to those of the gradients with respect to the parameter vector $\overline{\beta}$ except that the terms $u_{k-i}$ are replaced by $x_{k-i}$ there in.

In other embodiments, the adaptive algorithm to update the estimates of the adaptive filter parameter vector may be a conjugate gradient based algorithm. For example, the adaptive algorithm may be a recursive least squares (RLS) algorithm, recursive maximum likelihood (RML) algorithm or Newton algorithm.

In other embodiments, the nonlinear system may be a tandem of a linear model of the type in (178a) possibly followed by a nonlinearity that may arise due to saturation of actuators in various control systems. In case of model reference adaptive linear control systems wherein the system is assumed to be linear, the control system minimizes the error between the output of the system (plant) and the output of a model both with common inputs. The adaptive spectrum control system of this invention may not only minimize such an error but simultaneously may minimize any undesirable spectral components that may be present at the system output without ignoring the nonlinearity. As an example, in the altitude control of an aircraft it may be highly desirable to dampen any "high frequency" variations in the aircraft altitude. For stable plant (with or without feedback), the adaptive spectrum control system of this invention with an adaptive filter of the type in (178a) may optimize the parameters of the adaptive filter so as to minimize the altitude error while simultaneously clamping any "high frequency" spectral components in the aircraft altitude.

In order to evaluate the performance of the nonlinear amplifier with the adaptive filter, according to various embodiments, a digitally modulated signal after being filtered by the adaptive filter may be provided as input to the augmented nonlinear amplifier modeled by the nonlinear function $g_0(x)$ given by (10). To focus on the spectrum control system, the amplifier may be assumed to have been compensated for the AM-PM distortion. The amplifier may be modeled by a soft limiter. The instantaneous input-output characteristics in the RF domain of the soft limiter model may be described by the following function F(u), given by:

$$F(u) = \begin{cases} u; & |u| \leq 1 \\ 1; & |u| > 1 \end{cases} ; \quad (179)$$

When the input to the amplifier is a sine wave of constant amplitude A, the amplifier output may contain the fundamental zone and various harmonic zones. The fundamental zone output is just a sine wave of amplitude g(A), which may be given by the Chebyshev transform of F(u), and for the specific case of (179) is given by (180) below:

$$g(A) = \frac{2}{\pi} \left[ \sqrt{1 - (1/A)^2} + A \sin^{-1}(1/A) \right] \quad (180)$$

Figure 17:
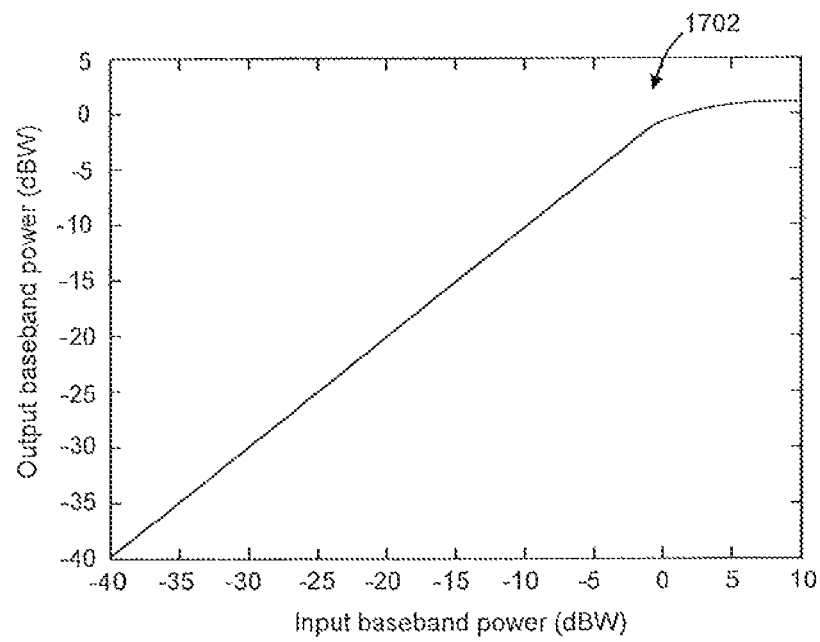
FIG. 17 shows a plot of one embodiment of the amplifier output baseband power $P_o=20 \log(g(A))$ versus the amplifier input baseband power $20 \log(A)$.

FIG. 16 shows the baseband amplitude transfer characteristics g(A) of the amplifier modeled by one embodiment of the soft limiter characteristics in equation (179). In order to simplify the simulations and focus on the adaptive spectrum controller, the function g(A) is approximated by a polynomial. This polynomial is then used in the adaptive algorithm to optimize the amplifier output spectrum. FIG. 16 shows the amplitude transfer characteristics 1602 (g(A)) of the soft limiter. FIG. 17 shows a plot 1702 of one embodiment of the amplifier output baseband power $P_o = 20 \log(g(A))$ versus the amplifier input baseband power $20 \log(A)$. For the case of PAM/BPSK modulation, the symbol rate of the BPSK signal may be selected equal to 100 Msps sampled at a rate of 4 samples per symbol interval. The raised cosine filter length may be selected equal to 81. The same BPSK signal that is input to the adaptive filter, may also be provided as input to a square root raised cosine filter also of length 81 and with a roll-off factor r equal to 0.3. The amplifier output may be compared with the square root raised cosine filter output scaled by a constant κ in the adaptation process. The constant κ may be selected so as to obtain a specified power level at the amplifier output with the adaptive filter. The constant α in the nonlinearity (6) may be selected to be 0.11. The length of the adaptive filter (2L+1) may be equal to 81 that may also be the length N of the DFT transform. The set of frequencies selected in the stop band may be $\Phi_s = [0.9\ 1\ 1.1\ 1.2\ 1.3\ 1.4] \times 10^8$ Hz. The DFT resolution frequency may be given by $\Delta f = f_s/N = 4.94$ MHz. The set of indices $M_s$ of frequencies in the stop band may be given by the integer parts of the elements of the set $\Phi_s/\Delta f$. A single frequency equal to 0 Hz may be selected in the pass band for optimization of $\theta_3$. The scalars $\mu_1, \mu_2, \mu_3, \mu_{1,3}$, in the adaptive algorithm may be equal to 0.005, $1.25 \times 10^5$, 100, and 0.1 respectively, selected on the basis of the orders of magnitudes of various gradient terms in the adaptive algorithm.

The adaptive algorithm may be simulated over the length of $1.2 \times 10^5$ symbols or $4.8 \times 10^5$ samples. The power spectral density of the amplifier output signal may be evaluated on the basis of the last $10^5$ samples during which time the adaptive filter weights are not updated. Similarly for the srrc filter, the input may be scaled by a factor $\kappa_z$ so that in both the adaptive and non adaptive cases, the amplifier output power is equal. The amplifier output power may be measured in terms of the output power back off relative to the maximum possible power in the fundamental zone when the input to the amplifier is a sine wave. The maximum output sine wave amplitude may be $4/\pi$ and may be obtained when that amplifier is operated as a hard limiter taking values +1 and −1. For this case the fundamental zone output baseband power may be $20 \log(4/\pi) = 2.1$ dB. When the input sine wave is restricted to the linear range of the amplifier, the maximum output baseband power may be −3 dBW.

FIG. 18 shows plots of the power spectral density (PSD) for the cases of both the srrc filter 1802 and the adaptive filter 1804 with an example output back-off of 3.2 dB. Thus the output power may be −1.1 dBW compared to −3 dBW for the linear range. For example, FIG. 18 may illustrate a BPSK modulated signal with α=0.3. As may be inferred from the figure, the adaptive filter lowers the PSD by about 7 dB in the transition region that is the most important region in terms of frequency allocation. The number of frequencies in the stop band may be increased to further reduce the PSD in the transition band. In terms of the MSE=

$$\frac{1}{N_s} \sum_{k=1}^{N_s} (\kappa v_k - z_k)^2,$$

where $N_s$ is the number of samples, the adaptive filter results in a MSE of 0.0027 compared to 0.0069 for the srrc filter providing a reduction of 4.1 dB of reduction in the MSE which is related to the bit error rate performance of the communication link.

Figure 20:
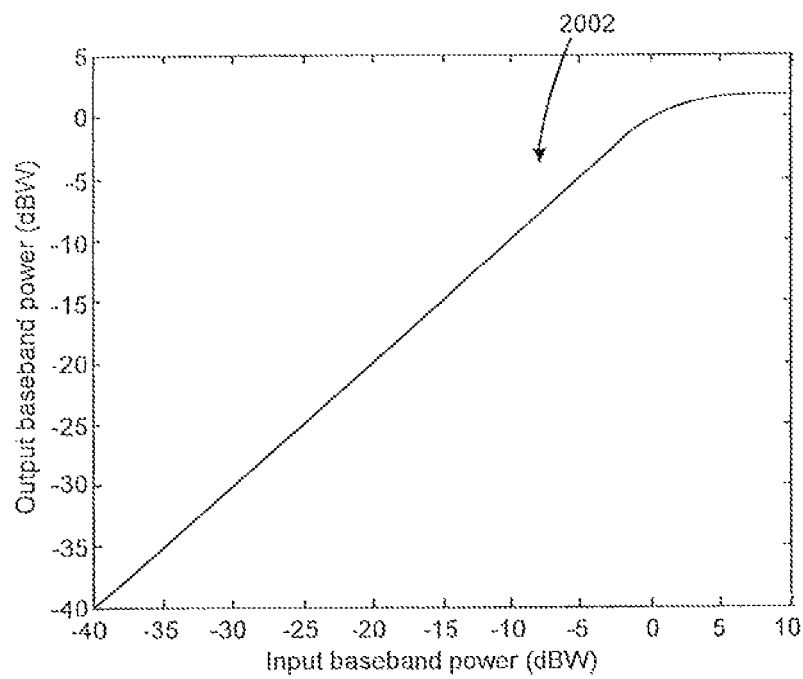
FIG. 20 shows one embodiment of baseband input/output power characteristics corresponding to FIG. 19.

In order to evaluate the performance of the commercial linearized amplifiers, a degree of linearity of the amplifier may be defined as:

$$DL = 20 \log [A_l/(A_s - A_1)] dB \quad (181)$$

Where $A_1$ is the maximum input amplitude for which the amplifier input output transfer characteristics is nearly linear and $A_s$ is the maximum (saturation) output amplitude. Thus for the case of FIG. 16, $A_1=1$, $A_s=4/\pi=1.27$ and DL=11.25 dB. For the case of $A_1=A_s=1$, DL=∞, that is the ideal case. Thus a partially linearized transfer characteristics may be obtained by limiting the output in FIG. 16 to some value smaller than 1.27. FIG. 19 shows one embodiment of the resulting characteristics 1902 with $A_s=1.2$ corresponding to DL=14 dB. FIG. 20 shows one embodiment of baseband input/output power characteristics 2002 corresponding to FIG. 19.

FIG. 21 plots one embodiment of amplifier output signal PSDs both for the srrc case 2102 and the adaptive filter case 2104, with all the amplifier input/output transfer characteristics shown in FIG. 19 and with an output power back off equal to 2.7 dB and with all the parameters of the algorithm same as those used in the results of FIG. 18. The PSD plots of FIG. 21 show a reduction in PSD of about 6-7 dB in the transition band due to the adaptive filter compared to the srrc filter. In terms of the mean square error, the adaptive filter results in an MSE of 0.053 compared to 0.0832 for the case of srrc filter, thus providing a reduction of about 2 dB in the MSE.

FIG. 22 shows a result for one embodiment when the amplifier is modeled by a piecewise linear characteristics with a slope equal to 1 for the input amplitude A in the range of 0 to $A_1$=0.9, a slope of $0.1/(A_{is}-0.9)$ for $A_1 < A \leq A_{is}$, and slope equal to 0 for $A > A_{is}$, where $A_{is}$ is the input saturation amplitude. Thus the degree of linearity DL for the amplifier may be 19 dB. In this case the set of selected frequencies in the stop band for the optimization may be given by [0.9 1 1.1 1.2 1.25 1.3 1.35 1.4 1.45 1.5 1.6 1.7 1.8]×$10^8$ Hz with the relative weights equal to [1 1 1 5 5 5 5 1 1 1 1 1 1]. The only frequency in the pass band selected for optimization may be 0 Hz. As may be inferred from FIG. 22, the adaptive filter may provide a maximum reduction of about 8 dB in the transition band with an output back off of 2.2 dB. he performance could be improved further by including additional frequencies in the range of 0.65×$10^8$ to 0.9×$10^8$ Hz in the set of frequencies in the stop band selected for optimization.

FIG. 23 plots results of one embodiment with a QPSK signal with the soft limiter characteristics of FIG. 16 and an output back off of 2.7 dB. The frequencies in the stop band may be [0.7 0.8 0.9 1 1.1 1.2 1.3 1.4]×$10^8$ Hz with the frequency in the pass band selected for optimization equal to 0 Hz. As may be seen from FIG. 23, a reduction of about 5 dB is obtained in the PSD in the transition band. By including additional frequencies including in the range higher than 1.4×$10^8$ Hz, the PSD in the stop band can be reduced even further.

FIG. 24 shows results of one embodiment similar to that of FIG. 23 but with the amplifier characteristics given in FIG. 19 with $A_s$=1.2 and DL=14 dB. With a back off of 2.2 dB, the performance for this case is similar to that of FIG. 23 which corresponds to a back off of 2.7 dB. FIG. 25 shows results of one embodiment for the case of OQPSK (offset QPSK) signal at the input to the amplifier with soft limiter characteristics. There may be eleven (11) frequencies in the stop band in the range of 0.7×$10^8$ to 1.7×$10^8$ Hz equally spaced at an interval of $10^7$ Hz. The frequencies in the filter pass band may be in the range of 0 to 0.6×$10^8$ Hz also spaced at an interval of $10^7$ Hz. The PSD at higher frequencies beyond 1.7×$10^8$ Hz may also be reduced by extending the range of stop band frequencies selected for optimization. As may be observed from FIG. 25, a maximum reduction of 7 dB may be achieved in the transition band by the adaptive filter. Thus if the PSD below −110 dBW/Hz is required in the example to satisfy the regulatory requirements or to minimize the inter channel interference, then the band gap for the adaptive filter can be reduced to nearly 0 compared to a large band gap of 0.5×$10^8$ Hz without the adaptive filer.

It is to be understood that the figures and descriptions of the present invention have been simplified to illustrate elements that are relevant for a clear understanding of the present invention, while eliminating other elements, for purposes of clarity. Those of ordinary skill in the art will recognize that these and other elements may be desirable. However, because such elements are well known in the art and because they do not facilitate a better understanding of the present invention, a discussion of such elements is not provided herein.

In general, it will be apparent to one of ordinary skill in the art that at least some of the embodiments described herein, including, for example, the systems 100, 200, 600, 11000, etc., and/or parts thereof, may be implemented in many different embodiments of software, firmware, and/or hardware, for example, Field Programmable Gate Array (FPGA) chips or implemented in Application Specific Integrated Circuits (ASICS). The software and firmware code may be executed by a computer or computing device comprising a processor (e.g., a DSP or any other similar processing circuit) including, for example, the computing device 2600 described below. The processor may be in communication with memory or another computer readable medium comprising the software code. The software code or specialized control hardware that may be used to implement embodiments is not limiting. For example, embodiments described herein may be implemented in computer software using any suitable computer software language type, using, for example, conventional or object-oriented techniques. Such software may be stored on any type of suitable computer-readable medium or media, such as, for example, a magnetic or optical storage medium. According to various embodiments, the software may be firmware stored at an EEPROM and/or other non-volatile memory associated a DSP or other similar processing circuit. The operation and behavior of the embodiments may be described without specific reference to specific software code or specialized hardware components. The absence of such specific references is feasible, because it is clearly understood that artisans of ordinary skill would be able to design software and control hardware to implement the embodiments based on the present description with no more than reasonable effort and without undue experimentation.

FIG. 26 shows an example of a computing device 2600 according to one embodiment. For the sake of clarity, the computing device 2600 is illustrated and described here in the context of a single computing device. However, it is to be appreciated and understood that any number of suitably configured computing devices can be used to implement a described embodiment. Conversely, a single computing device may be shared between the implementation of the systems described herein and any other system or systems in a system of systems. For example, in at least some implementations, multiple communicatively linked computing devices may be used. One or more of these devices can be communicatively linked in any suitable way such as via one or more networks. One or more networks can include, without limitation: the Internet, one or more local area networks (LANs), one or more wide area networks (WANs) or any combination thereof.

In the example of FIG. 26, the computing device 2600 comprises one or more processor circuits or processing units 2602, one or more memory circuits and/or storage circuit component(s) 2604 and one or more input/output (I/O) circuit devices 2606. Additionally, the computing device 2600 comprises a bus 2608 that allows the various circuit components and devices to communicate with one another and with other devices and/or systems. The bus 2608 represents one or more of any of several types of bus structures, including a memory bus or memory controller, a peripheral bus, an accelerated graphics port, and a processor or local bus using any of a variety of bus architectures. The bus 2608 may comprise wired and/or wireless buses.

The processing unit 2602 may be responsible for executing various software programs such as system programs, applications programs, and/or program modules/blocks to provide computing and processing operations for the computing device 2600. The processing unit 2602 may be responsible for performing various voice and data communications operations for the computing device 2600 such as transmitting and receiving voice and data information over one or more wired or wireless communications channels. Although the processing unit 2602 of the computing device 2600 is shown in the context of a single processor architecture, it may be appreciated that the computing device 2600 may use any suitable processor architecture and/or any suitable number of processors in accordance with the described embodiments. In one embodiment, the processing unit 2602 may be implemented using a single integrated processor. The processing unit 2602 may be implemented as a host central processing unit (CPU) using any suitable processor circuit or logic device (circuit), such as a as a general purpose processor. The processing unit 2602 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

As shown, the processing unit 2602 may be coupled to the memory and/or storage component(s) 2604 through the bus 2608. The bus 2608 may comprise any suitable interface and/or bus architecture for allowing the processing unit 2602 to access the memory and/or storage component(s) 2604. Although the memory and/or storage component(s) 2604 may be shown as being separate from the processing unit 2602 for purposes of illustration, it is worthy to note that in various embodiments some portion or the entire memory and/or storage component(s) 2604 may be included on the same integrated circuit as the processing unit 2602. Alternatively, some portion or the entire memory and/or storage component(s) 2604 may be disposed on an integrated circuit or other medium (e.g., hard disk drive) external to the integrated circuit of the processing unit 2602. In various embodiments, the computing device 2600 may comprise an expansion slot to support a multimedia and/or memory card, for example. The memory and/or storage component(s) 2604 represent one or more computer-readable media. The memory and/or storage component(s) 2604 may be implemented using any computer-readable media capable of storing data such as volatile or non-volatile memory, removable or non-removable memory, erasable or non-erasable memory, writeable or re-writeable memory, and so forth. The memory and/or storage component(s) 2604 may comprise volatile media (e.g., random access memory (RAM)) and/or nonvolatile media (e.g., read only memory (ROM), Flash memory, optical disks, magnetic disks and the like). The memory and/or storage component(s) 2604 may comprise fixed media (e.g., RAM, ROM, a fixed hard drive, etc.) as well as removable media (e.g., a Flash memory drive, a removable hard drive, an optical disk). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

The one or more I/O devices 2606 allow a user to enter commands and information to the computing device 2600, and also allow information to be presented to the user and/or other components or devices. Examples of input devices include data ports, analog to digital converters (ADCs), digital to analog converters (DACs), a keyboard, a cursor control device (e.g., a mouse), a microphone, a scanner and the like. Examples of output devices include data ports, ADC's, DAC's, a display device (e.g., a monitor or projector, speakers, a printer, a network card). The computing device 2600 may comprise an alphanumeric keypad coupled to the processing unit 2602. The keypad may comprise, for example, a QWERTY key layout and an integrated number dial pad. The computing device 2600 may comprise a display coupled to the processing unit 2602. The display may comprise any suitable visual interface for displaying content to a user of the computing device 2600. In one embodiment, for example, the display may be implemented by a liquid crystal display (LCD) such as a touch-sensitive color (e.g., 76-bit color) thin-film transistor (TFT) LCD screen. The touch-sensitive LCD may be used with a stylus and/or a handwriting recognizer program.

The processing unit 2602 may be arranged to provide processing or computing resources to the computing device 2600. For example, the processing unit 2602 may be responsible for executing various software programs including system programs such as operating system (OS) and application programs. System programs generally may assist in the running of the computing device 2600 and may be directly responsible for controlling, integrating, and managing the individual hardware components of the computer system. The OS may be implemented, for example, as a Microsoft® Windows OS, Symbian OS™, Embedix OS, Linux OS, Binary Run-time Environment for Wireless (BREW) OS, JavaOS, or other suitable OS in accordance with the described embodiments. The computing device 2600 may comprise other system programs such as device drivers, programming tools, utility programs, software libraries, application programming interfaces (APIs), and so forth.

In various embodiments disclosed herein, a single component may be replaced by multiple components and multiple components may be replaced by a single component to perform a given function or functions. Except where such substitution would not be operative, such substitution is within the intended scope of the embodiments.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

I claim:

1. A non-linear amplifier system comprising:
   a reference output generator for receiving an input signal and generating a reference output;
   an adaptive filter for generating a modified input signal based on the input signal and the reference output;
   an amplitude distortion (AM-AM) compensator for acting on the modified input signal to compensate for AM-AM distortion;

a phase distortion (AM-PM) compensator for acting on the modified input signal to compensate for AM-PM distortion; and an adaptive spectrum controller for providing parameters to the adaptive filter to minimize the power spectral density (PSD) of an output of the non-linear amplifier system in a stop-band and maximize the PSD of the output of the non-linear amplifier system in a pass-band; and a non-linear system for receiving at least one of the modified input signal and the compensated baseband signal and for generating the output of the non-linear system.

2. The system of claim 1, wherein the non-linear system further comprises:

a radio frequency (RF) amplifier;

a baseband to RF converter for converting the compensated baseband signal to RF;

an RF coupler for receiving the output of the non-linear amplifier system;

a down-converter-to-baseband for converting the output of the non-linear amplifier system to baseband; and an analog-to-digital converter (ADC) for converting the baseband output of the non-linear system to digital, wherein the adaptive spectrum controller is for providing parameters to the adaptive filter considering the digital, baseband output of the non-linear system.

3. The system of claim 1, wherein the adaptive spectrum controller is also for minimizing an error between the reference output generator and the output of the non-linear amplifier system.

4. The system of claim 1, wherein the adaptive spectrum controller implements at a matrix product evaluation utilizing a Fast Fourier Transform (FFT) computation.

5. The system of claim 1, wherein the reference output generator comprises a square root raised cosine (srrc) filter.

6. The system of claim 1, wherein the input signal is a digitally modulated signal at complex baseband.

7. The system of claim 1, wherein an input signal is a modulated signal at complex baseband modulated according to at least one method selected from the group consisting of pulse amplitude modulation (PAM) quadrature amplitude modulation (QAM) and M'ary Phase Shift Keying (MPSK).

8. The system of claim 7, wherein the PAM is binary phase shift-keying (BPSK) and the QAM is quadrature phase shift-keying (QPSK).

9. The system of claim 1, wherein the AM-AM compensator comprises a cubic non-linearity.

10. The system of claim 9, wherein the AM-AM compensator comprises a cascade of a cubic nonlinearity and a compensator.

11. The system of claim 1, wherein the input signal comprises a plurality of signals and wherein the adaptive filter comprises a plurality of adaptive filters components, wherein each of the plurality of adaptive filter components receive one of the plurality of signals.

12. The system of claim 11, wherein the stop band comprises band edge frequencies of the plurality of modulated input signals so as to reduce a required band gap among the plurality of modulated input signals.

13. A computer-implemented method for mitigating spectral regrowth, the method comprising:

receiving, by a computer device, an input signal, wherein the computer device comprises at least one processor and associated memory;

generating, by the computer device, a reference output;

implementing, by the computer device, an adaptive filter for generating a modified input signal based on the input signal and the reference output;

compensating, by the computer device, the modified input signal for amplitude distortion (AM-AM) distortion;

compensating, by the computer device, the modified input signal for phase distortion (AM-PM);

determining parameters of the adaptive filter to minimize the power spectral density (PSD) of an output of a non-linear system in a stop-band and maximize the PSD of the output of the non-linear system in a pass-band; and providing the modified input signal to the non-linear system.

14. The method of claim 13, wherein the non-linear system further comprises:

a radio frequency (RF) amplifier;

a baseband to RF converter for converting the compensated baseband signal to RF;

an RF coupler for receiving the output of the non-linear system;

a down-converter-to-baseband for converting the output of the non-linear system to baseband; and an analog-to-digital converter (ADC) for converting the baseband output of the non-linear system to digital, wherein the adaptive spectrum controller is for providing parameters to the adaptive filter considering the digital, baseband output of the non-linear system.

15. The method of claim 13, wherein determining the parameters of the adaptive filter is also to minimize an error between the reference output generator and the output of the non-linear system.

16. The method of claim 13, wherein determining the parameters of the adaptive filter comprises at least one action selected from the group consisting of evaluating a matrix product and applying a Fast Fourier Transform (FFT) computation.

17. The method of claim 13, wherein generating the reference output comprises applying a square root raised cosine (srrc) filter to the input signal.

18. The method of claim 13, wherein the input signal is a digitally modulated signal at complex baseband.

19. The method of claim 13, wherein an input signal is a modulated signal at complex baseband modulated according to at least one method selected from the group consisting of pulse amplitude modulation (PAM) quadrature amplitude modulation (QAM) or M'ary phase shift keying (MPSK).

20. The method of claim 19, wherein the PAM is binary phase shift-keying (BPSK) and the QAM is quadrature phase shift-keying (QPSK).

21. The method of claim 13, wherein compensating the modified input signal for AM-AM distortion comprises applying a cubic non-linearity.

22. The method of claim 21, wherein compensating the modified input signal for AM-AM distortion comprises applying a cascade of a cubic nonlinearity and a compensator.

23. The method of claim 12, wherein the input signal comprises a plurality of signals and wherein the adaptive filter comprises a plurality of adaptive filters components, wherein each of the plurality of adaptive filter components receive one of the plurality of signals.

* * * * *